United States Patent
Tanuma et al.

(10) Patent No.: US 9,510,442 B2
(45) Date of Patent: Nov. 29, 2016

(54) LED LIGHT SOURCE UNIT FOR BACKLIGHT OF LIQUID CRYSTAL DISPLAY, AND LIQUID CRYSTAL DISPLAY

(75) Inventors: Yuki Tanuma, Kyoto (JP); Tomoharu Horio, Kyoto (JP); Tadatoshi Miwa, Kyoto (JP); Hiroyuki Tajiri, Kyoto (JP); Takumi Yamade, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 1009 days.

(21) Appl. No.: 13/217,929

(22) Filed: Aug. 25, 2011

(65) Prior Publication Data
US 2012/0057099 A1 Mar. 8, 2012

(30) Foreign Application Priority Data

Aug. 27, 2010 (JP) ................. 2010-190469
Nov. 19, 2010 (JP) ................. 2010-259269
Nov. 19, 2010 (JP) ................. 2010-259270
Jun. 29, 2011 (JP) ................. 2011-144716
Jul. 29, 2011 (JP) ................. 2011-166236

(51) Int. Cl.
| H05K 1/03 | (2006.01) |
| F21V 8/00 | (2006.01) |
| H01L 23/00 | (2006.01) |
| H01L 33/60 | (2010.01) |

(52) U.S. Cl.
CPC ........... *H05K 1/0306* (2013.01); *G02B 6/0073* (2013.01); *G02B 6/0031* (2013.01); *G02B 6/0068* (2013.01); *G02B 6/0083* (2013.01); *H01L 24/29* (2013.01); *H01L 24/48* (2013.01); *H01L 33/60* (2013.01); *H01L 2224/48091* (2013.01); *H01L 2224/48227* (2013.01); *H01L 2224/49107* (2013.01); *H01L 2224/73265* (2013.01); *H01L 2924/00014* (2013.01); *H01L 2924/01014* (2013.01); *H01L 2924/01078* (2013.01); *H01L 2924/078* (2013.01); *H01L 2924/12035* (2013.01); *H01L 2924/12041* (2013.01); *H05K 2201/017* (2013.01); *H05K 2201/10106* (2013.01); *H05K 2201/2054* (2013.01)

(58) Field of Classification Search
USPC ........................................... 362/97.3; 349/62
See application file for complete search history.

(56) References Cited

U.S. PATENT DOCUMENTS

| 7,579,629 | B2 * | 8/2009 | Inoguchi | .................. 257/98 |
| 2004/0085750 | A1 | 5/2004 | Okuwaki et al. | |
| 2004/0208210 | A1 * | 10/2004 | Inoguchi | ................... 372/36 |
| 2006/0007704 | A1 * | 1/2006 | Mori et al. | ................. 362/613 |
| 2006/0065957 | A1 * | 3/2006 | Hanya | ...................... 257/676 |
| 2006/0152931 | A1 * | 7/2006 | Holman | .................. 362/297 |
| 2006/0214178 | A1 * | 9/2006 | Choi et al. | ................ 257/99 |
| 2006/0286697 | A1 * | 12/2006 | Leem | ........................ 438/27 |
| 2010/0046204 | A1 * | 2/2010 | Shinkai et al. | ........... 362/97.1 |
| 2011/0019126 | A1 * | 1/2011 | Choi et al. | ................ 349/61 |
| 2012/0002425 | A1 * | 1/2012 | Shimizu et al. | ............ 362/294 |

FOREIGN PATENT DOCUMENTS

| CN | 1497309 | 5/2004 |
| CN | 1753200 | 3/2006 |

(Continued)

*Primary Examiner* — Robert May
*Assistant Examiner* — Leah S Macchiarolo
(74) *Attorney, Agent, or Firm* — Hamre, Schumann, Mueller & Larson, P.C.

(57) ABSTRACT

An LED light source unit for a backlight of a liquid crystal display is provided. The light source unit includes a plurality of LED chips, an insulating substrate, and a metal film covering a principal surface of the substrate. The LED chips are mounted on the metal film. With this arrangement, brightness of the light source unit is enhanced.

110 Claims, 57 Drawing Sheets

(56) References Cited

FOREIGN PATENT DOCUMENTS

| CN | 2720645 | 5/2008 |
| CN | 101174663 | 5/2008 |
| CN | 101185174 | 5/2008 |
| CN | 101188224 | 5/2008 |
| CN | 201062757 | 5/2008 |
| CN | 201475693 | 5/2010 |
| JP | 2007-123130 | 5/2007 |

* cited by examiner

FIG.32
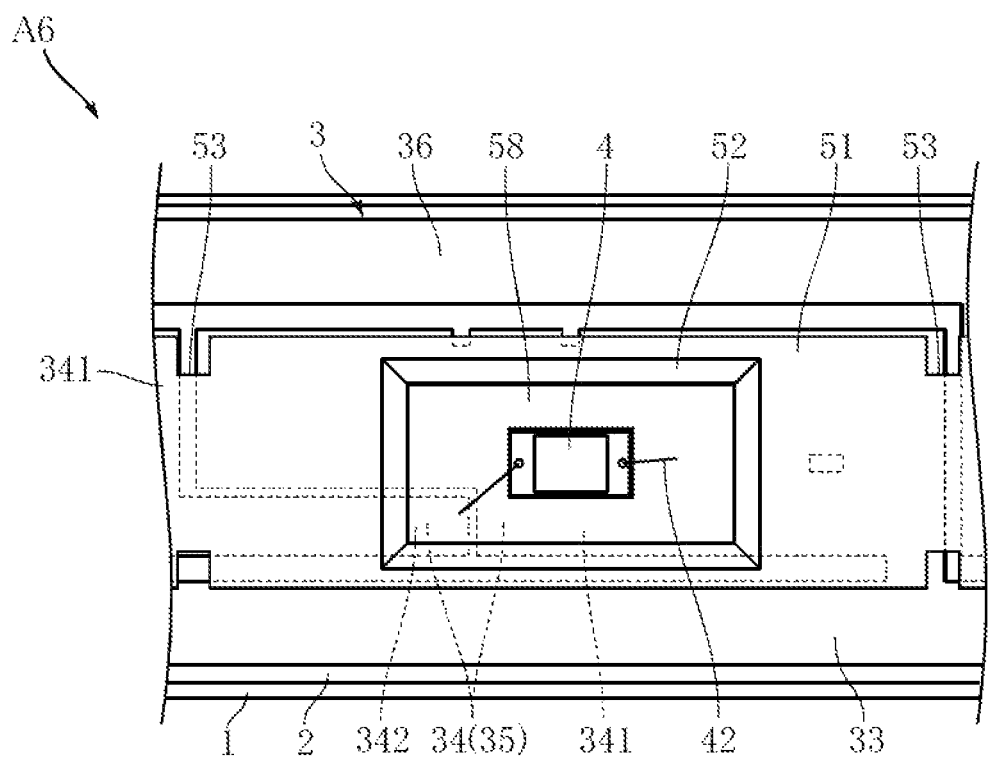
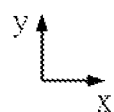

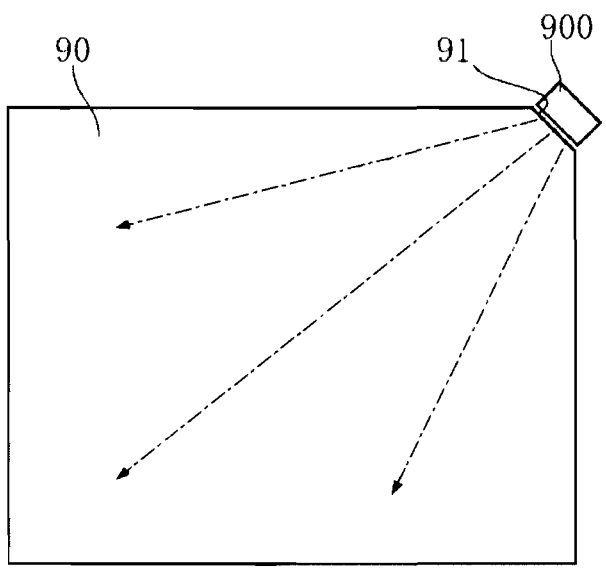
FIG.84 -- Prior Art

LED LIGHT SOURCE UNIT FOR BACKLIGHT OF LIQUID CRYSTAL DISPLAY, AND LIQUID CRYSTAL DISPLAY

BACKGROUND OF THE INVENTION

1. Field of the Invention

The present invention relates to an LED light source unit for a backlight of a liquid crystal display, and also to a liquid crystal display.

2. Description of the Related Art

FIG. 84 illustrates an example of conventional LED light source unit (see JP-A-2007-123130). The light source unit 900 illustrated in the figure incorporates LED chips and is used as a light source of a backlight of a liquid crystal display. The backlight includes a transparent light guide plate 90, in addition to the light source unit 900. The light guide plate 90 includes a light incident surface 91. The light incident surface 91 is arranged to face the light source unit 900. Light emitted from the light source unit 900 enters the light guide plate 90 through the light incident surface 91. Then, the light is reflected by a reflector provided in the light guide plate 90 to travel in the thickness direction of the light guide plate 90, and is finally emitted from the light guide plate 90. A liquid crystal panel (not shown) selectively allows the emitted light to pass through, thereby forming a desired image on the liquid crystal display.

To enhance the image quality of the liquid crystal display, brightness of the light emitted from the light source unit 900 needs to be increased. To enhance the brightness of the light source unit 900 while suppressing the power consumption, light emitted from each of the LED chips needs to be emitted more efficiently from the light source unit 900. In other words, the proportion of the light absorbed in the light source unit 900 needs to be decreased. Regarding this point, the conventional light source unit 900 still has room for improvement.

SUMMARY OF THE INVENTION

The present invention has been proposed under the circumstances described above. It is therefore an object of the present invention to provide an LED light source unit capable of enhancing brightness. Another object of the present invention is to provide a liquid crystal display that uses such an LED light source unit.

According to a first aspect of the present invention, there is provided an LED light source unit for a backlight of a liquid crystal display. The LED light source unit comprises a plurality of LED chips, a substrate, and a metal film covering a principal surface of the substrate. The LED chips are mounted on the metal film.

Preferably, the substrate is made of a ceramic material.

Preferably, the metal film comprises a plurality of layers and includes an outermost layer comprising an Al layer.

Preferably, the metal film includes an AgPt layer intervening between at least part of the Al layer and the substrate.

Preferably, the metal film consists of an AgPt layer only.

Preferably, the AgPt layer is formed by printing paste containing Ag and Pt and then baking the paste.

Preferably, the Al layer is formed by sputtering.

Preferably, the LED light source unit further comprises a glass layer intervening between the metal film and the substrate.

Preferably, the glass layer includes a window portion in which the LED chip is positioned as viewed in the thickness direction of the substrate.

Preferably, the glass layer includes an inclined surface connected to the edge of the window portion and inclined to be away from the principal surface of the substrate in a normal direction of the principal surface as proceeding away from the LED chip.

Preferably, the inclined surface is in the form of a frame surrounding the LED chip.

Preferably, the glass layer is formed by printing paste containing glass and then baking the paste.

Preferably, the LED light source unit further comprises a reflector in the form of a frame surrounding the LED chip.

Preferably, the reflector is made of white resin.

Preferably, the space enclosed by the reflector is filled with a light-transmitting resin covering the LED chip.

Preferably, the light-transmitting resin contains a fluorescent material.

Preferably, the substrate is in the form of an elongated rectangle, and the LED chips are arranged along the longitudinal direction of the substrate.

Preferably, the metal film includes a common strip portion elongated in the longitudinal direction of the substrate at a position close to one of edges of the substrate that are spaced in a width direction of the substrate, and one or more island groups which are arranged in parallel to the common strip portion and each of which comprises a plurality of island portions. One of the island portions that is positioned at an end in the longitudinal direction is electrically connected to the common strip portion. The LED chips are mounted to the island portions, respectively.

Preferably, the metal film includes: a connection terminal portion provided close to one of ends of the substrate that are spaced in the longitudinal direction; two island groups arranged in the longitudinal direction along the common strip portion; and a connection strip portion arranged on a side opposite from the common strip portion across the island groups in the width direction of the substrate, the connecting strip portion extending from the connection terminal portion in the longitudinal direction, the connecting strip portion being electrically connected to the island portion that is closest to the connection terminal portion among the island portions included in one of the two island groups that is farther from the connection terminal portion.

According to a second aspect of the present invention, there is provided a liquid crystal display comprising: the LED light source unit for a backlight of a liquid crystal display provided according to the first aspect of the present invention; a light guide member substantially in the form of a plate as a whole, the light guide member including a light incident surface spreading in a thickness direction and facing the LED light source unit for a backlight of a liquid crystal display, a reflective surface spreading in a direction perpendicular to the thickness direction for reflecting light traveling from the light incident surface in the thickness direction, and a light emission surface spaced from the reflective surface in the thickness direction for emitting light traveling from the reflective surface; and a liquid crystal panel for selectively allowing light emitted from the light emission surface to pass through to form an image.

According to a third aspect of the present invention, there is provided an LED light source unit for a backlight of a liquid crystal display, comprising: a plurality of LED chips; a substrate including a principal surface on which the LED chips are mounted; and a reflector attached to the substrate and formed with a plurality of openings each including an inner surface surrounding a respective one of the LED chips.

Preferably, the inner surface is inclined to be away from the LED chip in a direction perpendicular to the principal surface as proceeding away from the principal surface in a normal direction of the principal surface.

Preferably, the opening is rectangular as viewed in plan.

Preferably, the substrate is in the form of an elongated rectangle, and the LED chips are arranged in a row along the longitudinal direction of the substrate.

Preferably, the reflector includes a smaller-cross-sectional portion positioned between adjacent ones of the openings and smaller in cross section than other portions.

Preferably, the smaller-cross-sectional portion is provided by forming a recess on a surface of the reflector that is positioned on the side opposite from the substrate.

Preferably, the smaller-cross-sectional portion is provided by forming a recess on a surface of the reflector that is positioned on the side of the substrate.

Preferably, the smaller-cross-sectional portion is provided by forming a recess on a side surface of the reflector that is oriented in the width direction.

Preferably, the reflector is made of white resin.

Preferably, the white resin is liquid crystal polymer or polybutylene terephthalate.

Preferably, each of the LED chips comprises a submount substrate made of Si and a semiconductor layer disposed on the submount substrate, and the LED chip is mounted with the submount substrate positioned on the substrate side. The LED light source unit further comprises an opaque resin that covers at least part of a side surface of the submount substrate that is oriented in a direction perpendicular to a normal direction of the principal surface. The opaque resin is made of a material having a reflectivity higher than that of the submount substrate.

Preferably, the opaque resin entirely covers the side surface of the submount substrate.

Preferably, the semiconductor layer is entirely outside the opaque resin.

Preferably, as viewed in plan, the opaque resin covers a region within the opening of the reflector except the submount substrate.

Preferably, the opaque resin is white.

Preferably, the LED light source unit further comprises a light-transmitting resin laminated on the opaque resin to cover the semiconductor layer and including a fluorescent portion containing a fluorescent material that emits light different from light from the semiconductor layer when excited by the light from the semiconductor layer.

Preferably, the light-transmitting resin includes a transparent portion that intervenes between the fluorescent portion and the opaque resin and that does not contain the fluorescent material.

Preferably, a Zener diode for preventing excessive reverse voltage from being applied to the semiconductor layer is incorporated in the submount substrate.

Preferably, the LED light source unit further comprises a Zener diode mounted next to the LED chip for preventing excessive reverse voltage from being applied to the semiconductor layer, and the Zener diode is covered with the opaque resin.

Preferably, the LED light source unit further comprises a metal film covering the principal surface of the substrate, and the LED chips are mounted on the metal film.

Preferably, the substrate is made of a ceramic material.

Preferably, at least the outermost layer of the metal film comprises an Al layer.

Preferably, the metal film includes an AgPt layer intervening between at least part of the Al layer and the substrate.

Preferably, the metal film consists of an AgPt layer only.

Preferably, the AgPt layer is formed by printing paste containing Ag and Pt and then baking the paste.

Preferably, the Al layer is formed by sputtering.

Preferably, the LED light source unit further comprises a glass layer intervening between the metal film and the substrate.

Preferably, the glass layer includes a window portion in which the LED chip is positioned as viewed in the thickness direction of the substrate.

Preferably, the glass layer includes an inclined surface connected to an edge of the window portion and inclined to be away from the principal surface of the substrate in the normal direction of the principal surface as proceeding away from the LED chip.

Preferably, the inclined surface is in the form of a frame surrounding the LED chip.

Preferably, the glass layer is formed by printing paste containing glass and then baking the paste.

Preferably, the substrate is in the form of an elongated rectangle. The LED chips are arranged along the longitudinal direction of the substrate. The metal film includes a common strip portion elongated in the longitudinal direction of the substrate at a position close to one of edges of the substrate that are spaced in the width direction of the substrate, and one or more island groups which are arranged in parallel to the common strip portion and each of which comprises a plurality of island portions. One of the island portions that is positioned at an end in the longitudinal direction is electrically connected to the common strip portion. The LED chips are mounted to the island portions, respectively.

Preferably, the metal film includes: a connection terminal portion provided close to one of ends of the substrate that are spaced in the longitudinal direction, two island groups arranged in the longitudinal direction along the common strip portion, and a connection strip portion arranged on a side opposite from the common strip portion across the island groups in the width direction of the substrate. The connecting strip portion extends from the connection terminal portion in the longitudinal direction, and is electrically connected to the island portion that is closest to the connection terminal portion among the island portions included in one of the two island groups that is farther from the connection terminal portion.

According to a fourth embodiment of the present invention, there is provided a liquid crystal display comprising: the LED light source unit for a backlight of a liquid crystal display provided according to the first aspect of the present invention; a light guide member substantially in the form of a plate as a whole, the light guide member including a light incident surface spreading in the thickness direction and facing the LED light source unit for a backlight of a liquid crystal display, a reflective surface spreading in a direction perpendicular to the thickness direction for reflecting light traveling from the light incident surface in the thickness direction, and a light emission surface spaced from the reflective surface in the thickness direction for emitting light traveling from the reflective surface; and a liquid crystal panel for selectively allowing light emitted from the light emission surface to pass through to form an image.

According to a fifth embodiment of the present invention, there is provided an LED light source unit for a backlight of a liquid crystal display. The LED light source unit comprises a plurality of LED chips; a substrate including a principal surface on which the LED chips are mounted; and an opaque resin. One of the LED chips comprises a submount substrate made of Si and a semiconductor layer disposed on the submount substrate. The opaque resin is made of a material having a reflectivity higher than that of the submount substrate. The submount substrate includes a side surface oriented in a direction perpendicular to a normal direction of the principal surface, and at least part of the side surface is covered with the opaque resin.

Preferably, the opaque resin entirely covers the side surface of the submount substrate.

Preferably, the semiconductor layer is entirely outside the opaque resin.

Preferably, the opaque resin is white.

Preferably, the LED light source unit further comprises a light-transmitting resin laminated on the opaque resin to cover the semiconductor layer. The light-transmitting resin includes a fluorescent portion, and the fluorescent portion contains a fluorescent material that emits light different from light from the semiconductor layer when excited by the light from the semiconductor layer.

Preferably, the light-transmitting resin includes a transparent portion that intervenes between the fluorescent portion and the opaque resin and that does not contain the fluorescent material.

Preferably, a Zener diode for preventing excessive reverse voltage from being applied to the semiconductor layer is incorporated in the submount substrate.

Preferably, the LED light source unit further comprises a Zener diode mounted next to the LED chip for preventing excessive reverse voltage from being applied to the semiconductor layer, and the Zener diode is covered with the opaque resin.

Preferably, the LED light source unit further comprises a reflector formed with an opening including an inner surface surrounding one of the LED chips, and an adhesive layer intervening between the reflector and the substrate.

Preferably, the reflector includes a bottom surface that is in contact with the adhesive layer, and a projection projecting from the bottom surface toward the substrate. The projection is positioned between the adhesive layer and the opaque resin as viewed in the normal direction.

Preferably, the projection is in contact with the opaque resin.

Preferably, the projection surrounds the opaque resin as viewed in the normal direction.

Preferably, as viewed in the normal direction, the reflector includes a first surface surrounding one of the LED chips and a second surface connected to the first surface and inclined with respect to the first surface. The second surface is oriented toward a side opposite from a region surrounded by the first surface as viewed in the normal direction.

Preferably, the reflector includes a third surface oriented in the normal direction, and the second surface stands on the third surface to extend toward the first surface.

Preferably, the light-transmitting resin has a shape bulging in the normal direction.

Preferably, the LED light source unit further comprises a plurality of reflectors attached to the substrate and spaced from each other. Each of the reflectors is formed with an opening including an inner surface surrounding one of the LED chips.

Preferably, the LED light source unit further comprises a reflector attached to the substrate and formed with a plurality of openings. Each of the openings includes an inner surface surrounding one of the LED chips.

Preferably, the inner surface is inclined to be away from the LED chip in a direction perpendicular to the normal direction of the principal surface as proceeding away from the principal surface in the normal direction.

Preferably, the opening is rectangular as viewed in plan.

Preferably, the substrate is in the form of an elongated rectangle, and the LED chips are arranged in a row along the longitudinal direction of the substrate.

Preferably, the reflector includes a smaller-cross-sectional portion positioned between adjacent two of the openings and smaller in cross section than other portions.

Preferably, the smaller-cross-sectional portion is provided by forming a recess on a surface of the reflector that is positioned on a side opposite from the substrate.

Preferably, the smaller-cross-sectional portion is provided by forming a recess on a surface of the reflector that is positioned on a side of the substrate.

Preferably, the smaller-cross-sectional portion is provided by forming a recess on a side surface of the reflector that is oriented in the width direction.

Preferably, the reflector is made of white resin.

Preferably, the white resin is liquid crystal polymer or polybutylene terephthalate.

Preferably, as viewed in plan, the opaque resin covers a region within one of the openings except the submount substrate.

Preferably, the LED light source unit further comprises a metal film covering the substrate, and the LED chips are mounted on the metal film.

Preferably, the substrate is made of a ceramic material.

Preferably, the metal film includes an Al layer constituting the outermost layer.

Preferably, the metal film includes an AgPt layer intervening between at least part of the Al layer and the substrate.

Preferably, the metal film consists of an AgPt layer only.

Preferably, the AgPt layer is formed by printing paste containing Ag and Pt and then baking the paste.

Preferably, the Al layer is formed by sputtering.

Preferably, the LED light source unit further comprises a wire electrically connected to the metal film. One of the LED chips includes an electrode laminated on the semiconductor layer, and the wire is bonded to the electrode.

Preferably, the substrate is in the form of an elongated rectangle, the LED chips are arranged along the longitudinal direction of the substrate, and the metal film includes a common strip portion and one or more island groups. The common strip portion is elongated in the longitudinal direction of the substrate at a position close to one of edges of the substrate that are spaced in a width direction of the substrate. Each of the island groups comprises a plurality of island portions arranged in the longitudinal direction. One of the island portions that is positioned at an end in the longitudinal direction is electrically connected to the common strip portion. Each of the LED chips is mounted to one of the island portions.

Preferably, the metal film includes a connection terminal portion and a connecting strip portion. The connection terminal portion is provided close to one of ends of the substrate that are spaced in the longitudinal direction. The number of the one or more island groups is two or greater. Two of the island groups are arranged along the common strip portion. The connecting strip portion is arranged on a side opposite from the common strip portion across one of the island groups in the width direction of the substrate. The connecting strip portion extends from the connection terminal portion in the longitudinal direction. The connecting strip portion is electrically connected to the island portion that is closest to the connection terminal portion among the island portions included in one of the two island groups that is farther from the connection terminal portion.

According to a sixth embodiment of the present invention, there is provided a liquid crystal display comprising: the LED light source unit for a backlight of a liquid crystal display provided according to the first aspect of the present invention; a light guide plate including a light incident surface, a reflective surface and a light emission surface; and a liquid crystal panel for selectively allowing light emitted from the light emission surface to pass through to form an image. The light incident surface spreads within a plane that is parallel to a thickness direction of the light guide plate and faces the LED light source unit for a backlight of a liquid crystal display. The reflective surface spreads within a plane that is perpendicular to the thickness direction for reflecting light traveling from the light incident surface in the thickness direction. The light emission surface is spaced from the reflective surface in the thickness direction for emitting light traveling from the reflective surface.

Other features and advantages of the present invention will become more apparent from the detailed description given below with reference to the accompanying drawings.

BRIEF DESCRIPTION OF THE DRAWINGS

FIG. 32 is an enlarged schematic plan view showing a variation of the LED light source unit according to the sixth embodiment of the present invention;

FIG. 84 is a plan view showing an example of conventional LED light source unit.

DETAILED DESCRIPTION OF THE PREFERRED EMBODIMENTS

Figure 8:
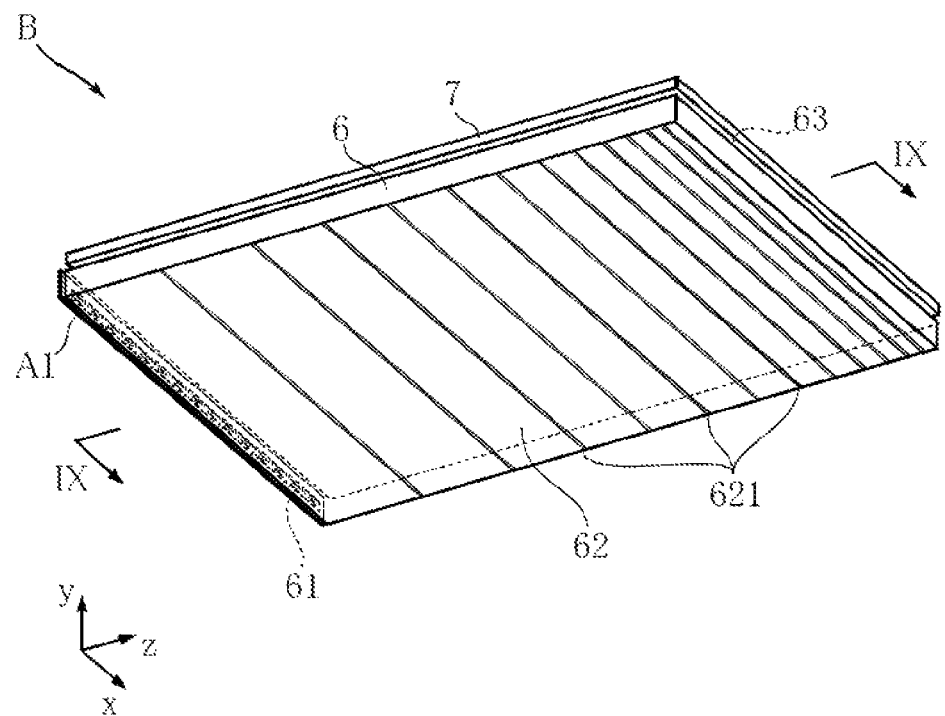
FIG. 8 is a perspective view showing an example of liquid crystal display that uses the LED light source unit of FIG. 1.
Figure 9:
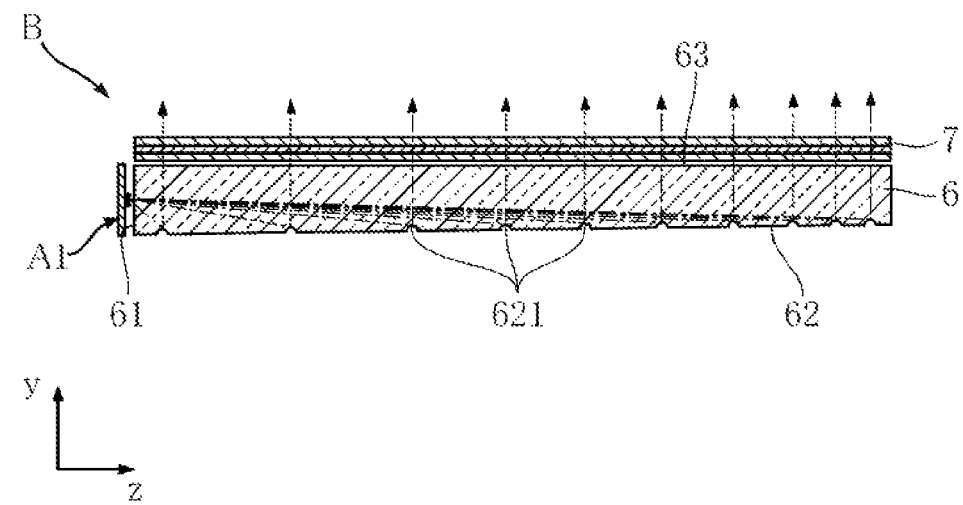
FIG. 9 is a sectional view taken along lines IX-IX in FIG. 8.

FIGS. 1-4 show an LED light source unit for a backlight of a liquid crystal display according to a first embodiment of the present invention. The LED light source unit A1 of this embodiment includes a substrate 1, a glass layer 2, a metal film 3, a plurality of LED chips 4, a reflector 51 and light-transmitting resin 55. As shown in FIGS. 8 and 9, the LED light source unit A1 is used as a light source constituting a backlight of e.g. a liquid crystal display B1. For easier understanding, the glass layer 2 and the light-transmitting resin 55 are omitted in FIG. 1, and the light-transmitting resin 55 is omitted in FIG. 2.

The substrate 1 is made of a ceramic material such as alumina and in the form of an elongated rectangle having a length in direction x and a width in direction y. The substrate 1 of this embodiment is about 222 mm in length, about 6.0 mm in width and about 1.0 mm in thickness.

Figure 5:
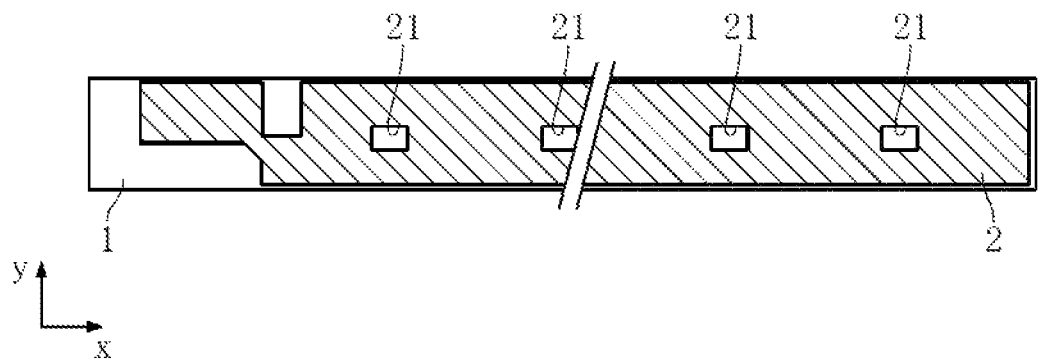
FIG. 5 is a schematic plan view showing the state after a glass layer is formed in the process of manufacturing the LED light source unit of FIG. 1.

The glass layer 2 provides a smooth surface suitable for forming the metal film 3 on the surface, and is formed on the principal surface 11 of the substrate 1. The glass layer 2 has a thickness of e.g. about 100 μm. FIG. 5 shows the substrate 1 on which the glass layer 2 is formed in the process of manufacturing the LED light source unit A1. The glass layer 2 is formed by e.g. printing glass paste and then baking the glass paste.

Figure 3:
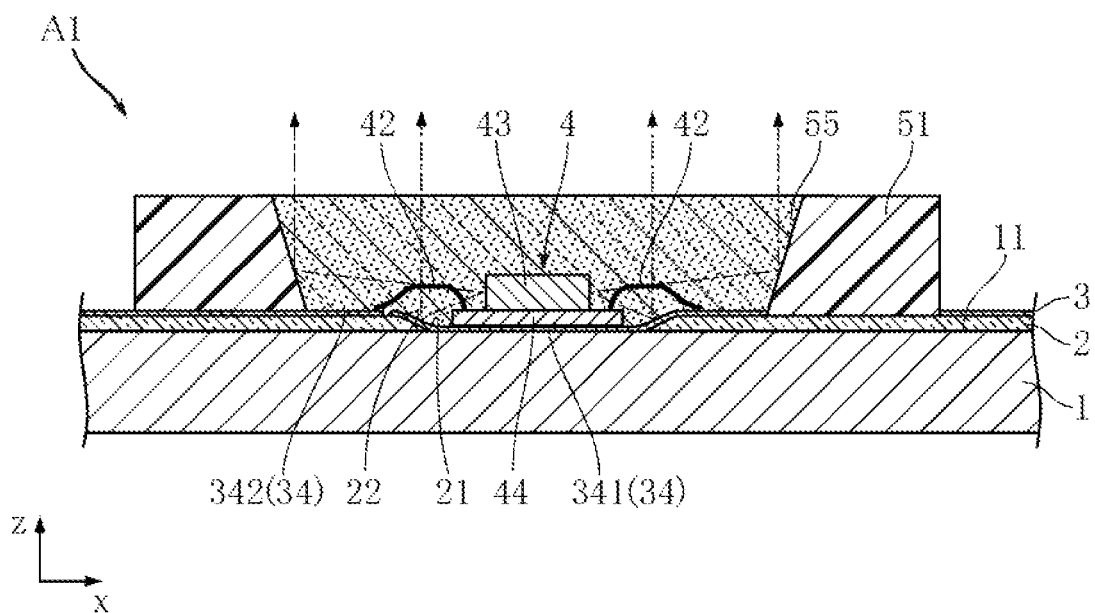
FIG. 3 is a schematic sectional view taken along lines in FIG. 2.
Figure 4:
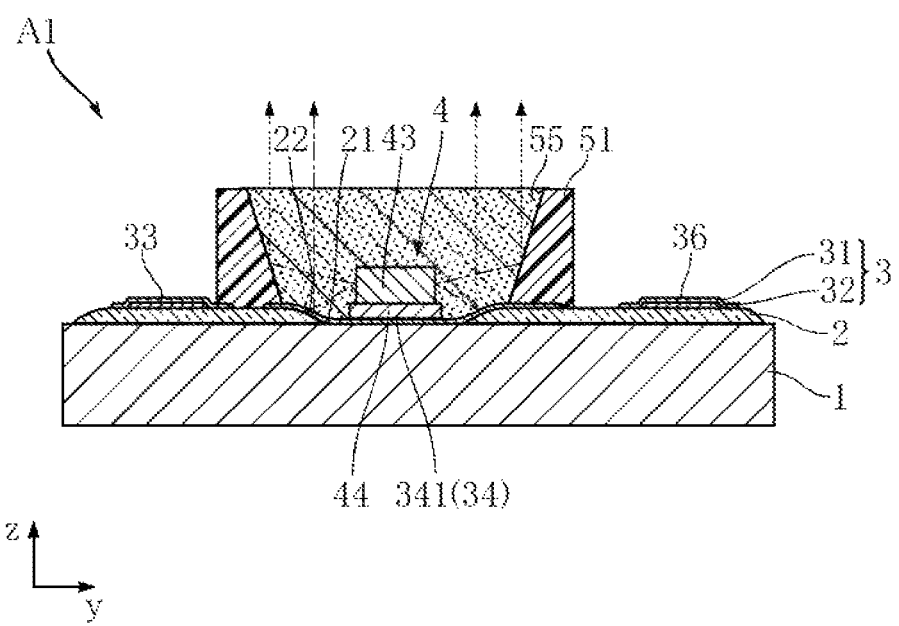
FIG. 4 is a schematic sectional view taken along lines IV-IV in FIG. 2.

As shown in the figure, the glass layer 2 includes a plurality of window portions 21. The window portions 21 are rectangular and arranged at generally equal intervals in direction x. Each of the window portions 21 has dimensions of about 1.8 mm in direction x and about 1.2 mm in direction y. As shown in FIGS. 3 and 4, the glass layer 2 includes inclined surfaces 22. Each of the inclined surfaces 22 is connected to the edge of a respective one of the window portions 21 and inclined to be higher in direction z in the figures as proceeding away from the window portion 21 in direction x or direction y. In this embodiment, the inclined surface 22 is in the form of a rectangular frame as viewed in direction z.

Figure 6:
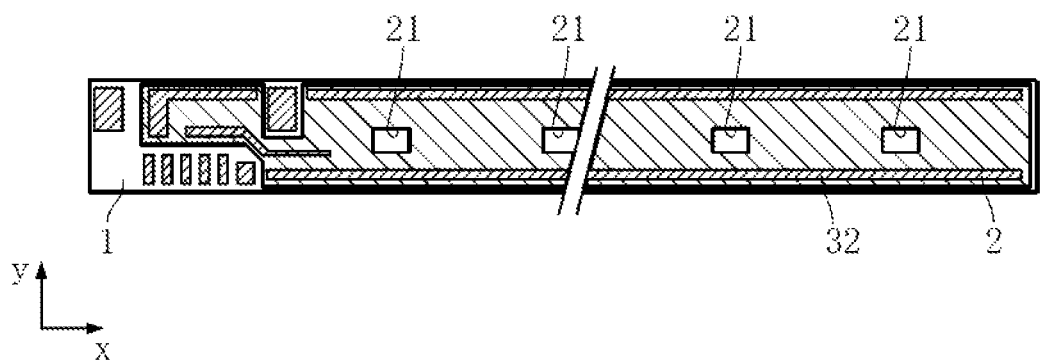
FIG. 6 is a schematic plan view showing the state after an AgPt layer is formed in the process of manufacturing the LED light source unit of FIG. 1.

The metal film 3 functions to supply electric power to the LED chips 4 and is formed on the glass layer 2, except the portions overlapping the window portions 21. In this embodiment, the metal film 3 is made up of an Al layer 31 and an AgPt layer 32. FIG. 6 shows the state after the AgPt layer 32 is formed in the process of manufacturing the LED light source unit A1. The AgPt layer 32 is formed by e.g. printing paste containing Ag and Pt and then baking the paste. The AgPt layer has a thickness of e.g. about 10 μm.

Figure 7:
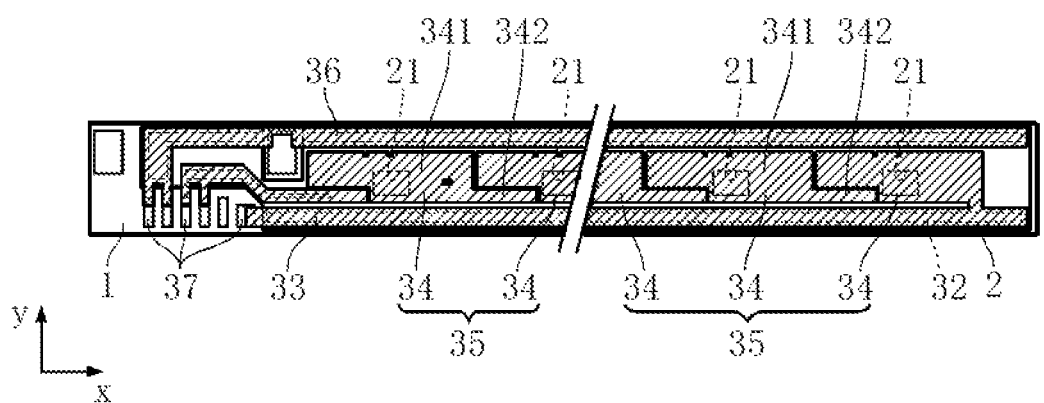
FIG. 7 is a schematic plan view showing the state after an Al layer is formed in the process of manufacturing the LED light source unit of FIG. 1.

The Al layer 31 constitutes the outermost layer of the metal film 3. FIG. 7 shows the state after the Al layer 31 is formed in the process of manufacturing the LED light source unit A1. The Al layer 31 is formed by e.g. sputtering. The Al layer 31 has a thickness of e.g. about 1.2 μm. The AgPt layer partially intervenes between the Al layer 31 and the glass layer 2.

Figure 1:
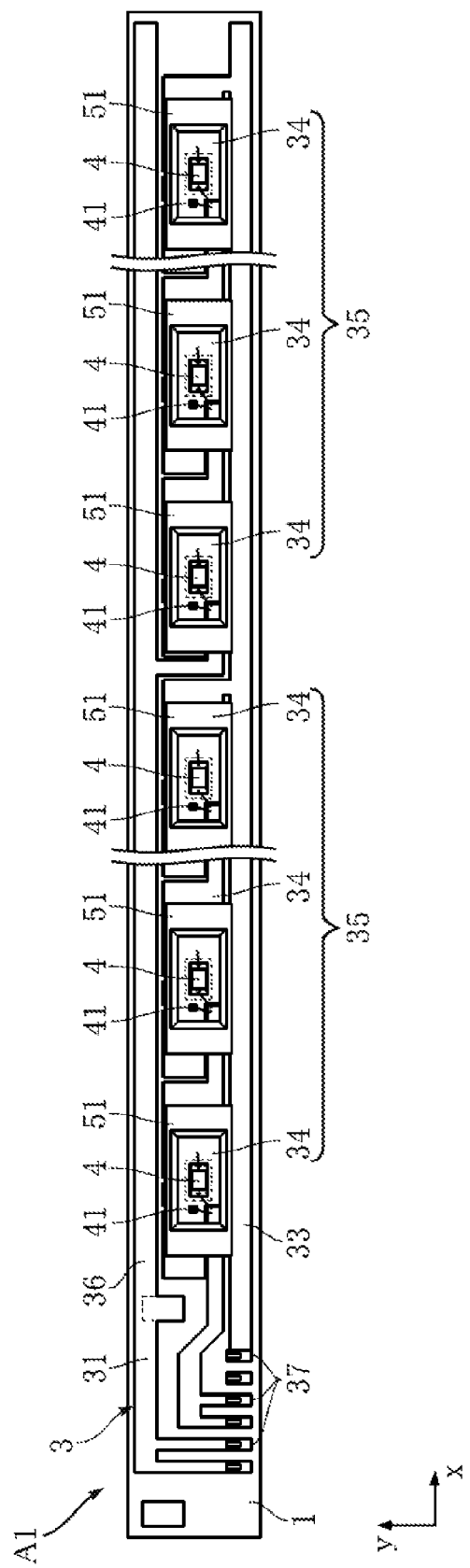
FIG. 1 is a schematic plan view showing an LED light source unit according to a first embodiment of the present invention.

As shown in FIGS. 1-4, the metal film 3 includes a common strip portion 33, a plurality of island groups 35, a connecting strip portion 36 and a plurality of connection terminal portions 37. As shown in FIG. 1, the common strip portion 33 is in the form of a strip elongated in direction x and extends substantially along the entire length of the substrate 1. The width of the common strip portion 33 is e.g. about 1 mm. The common strip portion 33 is positioned close to one of the edges of the substrate 1 that are spaced in direction y. As will be understood from FIGS. 4, 6 and 7, the common strip portion 33 of this embodiment comprises lamination of the Al layer 31 and the AgPt layer 32.

As shown in FIG. 1, the plurality of island groups 35 are aligned in direction x. In this embodiment, two island groups 35 are provided. Each island group 35 is made up of a plurality of island portions 34. The island portions 34 are aligned in direction x in parallel to the common strip portion 33. In this embodiment, each island group 35 includes twelve island portions 34. As will be understood from FIGS. 3, 4, 6 and 7, the island portions 34 of this embodiment have a single layer structure consisting of the Al layer 31 only.

Figure 2:
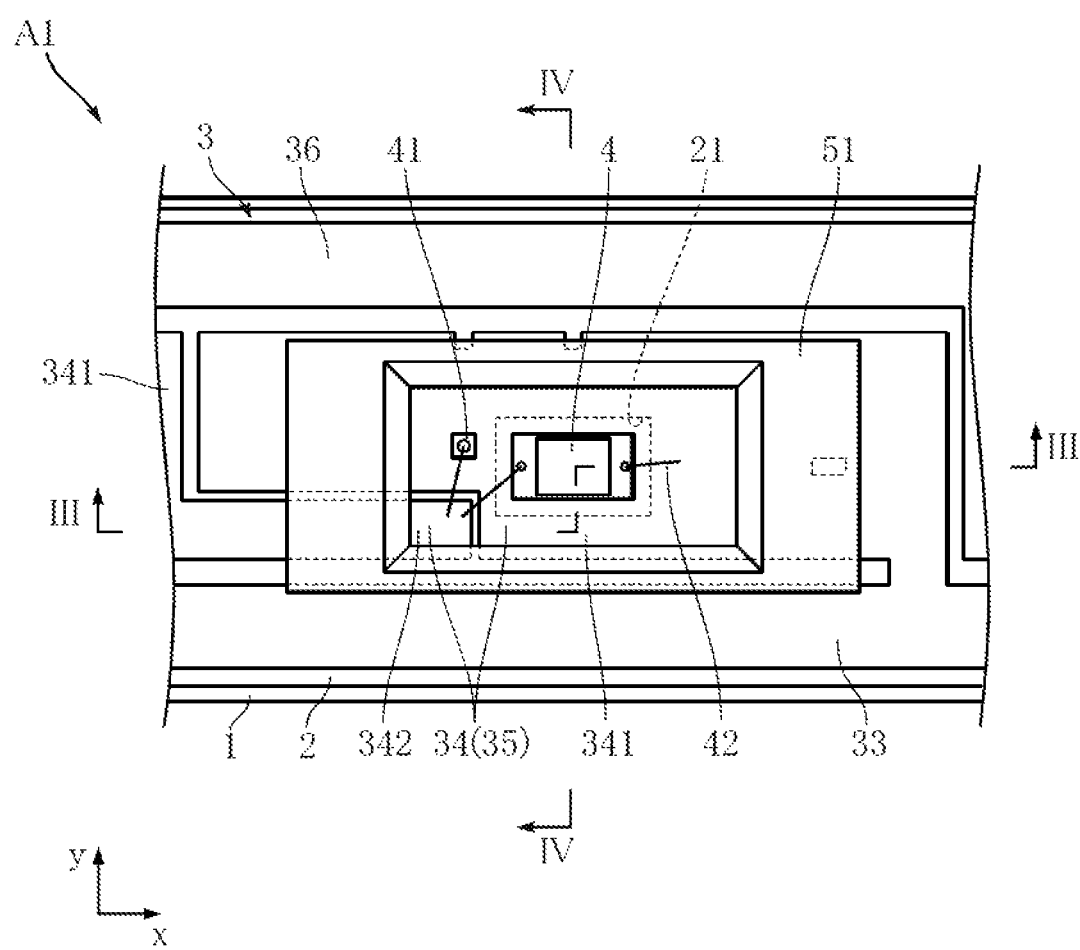
FIG. 2 is an enlarged schematic plan view of the LED light source unit of FIG. 1.

As shown in FIG. 2, each island portion 34 includes a main portion 341 and an extension 342. The main portion 341 is elongated in direction x and in the form of a rectangle partially cut away. In this embodiment, the main portion 341 has dimensions of about 9.0 mm in direction x and about 2.5 mm in direction y. As shown in FIGS. 2-4, the main portion 341 covers the window portion 21 and the inclined surface 22 of the glass layer. An LED chip 4 is mounted on the main portion 341 at a portion that covers the window portion 21, whereas a Zener diode 41 is mounted on the main portion 341 at a portion that covers a portion of the glass layer 2 that adjoins the window portion 21. The extension 342 is a portion elongated in direction x from the main portion 341 and is about 0.5 mm in width and about 3.0 mm in length in this embodiment. As shown in FIG. 2, the extension 342 of an island portion 34 is arranged to fit into the cut-away portion of the main portion 341 of the island portion 34 located directly on the right in direction x.

The connecting strip portion 36 is in the form of a strip elongated in direction x and extends substantially along the entire length of the substrate 1. The width of the connecting strip portion 36 is e.g. about 1 mm. The connecting strip portion 36 is positioned close to an edge of the substrate 1 that is opposite from the common strip portion 33 in direction y across the island groups 35. As will be understood from FIGS. 4, 6 and 7, the common strip portion 33 of this embodiment comprises lamination of the Al layer 31 and the AgPt layer 32.

As shown in FIG. 1, the connection terminal portions 37 are positioned close to one of the ends of the substrate 1 that are spaced in direction x and used for connection to the power supply or control unit (neither is shown) of the liquid crystal display B1, for example. As will be understood from FIGS. 6 and 7, the connection terminal portions 37 comprise the AgPt layer 32.

In FIG. 1, the connection terminal portion 37 positioned on the right side in direction x is connected to the common strip portion 33, whereas the connection terminal portion 37 positioned on the left side in direction x is connected to the connecting strip portion 36. The connection terminal portion 37 positioned at the center in direction x is connected to the leftmost one in direction x (closest to the connection terminal portions 37) of the island portions 34. The rightmost one, in direction x, of the island portions 34 included in each island group 35 (farthest from the connection terminal portions 37) is connected to the common strip portion 33. Further, of the island portions 34 included in the island group 35 on the right side in direction x (farther side from the connection terminal portions 37), the leftmost one in direction x (closest from the connection terminal portions 37) is connected to the connecting strip portion 36.

Each LED chip 4 includes a submount substrate 44 made of e.g. Si, and a semiconductor layer 43 comprising the lamination of an n-type semiconductor layer made of GaN, an active layer and a p-type semiconductor layer, and emits e.g. blue light. The semiconductor layer 43 has electrode pads (not shown) on the submount substrate 44 side. These electrode pads are bonded to the wiring pattern (not shown) formed on the submount substrate 44. As shown in FIG. 2, the LED chip 4 is mounted on the main portion 341 of the island portion 34 at a portion that covers the window portion 21. Thus, as viewed in direction z, the LED chip 4 is within the window portion 21 and surrounded by the frame-shaped inclined surface 22. The LED chip 4 is provided with two electrodes, one of which is connected with a wire 42 to the main portion 341 of the island portion 34 to which the LED chip is mounted. The other one of the electrodes is connected with a wire 42 to the extension 342 of the adjacent island portion 34. The LED chip 4 in this embodiment has dimensions of about 1.9 mm in direction x and about 1.3 mm in direction y. Bonding the submount substrate 44 to the island portion 34 is expected to provide enhanced heat dissipation effect from the LED chip 4 to the metal film 3. For the promotion of the heat dissipation effect, it is preferable to perform bonding between the LED chip 4 and the island portion 34 by using e.g. Ag paste, an epoxy resin or an epoxy resin mixed with a filler made of a highly conductive material. Although the LED chip 4 of this embodiment is of a so-called two-wire type, a single-wire LED chip that can be bonded with a single wire 42 or a flip chip LED 4 that can be bonded without using a wire 42 may be used instead.

Because of the structure of the metal film 3 and the mounting arrangement of the LED chips 4, the LED light source unit A1 of this embodiment includes a circuit in which two groups of LED chips 4, each consisting of twelve LED chips 4 connected in series with each other, are connected in parallel to each other.

The Zener diode 41 serves to prevent excessive reverse voltage from being applied to the LED chip 4 and is mounted on the main portion 341 of the island portion 34a at a portion that is adjacent to a portion covering the window portion. The Zener diode 41 is connected with a wire 42 to the extension 342 of the adjacent island portion 34. A device having the same function as the Zener diode 41 may be incorporated in the submount substrate 44 of the LED chip 4.

The reflector 51 is provided for causing a larger amount of light from the LED chip 4 to travel in direction z and in the form of a rectangular frame made of e.g. a white resin. The reflector 51 is formed after the mounting of the LED chips 4 is completed. Thus, the reflector 51 is not exposed to high temperature in e.g. a reflow furnace. Thus, polybutylene terephthalate (PBT) resin can be used as the white resin. PBT resin is suitable for enhancing the reflectivity at the surface of the reflector 51. The reflector 51 is formed on the metal film 3 (partially on the glass layer 2) to surround the LED chip 4 and the Zener diode 41. In this embodiment, the reflector 51 has dimensions of about 6.8 mm in direction x, about 3.0 mm in direction y, and about 1 mm in direction z. The opening of the reflector 51, in which the LED chip 4 is housed, has dimensions of about 3.9 mm in direction x and about 1.9 mm in direction y.

As shown in FIGS. 3 and 4, the light-transmitting resin 55 fills the space surrounded by the reflector 51 and covers the LED chip 4 and the Zener diode 41. The light-transmitting resin 55 may comprise a material obtained by mixing a fluorescent material into a transparent epoxy resin. The fluorescent material may emit yellow light upon excitation by blue light from the LED chip 4. The blue light from the LED chip 4 and the yellow light from the fluorescent material mix together, causing white light to be emitted from the LED light source unit A1. Instead of the above-described fluorescent material, use may be made of a mixture of a fluorescent material that emits red light upon excitation by blue light and a fluorescent material that emits green light upon excitation by blue light.

FIGS. 8 and 9 show an example of liquid crystal display using the LED light source unit A1. The liquid crystal display B1 illustrated in the figures includes the LED light source unit A1, the light guide plate 6 and a liquid crystal panel 7.

The light guide plate 6 provides the backlight, together with the LED light source unit A1, and is made of e.g. transparent polycarbonate resin or acrylic resin. The light guide plate 6 is a plate spreading within a z-x plane. The light guide plate 6 includes a light incident surface 61, a reflective surface 62 and a light emission surface 63. The light incident surface 61 is a smooth surface perpendicular to direction z and faces the LED light source unit A1. The reflective surface 62 is perpendicular to direction y and is formed with a plurality of grooves 621. The light emission surface 63 is a smooth surface perpendicular to direction y and positioned on the opposite side from the reflective surface.

As shown in FIG. 9, light emitted from the LED light source unit A1 enters through the light incident surface 61 and travels within the light guide plate 6. The traveling light is reflected or diffused at the grooves 621 of the reflective surface 62 to travel in direction y. The light traveling from the reflective surface 62 is emitted to the outside through the light emission surface 63. In this way, when the LED light source unit A1 emits light, white light is emitted from the entire light emission surface 63 of the light guide plate 6.

The liquid crystal panel 7 selectively allows the light emitted from the light guide plate 6 to pass through, thereby forming an image for display on the liquid crystal display B1. The liquid crystal panel 7 comprises e.g. two transparent substrates facing each other and a liquid crystal layer sandwiched between the transparent substrates, and is designed to change the light transmission state for each pixel by e.g. the active matrix method.

The advantages of the LED light source unit A1 and the liquid crystal display B1 are described below.

According to this embodiment, the light emitted from the LED chip 4 and traveling toward the metal film 3 is reflected at the metal film 3. Thus, a large amount of light is emitted from the LED light source unit A1, so that the brightness is enhanced. In particular, since the outermost layer of the metal film 3 is the Al layer 31, only a small proportion of light is absorbed, which contributes to enhancement of brightness of the LED light source unit A1. In this embodiment, most part of the principal surface 11 of the substrate 1 is covered with the metal film 3, except the portion formed with a slit for separating the common strip portion 33, the island portions 34, and the connecting strip portion 36. This suppresses unfavorable absorption of light emitted from the LED chip 4.

Since the metal film 3 is formed on the glass layer 2, the surface of the metal film 3 is smooth as a mirror surface. This allows a large proportion of light from the LED chip 4 to be reflected. The Al layer 31 has a high density when formed by sputtering, which is suitable for realizing the mirror surface condition.

Of the metal film 3 (the main portion 341), the portion covering the inclined surface 22 constitutes a reflective region in the form of a frame surrounding the LED chip 4. This arrangement also allows a large proportion of light from the LED chip 4 to be emitted to the outside. The inclined surface 22 of the glass layer 2 can be formed properly by a technique using printing and baking. The provision of the reflector 51 also prevents the light from the LED chip 4 from being absorbed.

When viewed in direction z, the LED chip 4 is within the window portion 21. Thus, only the metal film 3 intervenes between the LED chip 4 and the substrate 1, and the glass layer does not intervene. This arrangement promotes heat dissipation from the LED chip 4.

The structure of the metal film 3 including the common strip portion 33, the island portions 34 and the connecting strip portion 36 achieves proper connection of the LED chips 4.

Since each of the common strip portion 33 and the connecting strip portion 36 has a lamination structure made up of the Al layer 31 and the AgPt layer 32, resistance is reduced. Since the common strip portion 33 and the connecting strip portion 36 are relatively narrow and long, voltage tends to drop at these portions. The above-described lamination structure suppresses the voltage drop at the common strip portion 33 and the connecting strip portion 36.

Enhancing the brightness of the LED light source unit A1 allows the liquid crystal display B1 to display brighter and clearer images.

FIGS. 10-20 illustrate other embodiments of the present invention. In these figures, the elements that are identical or similar to those of the foregoing embodiment are designated by the same reference signs as those used for the foregoing embodiment.

Figure 10:
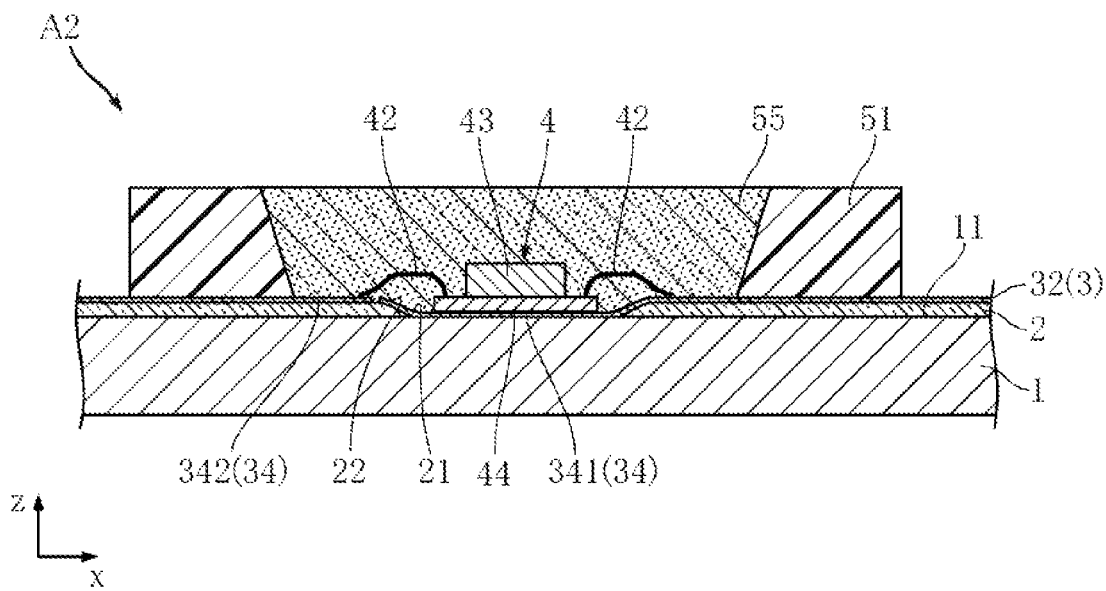
FIG. 10 is a schematic sectional view showing an LED light source unit according to a second embodiment of the present invention.
Figure 11:
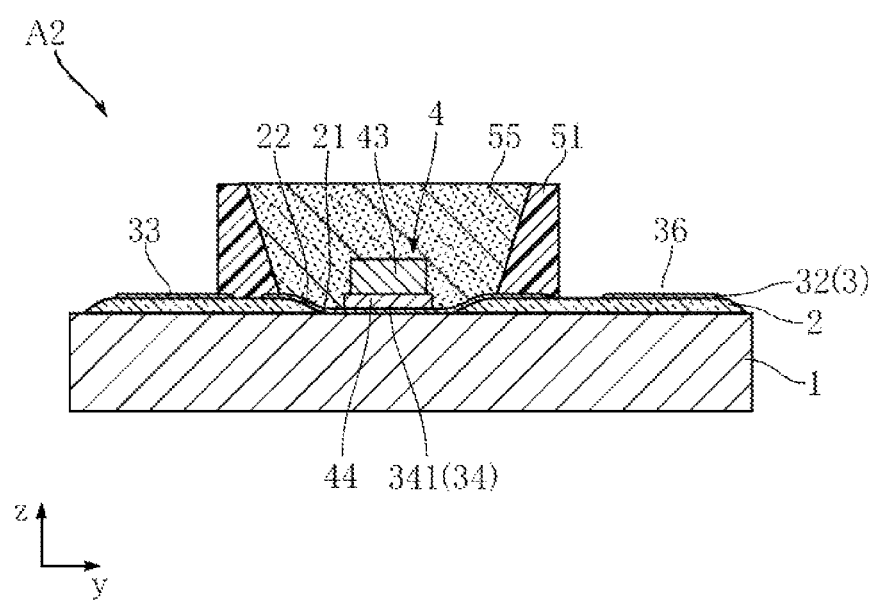
FIG. 11 is a sectional view showing the LED light source unit according to the second embodiment of the present invention.

FIGS. 10 and 11 illustrate an LED light source unit according to a second embodiment of the present invention. The LED light source unit A2 of this embodiment is different from the foregoing embodiment in structure of the metal film 3. In this embodiment, the metal film 3 consists of an AgPt layer 32 only. The AgPt layer 32 shows a bright white color and has a relatively high reflectivity. This arrangement also enhances the brightness of the LED light source unit A2. In manufacturing the LED light source unit A2, the step of forming the Al layer 31 is omitted, which leads to cost reduction of the LED light source unit A2.

Figure 12:
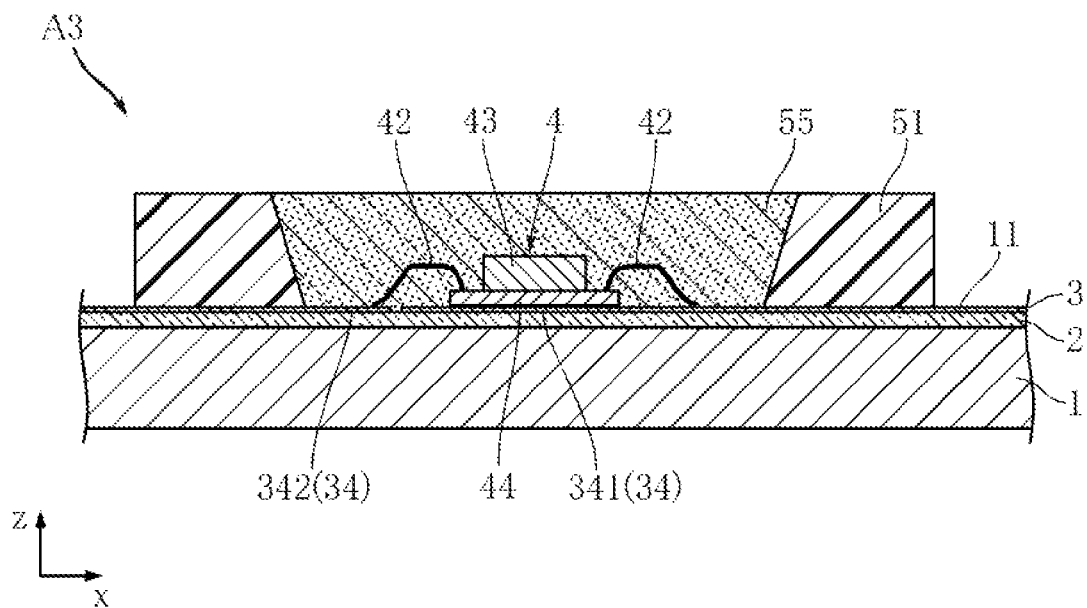
FIG. 12 is a schematic sectional view showing an LED light source unit according to a third embodiment of the present invention.
Figure 13:
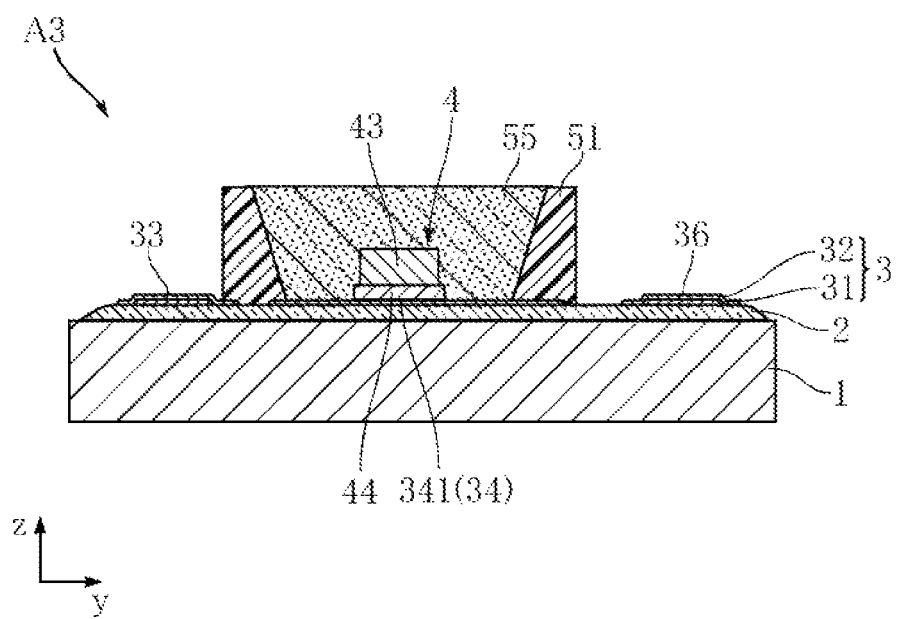
FIG. 13 is a sectional view showing the LED light source unit according to the third embodiment of the present invention.

FIGS. 12 and 13 illustrate an LED light source unit according to a third embodiment of the present invention. The LED light source unit A3 of this embodiment is different from the foregoing embodiments in that the glass layer 21 does not include window portions 21 and inclined surfaces 22. In this embodiment, the entire surface of the main portion 341 is smooth as a mirror surface. This allows a larger proportion of light from the LED chip 4 to be reflected in direction z.

Figure 14:
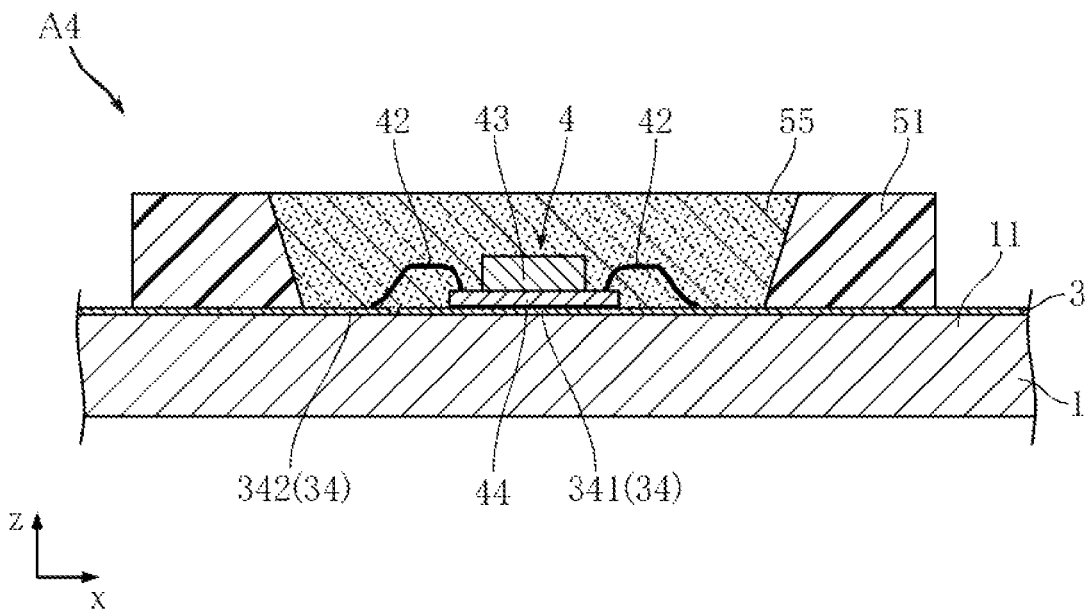
FIG. 14 is a schematic sectional view showing an LED light source unit according to a fourth embodiment of the present invention.
Figure 15:
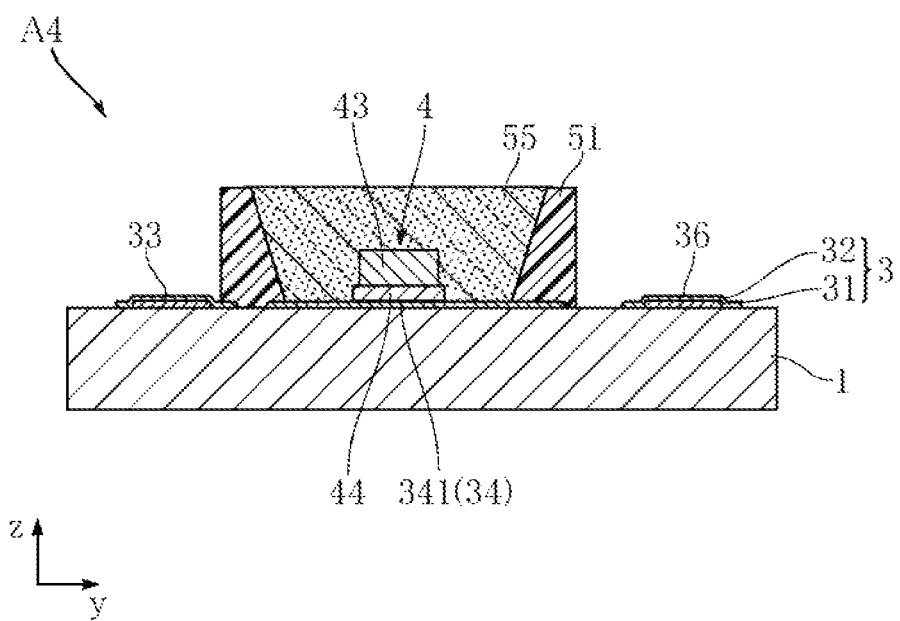
FIG. 15 is a sectional view showing the LED light source unit according to the fourth embodiment of the present invention.

FIGS. 14 and 15 illustrate an LED light source unit according to a fourth embodiment of the present invention. Unlike the foregoing embodiments, the LED light source unit A4 of this embodiment does not include the glass layer 2. Because the glass layer 2 is not provided, the surface of the metal film 3 is a frosted white surface. This metal film 3 still has a relatively high reflectivity, because the outermost layer comprises the Al layer 31. Thus, the LED light source unit A4 has enhanced brightness. Since the step for making the glass layer 2 is omitted, the cost for the LED light source unit A4 reduces. Further, heat dissipation from the LED chip 4 is promoted.

Figure 16:
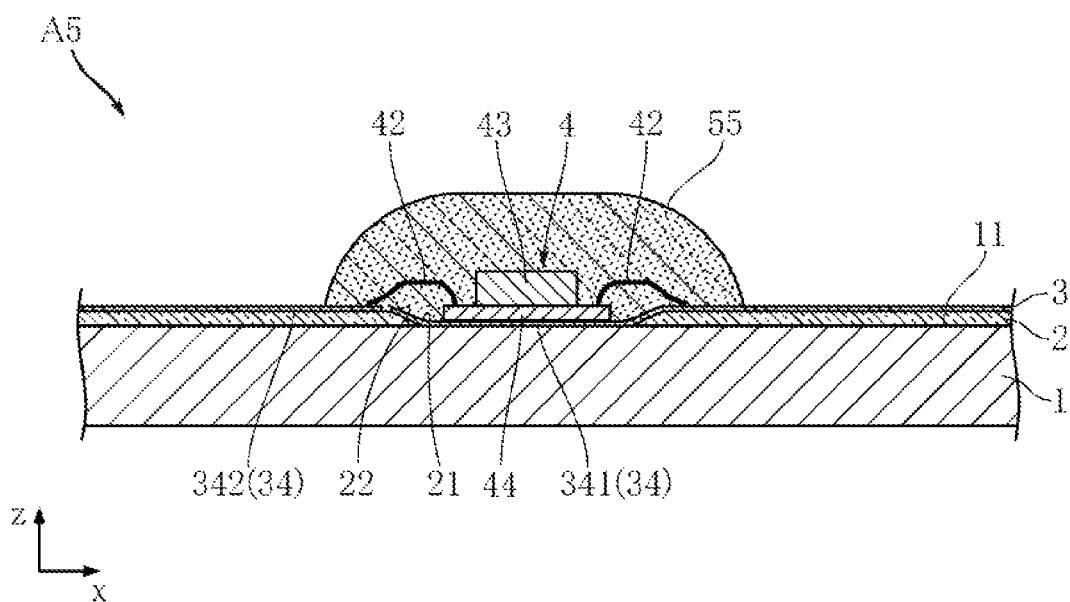
FIG. 16 is a schematic sectional view showing an LED light source unit according to a fifth embodiment of the present invention.
Figure 17:
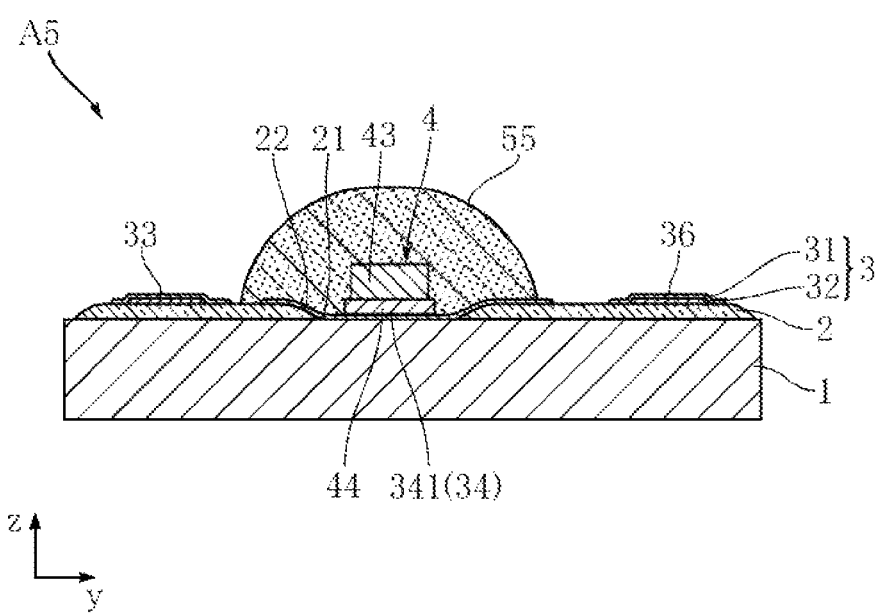
FIG. 17 is a sectional view showing the LED light source unit according to the fifth embodiment of the present invention.

FIGS. 16 and 17 illustrate an LED light source unit according to a fifth embodiment of the present invention. Unlike the foregoing embodiments, the LED light source unit A5 of this embodiment does not include a reflector 51. In this embodiment, the light-transmitting resin 55 is provided by dropping liquid resin to cover the LED chip 4 and then hardening the liquid resin. In this embodiment again, the principal surface 11 of the substrate 1 is covered by the metal film 3. Thus, light from the LED chip 4 is prevented from being unfavorably absorbed, so that the LED light source unit A5 has an enhanced brightness.

Figure 18:
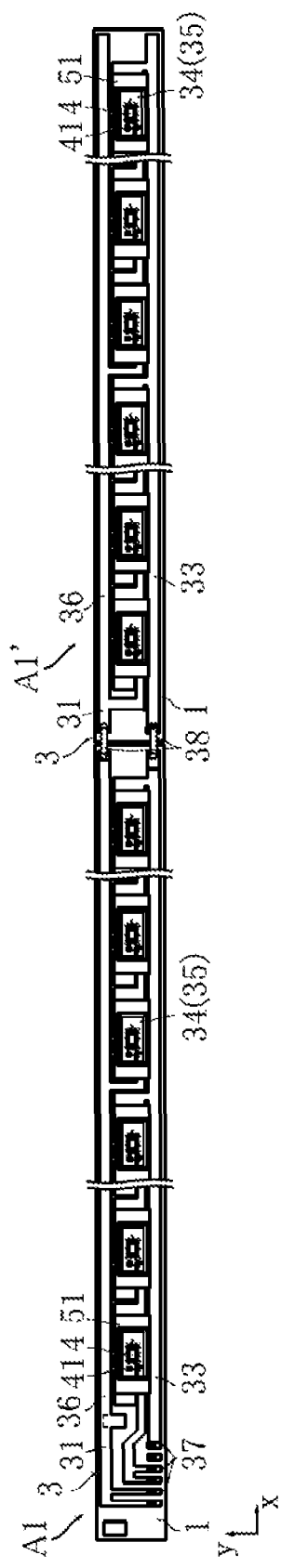
FIG. 18 is a schematic plan view showing an example of usage of the LED light source unit according to the first embodiment of the present invention.

FIG. 18 illustrates the structure obtained by combining the LED light source unit according to the first embodiment of the present invention and a variation of the LED light source unit. The LED light source unit A1' illustrated in the figure is different from the LED light source unit A1 in that it does not include connection terminal portions 37. The common strip portion 33 of the LED light source unit A1 and that of the LED light source unit A1' are connected to each other with a wire 38, so are the connecting strip portion 36 of the LED light source unit A1 and that of the LED light source unit A1'. With this arrangement, an LED light source unit for a backlight of a larger liquid crystal display can be obtained.

Figure 19:
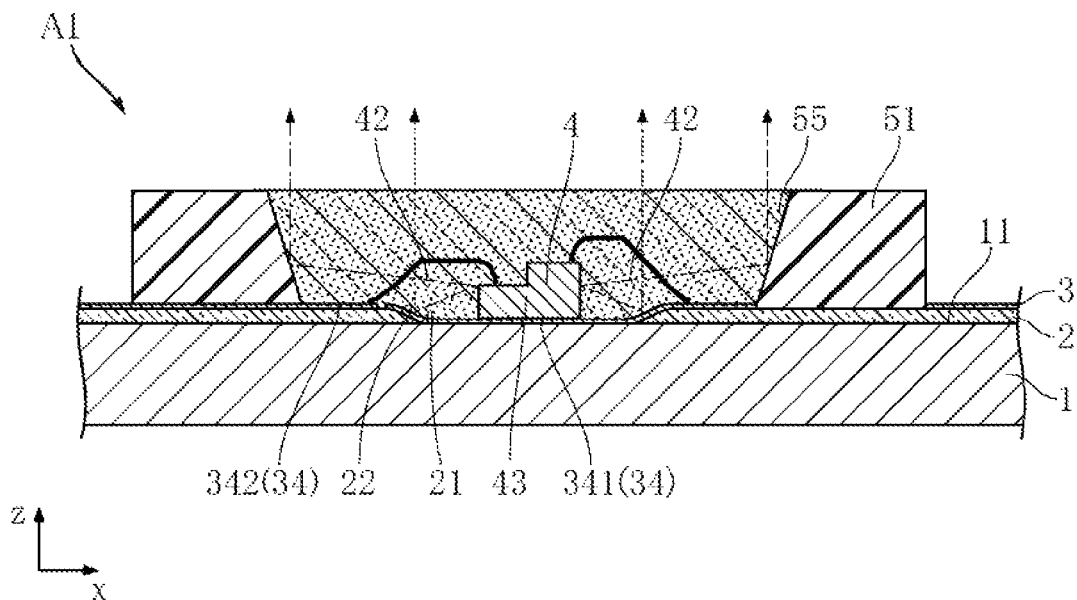
FIG. 19 is a schematic sectional view showing a variation of the LED light source unit according to the first embodiment of the present invention.
Figure 20:
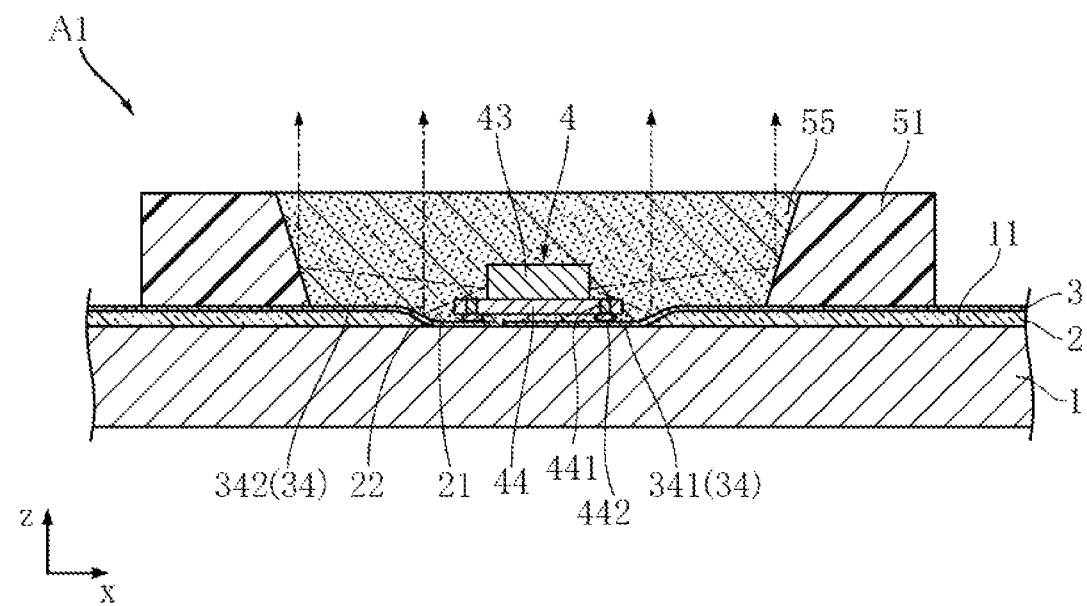
FIG. 20 is a schematic sectional view showing a variation of the LED light source unit according to the first embodiment of the present invention.
Figure 21:
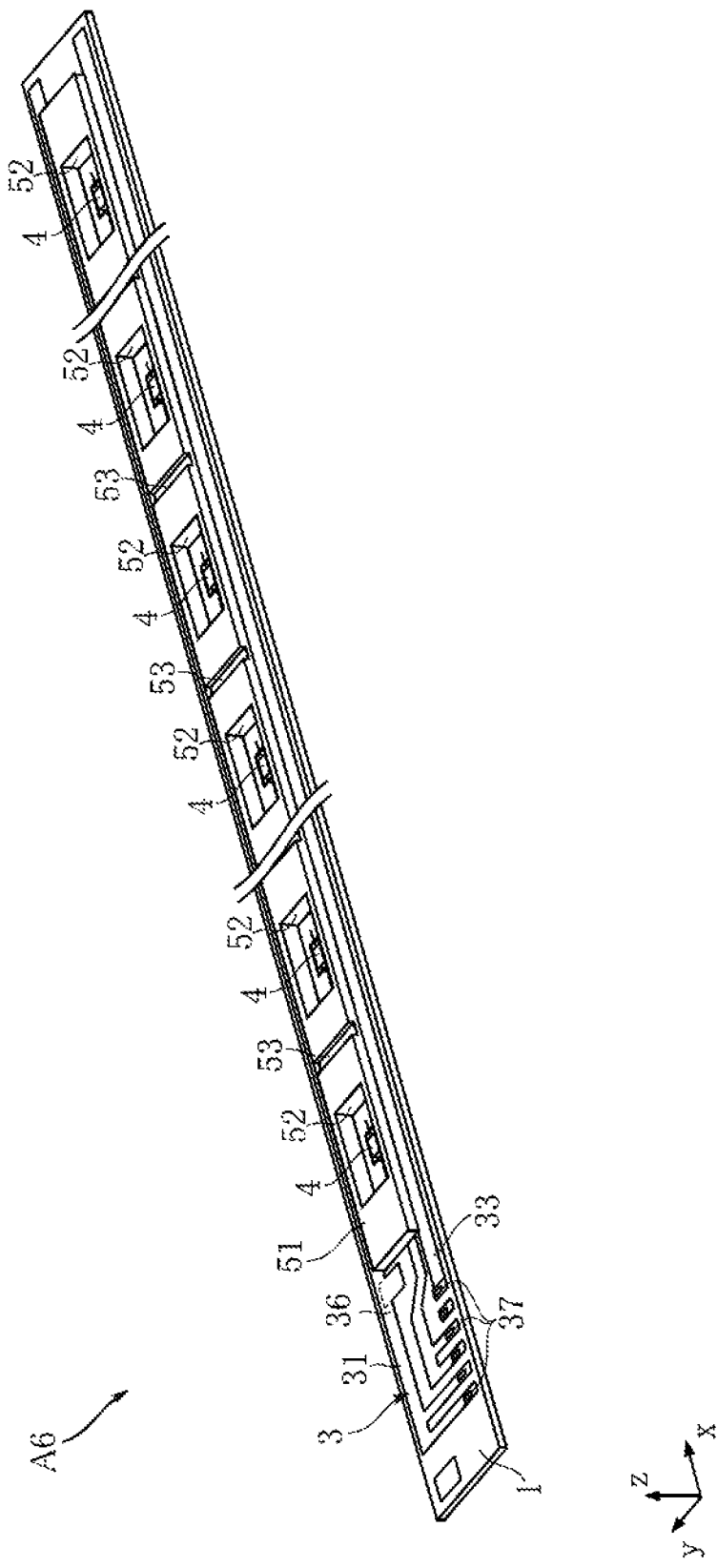
FIG. 21 is a schematic perspective view showing an LED light source unit according to a sixth embodiment of the present invention.

FIGS. 19 and 20 illustrate structures in which LED chips 4 of a type different from those described above are used for the LED light source unit A1. These LED chips 4, which are described below, can be used not only for the LED light source unit A1 but also for the LED light source unit A2-A5 and the LED light source unit A1'.

The LED chip 4 used for the LED light source unit A1 shown in FIG. 19 has a so-called two-wire structure. Specifically, the LED chip 4 comprises a semiconductor layer 43 comprising an n-type semiconductor layer, an active layer and a p-type semiconductor layer laminated in the mentioned order from the bottom. Two electrode pads (not shown) electrically connected to the n-type semiconductor layer and the p-type semiconductor layer are provided on the upper surface in the figure. Wires 42 are bonded to the electrode pads.

The LED chip 4 shown in FIG. 20 is of the type that can be mounted without using a wire 42. Specifically, the submount substrate 44 is provided with two through-hole electrodes 441. These through-holes electrodes 441 are electrically connected to the n-type semiconductor layer and the p-type semiconductor layer of the semiconductor layer 43, respectively, via the wiring pattern formed on the submount substrate 44. Mounting bumps 442 are formed on the lower surface of the through-hole electrodes 441. The LED chip 4 is bonded to the metal film 3 with the bumps 442.

The LED light source unit for a backlight of a liquid crystal display and the liquid crystal display according to the present invention are not limited to the foregoing embodiments. The specific structure of each part of the LED light source unit for a backlight of a liquid crystal display and the liquid crystal display can be varied in design in many ways.

Figure 30:
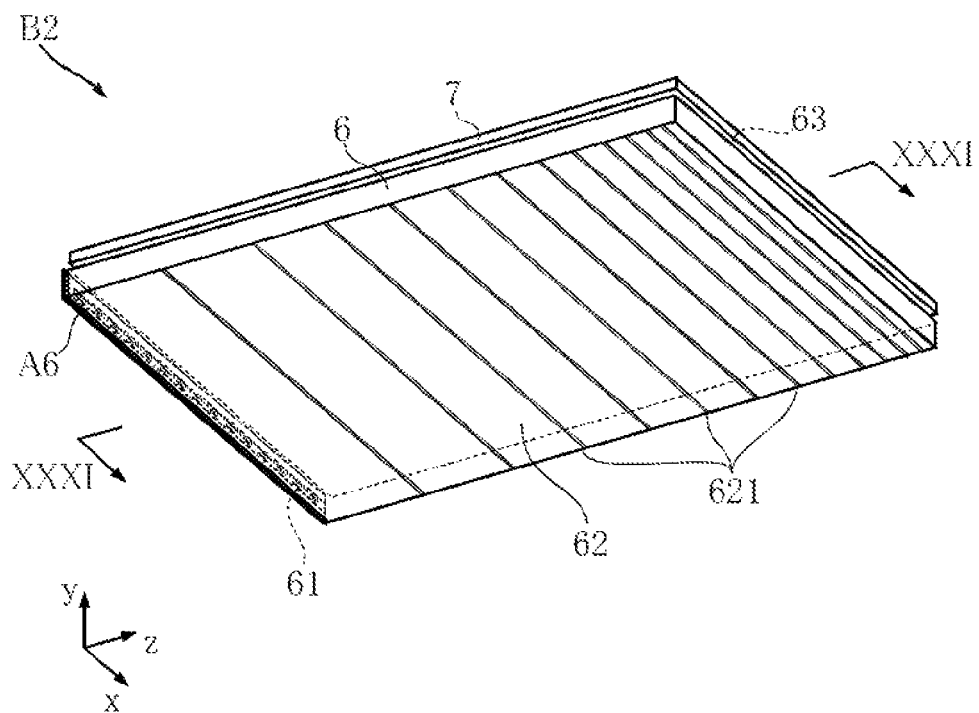
FIG. 30 is a perspective view showing an example of liquid crystal display that uses the LED light source unit of FIG. 21.
Figure 31:
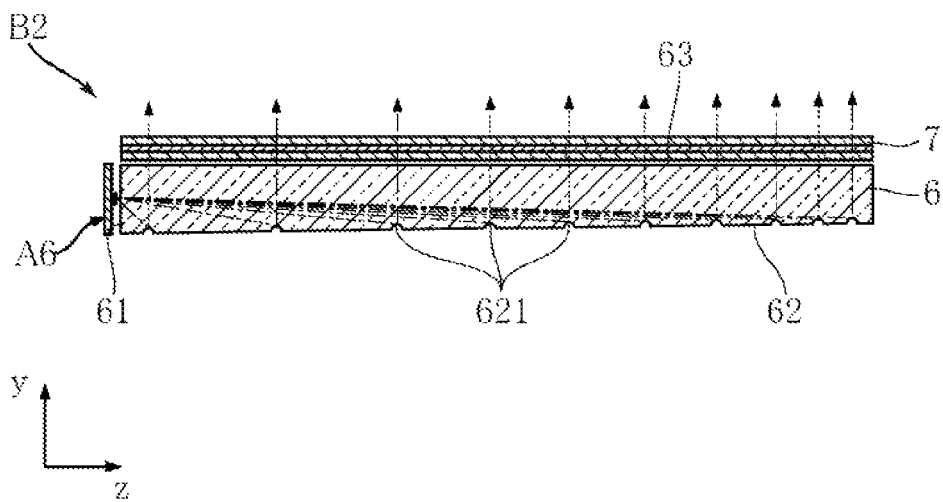
FIG. 31 is a sectional view taken along lines XXXI-XXXI in FIG. 30.

FIGS. 21-25 show an LED light source unit for a backlight of a liquid crystal display according to a sixth embodiment of the present invention. The LED light source unit A6 of this embodiment includes a substrate 1, a glass layer 2, a metal film 3, a plurality of LED chips 4, a reflector 51, a light-transmitting resin 55 and a white resin 58. As shown in FIGS. 30 and 31, the LED light source unit A6 is used as a light source constituting the backlight of e.g. a liquid crystal display B2. For easier understanding, the glass layer 2 and the light-transmitting resin 55 are omitted in FIGS. 21 and 22, and the light-transmitting resin 55 is omitted in FIG. 23.

The substrate 1 is made of a ceramic material such as alumina and in the form of an elongated rectangle having a length in direction x and a width in direction y. The substrate 1 of this embodiment is about 222 mm in length, about 6.0 mm in width and about 1.0 mm in thickness.

Figure 26:
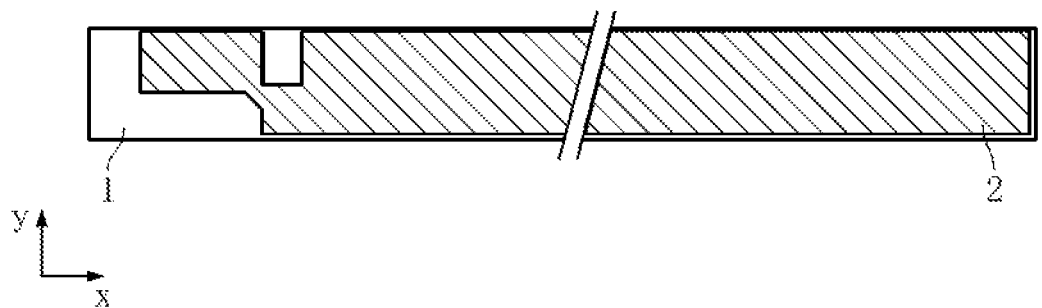
FIG. 26 is a schematic plan view showing the state after a glass layer is formed in the process of manufacturing the LED light source unit of FIG. 21.

The glass layer 2 provides a smooth surface suitable for forming the metal film 3 on the surface, and is formed on the principal surface 11 of the substrate 1. The glass layer 2 has a thickness of e.g. about 100 μm. FIG. 26 shows the substrate 1 on which the glass layer 2 is formed in the process of manufacturing an LED light source unit A6. The glass layer 2 is formed by e.g. printing glass paste and then baking the glass paste.

Figure 27:
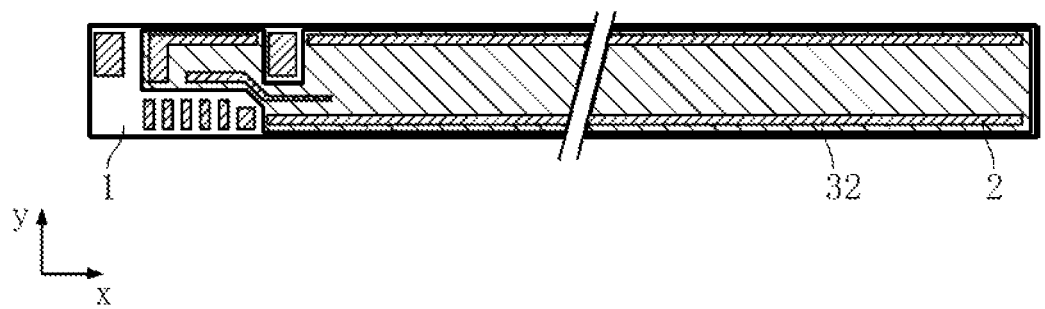
FIG. 27 is a schematic plan view showing the state after an AgPt layer is formed in the process of manufacturing the LED light source unit of FIG. 21.

The metal film 3 functions to supply electric power to the LED chips 4 and is positioned on the glass layer 2. In this embodiment, the metal film 3 is made up of an Al layer 31 and an AgPt layer 32. FIG. 27 shows the state after the AgPt layer 32 is formed in the process of manufacturing the LED light source unit A6. The AgPt layer 32 is formed by e.g. printing paste containing Ag and Pt and then baking the paste. The AgPt layer 32 has a thickness of e.g. about 10 μm.

Figure 28:
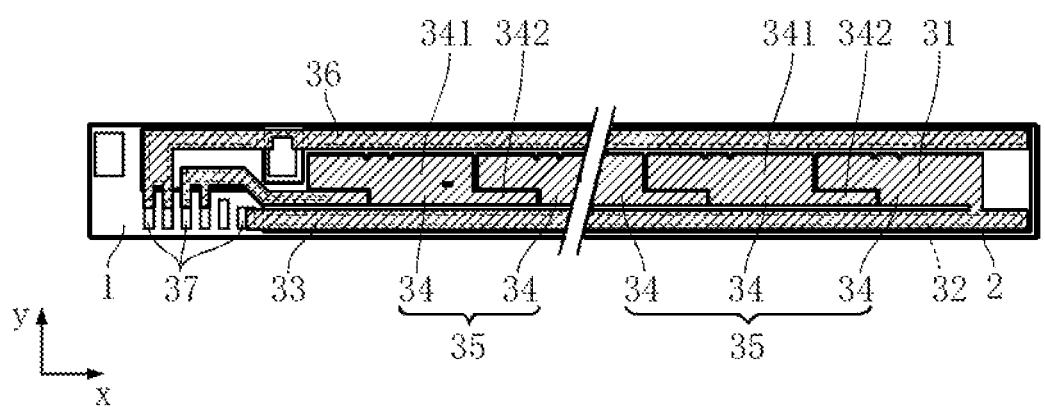
FIG. 28 is a schematic plan view showing the state after an Al layer is formed in the process of manufacturing the LED light source unit of FIG. 21.

The Al layer 31 constitutes the outermost layer of the metal film 3. FIG. 28 shows the state after the Al layer 31 is formed in the process of manufacturing the LED light source unit A6. The Al layer 31 is formed by e.g. sputtering. The Al layer 31 has a thickness of e.g. about 1.2 µm. The AgPt layer 32 partially intervenes between the Al layer 31 and the glass layer 2.

Figure 22:
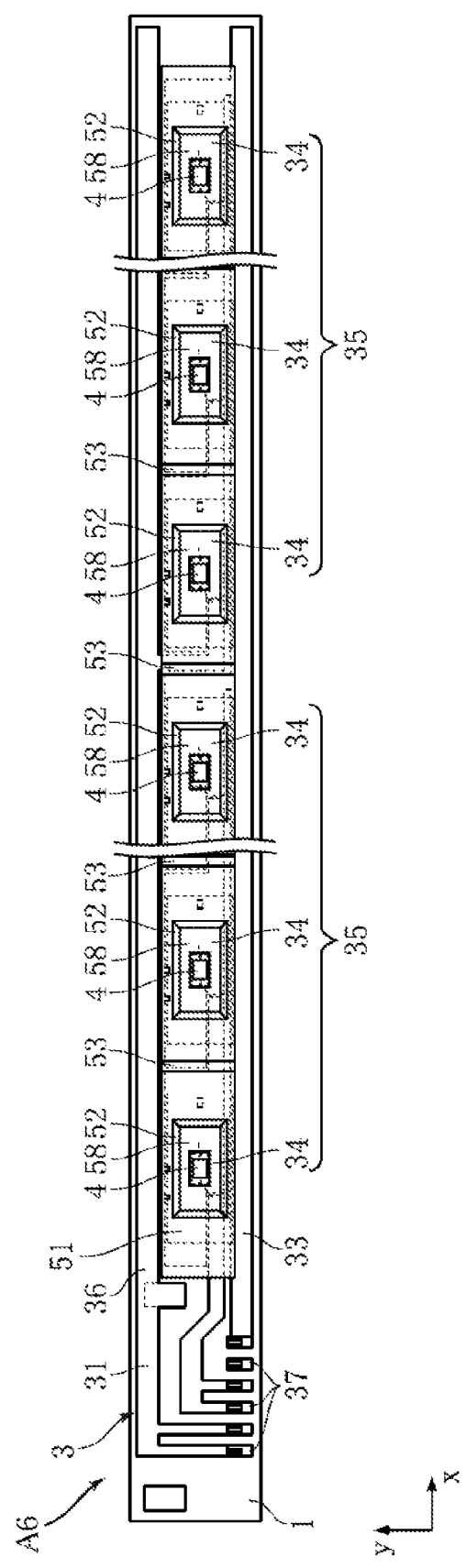
FIG. 22 is a schematic plan view showing the LED light source unit of FIG. 21.

As shown in FIGS. 22-25, the metal film 3 includes a common strip portion 33, a plurality of island groups 35, a connecting strip portion 36 and a plurality of connection terminal portions 37. As shown in FIG. 22, the common strip portion 33 is in the form of a strip elongated in direction x and extends substantially along the entire length of the substrate 1. The width of the common strip portion 33 is e.g. about 1 mm. The common strip portion 33 is positioned close to one of the edges of the substrate 1 that are spaced in direction y. As will be understood from FIGS. 25, 27 and 28, the common strip portion 33 of this embodiment comprises lamination of the Al layer 31 and the AgPt layer 32.

As shown in FIG. 22, the plurality of island groups 35 are aligned in direction x. In this embodiment, two island groups 35 are provided. Each island group 35 is made up of a plurality of island portions 34. The island portions 34 are aligned in direction x in parallel to the common strip portion 33. In this embodiment, each island group 35 includes twelve island portions 34. As will be understood from FIGS. 24, 25, 27 and 28, the island portions 34 of this embodiment have a single layer structure consisting of the Al layer 31 only.

Figure 23:
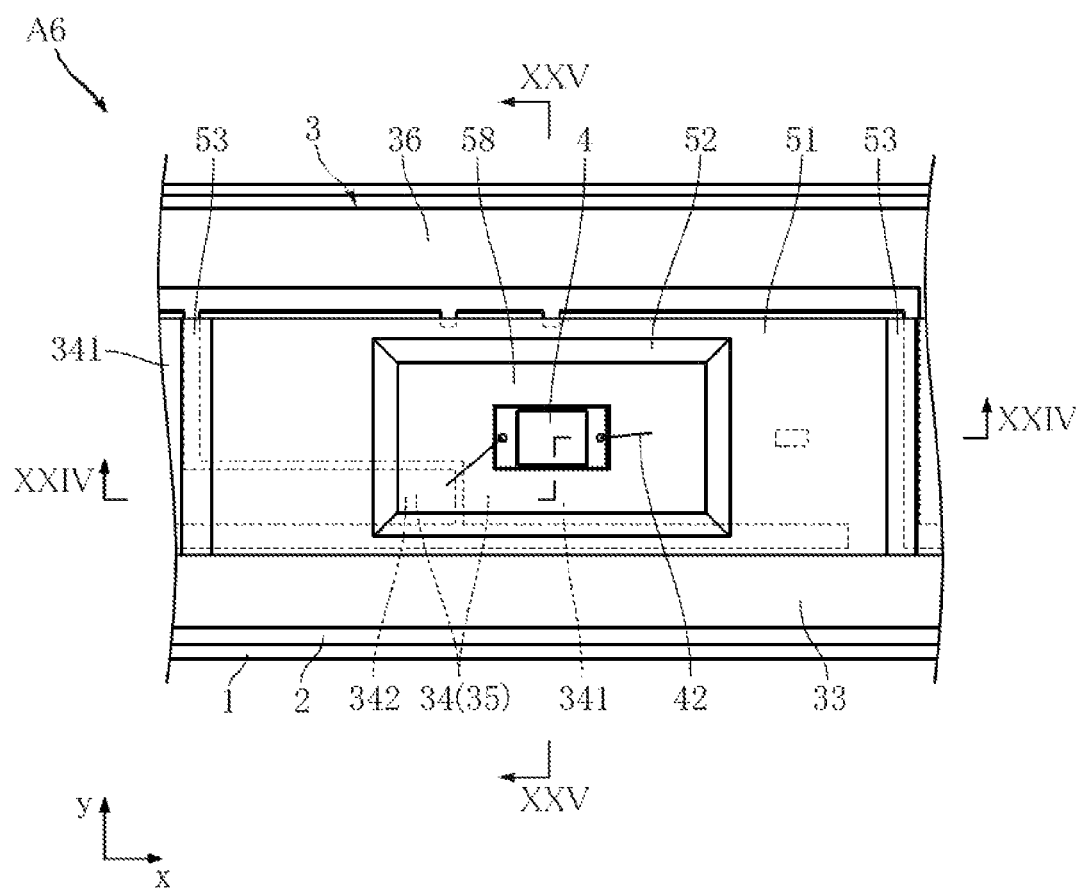
FIG. 23 is an enlarged schematic plan view showing the LED light source unit of FIG. 21.
Figure 24:
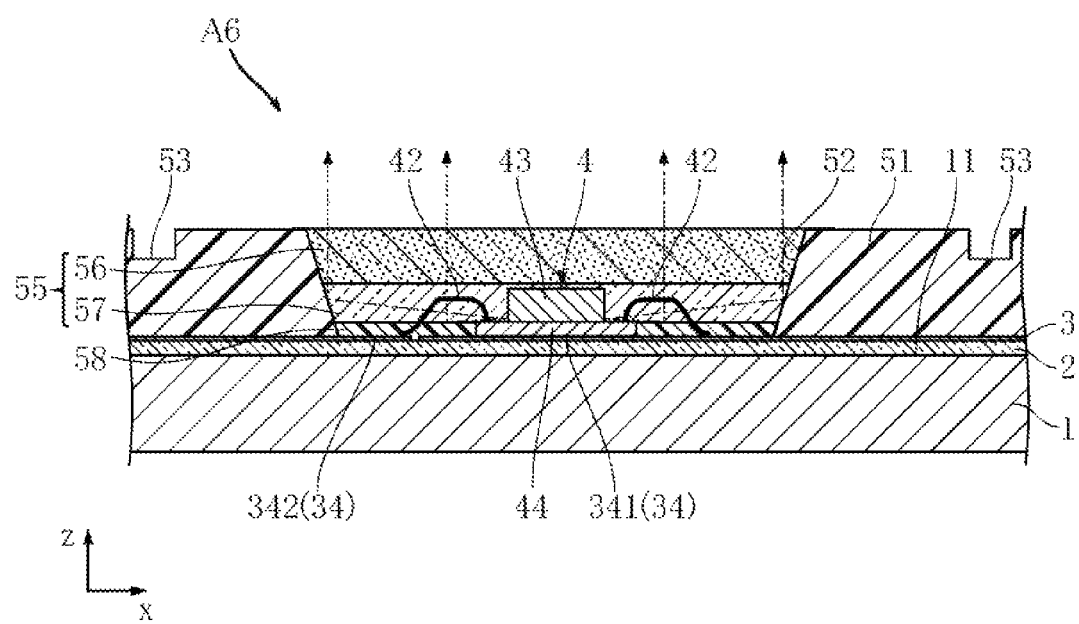
FIG. 24 is a schematic sectional view taken along lines XXIV-XXIV in FIG. 23.

As shown in FIGS. 23 and 24, each island portion 34 includes a main portion 341 and an extension 342. The main portion 341 is elongated in direction x and in the form of a rectangle partially cut away. In this embodiment, the main portion 341 has dimensions of about 9.0 mm in direction x and about 2.5 mm in direction y. An LED chip 4 is mounted on the main portion 341. The extension 342 is a portion elongated in direction x from the main portion 341 and is about 0.5 mm in width and about 3.0 mm in length in this embodiment. As shown in FIG. 23, the extension 342 of an island portion 34 is arranged to fit into the cut-away portion of the main portion 341 of the island portion 34 located directly on the right in direction x.

The connecting strip portion 36 is in the form of a strip elongated in direction x and extends substantially along the entire length of the substrate 1. The width of the connecting strip portion 36 is e.g. about 1 mm. The connecting strip portion 36 is positioned close to an edge of the substrate 1 that is opposite from the common strip portion 33 in direction y across the island groups 35. As will be understood from FIGS. 25, 27 and 28, the connecting strip portion 33 of this embodiment comprises lamination of the Al layer 31 and the AgPt layer 32.

As shown in FIG. 22, the connection terminal portions 37 are positioned close to one of the ends of the substrate 1 that are spaced in direction x and used for connection to the power supply or control unit (neither is shown) of the liquid crystal display B2, for example. As will be understood from FIGS. 27 and 28, the connection terminal portions 37 comprise the AgPt layer 32.

In FIG. 22, the connection terminal portion 37 positioned on the right side in direction x is connected to the common strip portion 33, whereas the connection terminal portion 37 positioned on the left side in direction x is connected to the connecting strip portion 36. The connection terminal portion 37 positioned at the center in direction x is connected to the leftmost one in direction x (closest to the connection terminal portions 37) of the island portions 34. The rightmost one, in direction x, of the island portions 34 included in each island group 35 (farthest from the connection terminal portions 37) is connected to the common strip portion 33.

Further, of the island portions 34 included in the island group 35 on the right side in direction x (farther side from the connection terminal portions 37), the leftmost one in direction x (closest from the connection terminal portions 37) is connected to the connecting strip portion 36.

Each LED chip 4 includes a submount substrate 44 made of e.g. Si, and a semiconductor layer 43 comprising the lamination of an n-type semiconductor layer made of e.g. GaN, an active layer and a p-type semiconductor layer, and emits e.g. blue light. The semiconductor layer 43 has electrode pads (not shown) on the submount substrate 44 side. These electrode pads are bonded to the wiring pattern (not shown) formed on the submount substrate 44. A Zener diode is incorporated in the submount substrate 44. The Zener diode serves to prevent excessive reverse voltage from being applied to the semiconductor layer 43.

As shown in FIG. 23, the LED chip 4 is mounted on the island portion 34. The LED chip 4 is provided with two electrodes, one of which is connected with a wire 42 to the main portion 341 of the island portion 34 to which the LED chip is mounted. The other one of the electrodes is connected with a wire 42 to the extension 342 of the adjacent island portion 34. The LED chip 4 in this embodiment has dimensions of about 1.9 mm in direction x and about 1.3 mm in direction y. Bonding the submount substrate 44 to the island portion 34 is expected to provide enhanced heat dissipation effect from the LED chip 4 to the metal film 3. For the promotion of the heat dissipation effect, it is preferable to perform bonding between the LED chip 4 and the island portion 34 by using e.g. Ag paste, an epoxy resin or an epoxy resin mixed with a filler made of a highly conductive material.

Because of the above-described structure of the metal film 3 and the mounting arrangement of the LED chips 4, the LED light source unit A9 of this embodiment includes a circuit in which two groups of LED chips 4, each consisting of twelve LED chips 4 connected in series with each other, are connected in parallel to each other.

Figure 25:
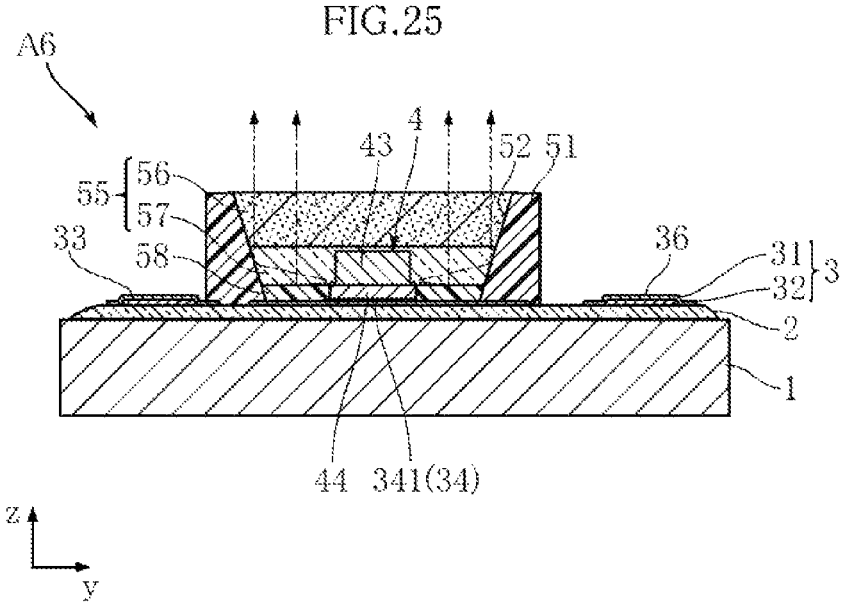
FIG. 25 is a sectional view taken along lines XXV-XXV in FIG. 23.

The reflector 51 is provided for causing a larger amount of light from the LED chip 4 to travel in direction z and made of a white resin such as liquid crystal polymer or polybutylene terephthalate. The reflector 51 is elongated in direction x and includes a plurality of openings 52 and a plurality of recesses 53. Each of the openings 52 is rectangular as viewed in direction z. As shown in FIGS. 24 and 25, the inner surface of each opening 52 surrounds a respective one of the LED chips 4 and is inclined to become farther from the LED chip 4 as proceeding away from the substrate 1 in a normal direction of the principal surface 11 of the substrate 1. As shown in FIGS. 22-24, each of the recesses 53 is provided between adjacent openings 52. Each recess 53 is a groove recessed from the upper surface of the reflector 51 and rectangular in cross section. Of the reflector 51, the portion where the recess 53 is formed is smaller than other portions in cross section within a y-z plane and corresponds to the smaller-cross-sectional portion of the present invention. In this embodiment, the dimension of the reflector 51 in direction y is about 2.0 to 4.0 mm.

Figure 29:
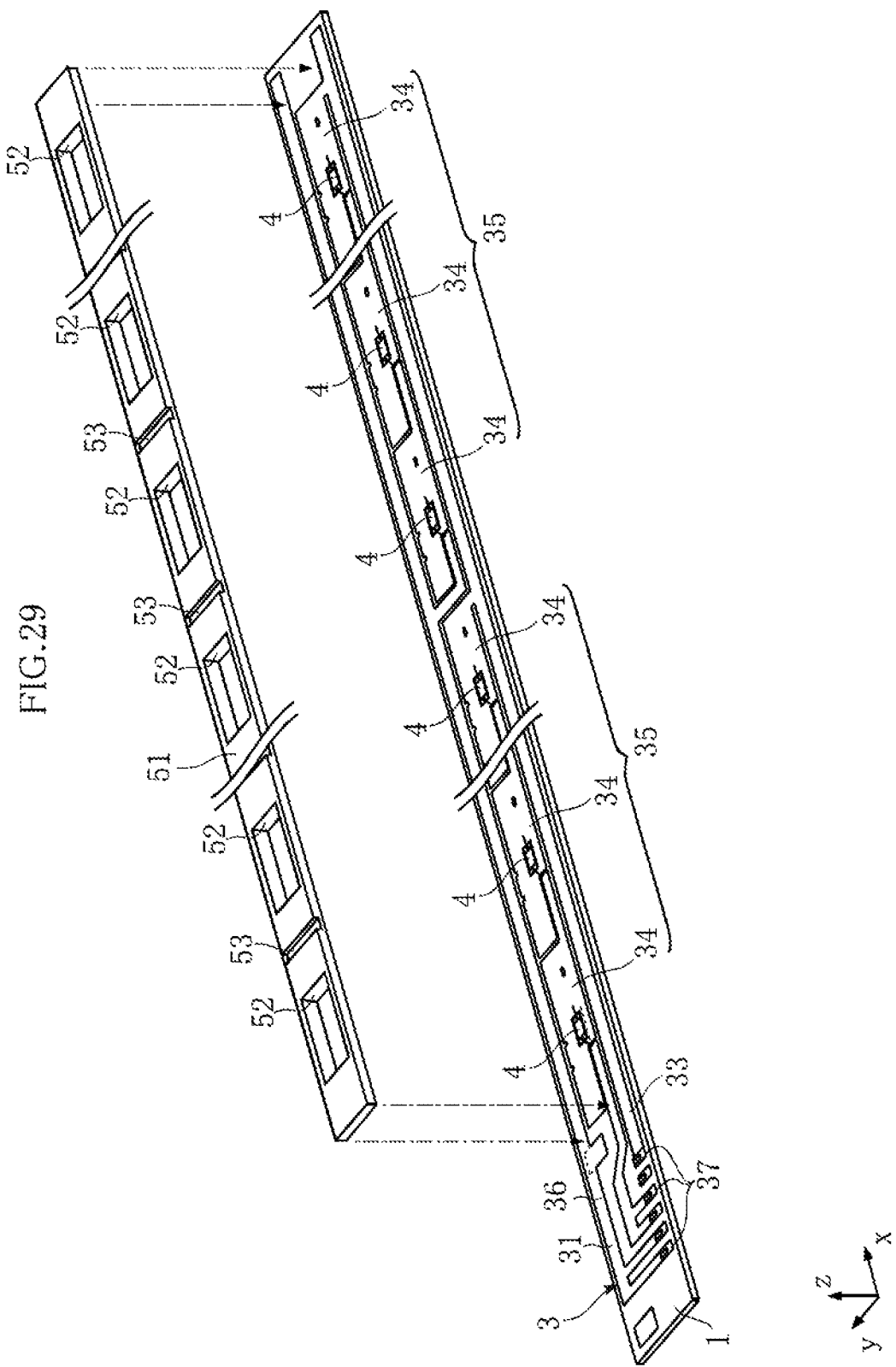
FIG. 29 is a schematic perspective view showing the step of attaching a reflector to a substrate in the process of manufacturing the LED light source unit of FIG. 21.

In the process of manufacturing the LED light source unit A6, as shown in FIG. 29, the reflector 51 is bonded to the substrate 1 after the mounting of the LED chips 4 is completed. In this embodiment, the reflector 51 has dimensions of about 3.0 mm in direction y and about 1 mm in direction z. The openings 52 have dimensions of about 3.9 mm in direction x and about 1.9 mm in direction y. The recesses 53 have dimensions of about 0.5 to 4.0 mm in direction x and about 0.2 to 0.8 mm in depth in direction z.

The white resin 58 is an example of opaque resin of the present invention and made of e.g. a material, such as white epoxy resin, that does not allow the light from the LED chips 4 to pass through and has a reflectivity higher than that of the submount substrate 44. As shown in FIGS. 23-25, the white resin 58 covers the area surrounded by the opening 52 of the reflector 51, except the LED chip 4. The white resin 58 also covers the entire side surface of the submount substrate 44. However, unlike this embodiment, only part of the side surface of the submount substrate 44 may be covered with the white resin 58.

As shown in FIGS. 24 and 25, the light-transmitting resin 55 fills the opening 52 and covers the LED chip 4. The light-transmitting resin 55 is made up of a transparent portion 57 and a fluorescent portion 56. The transparent portion 57 is laminated on the white resin 58, and covers the semiconductor layer 43 in this embodiment. The transparent portion 57 is made of a transparent epoxy resin or silicone resin. The fluorescent portion 56 is laminated on the transparent portion 57 and made of a material obtained by mixing a fluorescent material into a transparent epoxy resin. The fluorescent material may emit yellow light upon excitation by blue light from the LED chip 4. The blue light from the LED chip 4 and the yellow light from the fluorescent material mix together, causing white light to be emitted from the LED light source unit A6. Instead of the above-described fluorescent material, use may be made of a mixture of a fluorescent material that emits red light upon excitation by blue light and a fluorescent material that emits green light upon excitation by blue light.

FIGS. 30 and 31 show an example of liquid crystal display using the LED light source unit A6. The liquid crystal display B2 illustrated in the figures includes the LED light source unit A6, the light guide plate 6 and a liquid crystal panel 7.

The light guide plate 6 provides the backlight, together with the LED light source unit A6, and is made of e.g. transparent polycarbonate resin or acrylic resin. The light guide plate 6 is a plate spreading in a z-x plane. The light guide plate 6 includes a light incident surface 61, a reflective surface 62 and a light emission surface 63. The light incident surface 61 is a smooth surface perpendicular to direction z and faces the LED light source unit A6. The reflective surface 62 is perpendicular to direction y and is formed with a plurality of grooves 621. The light emission surface 63 is a smooth surface perpendicular to direction y and positioned on the opposite side from the reflective surface 62.

As shown in FIG. 31, light emitted from the LED light source unit A6 enters through the light incident surface 61 and travels within the light guide plate 6. The traveling light is reflected or diffused at the grooves 621 of the reflective surface 62 to travel in direction y. The light traveling from the reflective surface 62 is emitted to the outside through the light emission surface 63. In this way, when the LED light source unit A6 emits light, white light is emitted from the entire light emission surface 63 of the light guide plate 6.

The liquid crystal panel 7 selectively allows the light emitted from the light guide plate 6 to pass through, thereby forming an image for display on the liquid crystal display B2. The liquid crystal panel 7 comprises e.g. two transparent substrates facing each other and a liquid crystal layer sandwiched between the transparent substrates and is designed to change the light transmission state for each pixel by e.g. the active matrix method.

The advantages of the LED light source unit A6 and the liquid crystal display B2 are described below.

Since each LED chip 4 is surrounded by the opening 52 of the reflector 51, the light traveling from the LED chip 4 toward the sides is reflected by the opening 52. Since the inner surface of the opening 52 is inclined such that the opening becomes wider at an upper portion as shown in FIGS. 24 and 25, the light reflected is easily emitted to the outside of the LED light source unit A6. Thus, the LED light source unit A6 has enhanced brightness.

As shown in FIG. 29, the reflector 51 is formed after the mounting of the LED chips 4 are completed. Thus, the reflector 51 is not exposed to high temperature in a reflow furnace used for mounting the LED chips 4. Thus, liquid crystal polymer or polybutylene terephthalate can be used as the white resin. Liquid crystal polymer or polybutylene terephthalate is suitable for enhancing the reflectivity at the surface of the reflector 51. This helps enhancement of the brightness of the LED light source unit A6.

As shown in FIG. 29, the reflector 51 is usually handled by itself before it is attached to the substrate 1. Depending on the way of holding the reflector 51, an excessive moment may act on the reflector 51. The smaller-cross-sectional portions where the recesses 53 are formed elastically deform more easily than other portions. Thus, when a moment acts on the reflector 51, the smaller-cross-sectional portions readily deform, preventing formation of cracks in the reflector 51.

The recesses 53 are provided at a surface of the reflector 51 that is opposite from the substrate 1. Thus, the provision of the smaller-cross-sectional portions does not reduce the area of the reflector 51 to be bonded to the substrate 1. Thus, while the reflector 51 is protected from damage, reduction in the bonding strength between the reflector 51 and the substrate 1 is avoided.

According to this embodiment, the white resin 58 covers the side surface of the submount substrate 44 of the LED chip 4. Si, which is the material of the submount substrate 44, absorbs light well. The white resin 58 prevents light from the semiconductor layer 43 from being absorbed by the side surface of the submount substrate 44. This promotes enhancement of the brightness of the LED light source unit A6.

The white resin 58 covers the entire area surrounded by the opening 52, except the LED chip 4. This prevents the light from the semiconductor layer 43 from being absorbed by the substrate 1 or the like. This helps enhancement of the brightness of the LED light source unit A6.

The LED chip 4 includes the Zener diode incorporated in the submount substrate 44. Application of excessive reverse voltage to the semiconductor layer 43 is prevented by the Zener diode. The provision of the Zener diode does not hinder enhancement of the brightness of the LED light source unit A6.

By the provision of the transparent portion 57 in the light-transmitting resin 55, the amount of the fluorescent material to be contained in the light-transmitting resin 55 is reduced. This helps reduction in cost for the LED light source unit A6.

Enhancing the brightness of the LED light source unit A6 allows the liquid crystal display B2 to display brighter and clearer images.

FIGS. 32-49 illustrate other embodiments of the present invention. In these figures, the elements that are identical or similar to those of the foregoing embodiments are designated by the same reference signs as those used for the foregoing embodiment.

FIG. 32 shows a variation of the recesses 53 of the LED light source unit A6. That is, the LED light source unit A6 of this variation differs from the above-described LED light source unit A6 in structure of the recesses 53. In this variation, the recesses 53 are recessed from the side surfaces of the reflectors 51 oriented in direction y. Specifically, a pair of recesses 53 are provided between two adjacent openings 52. Each of the paired recesses 53 is provided on a respective one of the sides of the reflector 51 that are spaced in direction y. With this variation again, formation of cracks or the like in the reflector 51 is prevented, while brightness of the LED light source unit A6 is enhanced.

Figure 33:
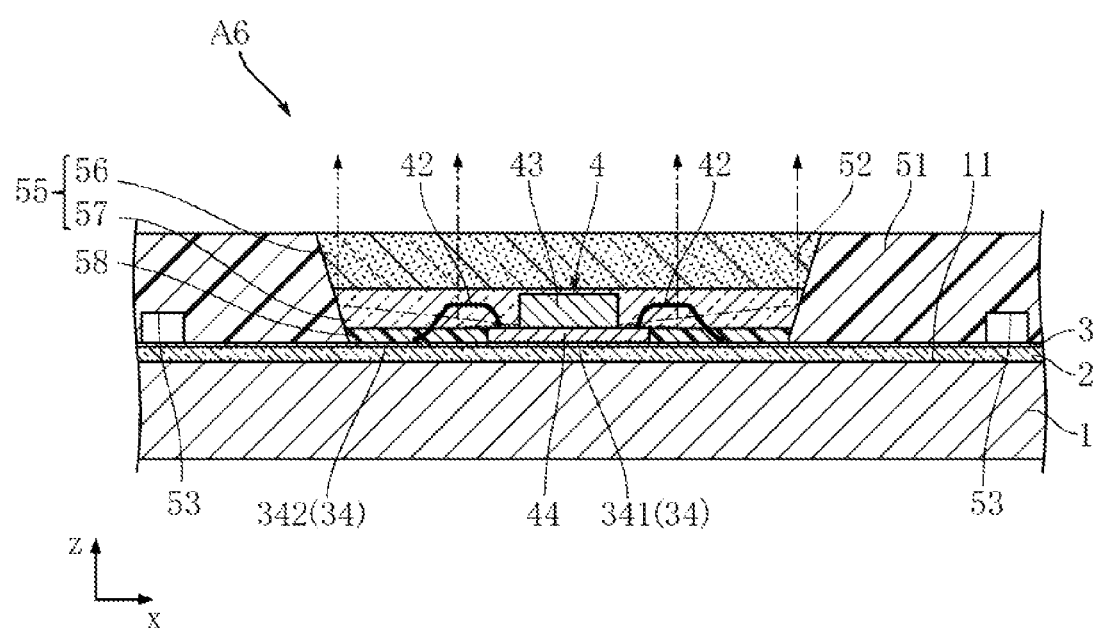
FIG. 33 is a schematic sectional view showing a variation of the LED light source unit according to the sixth embodiment of the present invention.

FIG. 33 shows another variation of the recesses 53 of the LED light source unit A6. That is, the LED light source unit A6 of this variation differs from the above-described LED light source unit A6 in structure of the recesses 53. In this variation, the recesses 53 are recessed from the surface of the reflector 51 that is bonded to the substrate 1. Each of the recesses is provided between two adjacent openings 52. With this variation again, formation of cracks or the like in the reflector 51 is prevented, while brightness of the LED light source unit A6 is enhanced.

Figure 34:
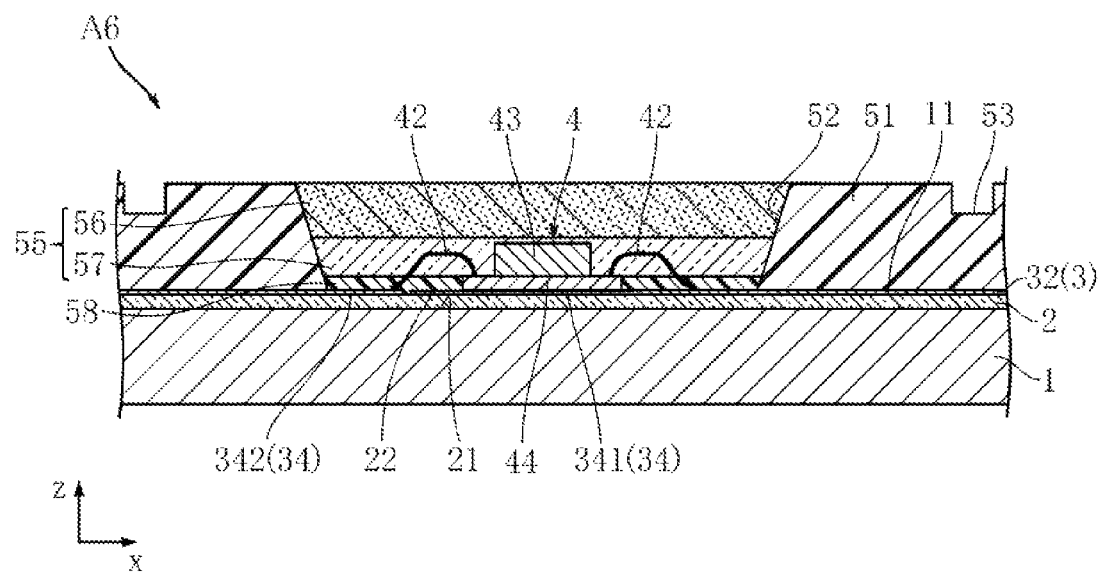
FIG. 34 is a schematic sectional view showing a variation of the LED light source unit according to the sixth embodiment of the present invention.
Figure 35:
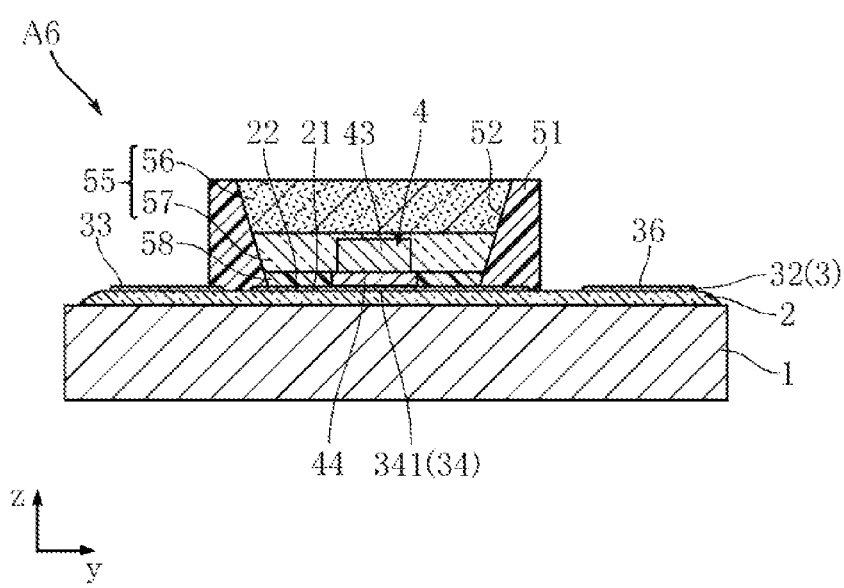
FIG. 35 is a sectional view within a y-z plane of a variation of FIG. 34.

FIGS. 34 and 35 show a variation of the metal film 3 of the LED light source unit A6. In this variation, the metal film 3 consists of an AgPt layer 32 only. According to this variation, in manufacturing the LED light source unit A6, the step of forming the Al layer 31 is omitted. This leads to cost reduction of the LED light source unit A6.

Figure 36:
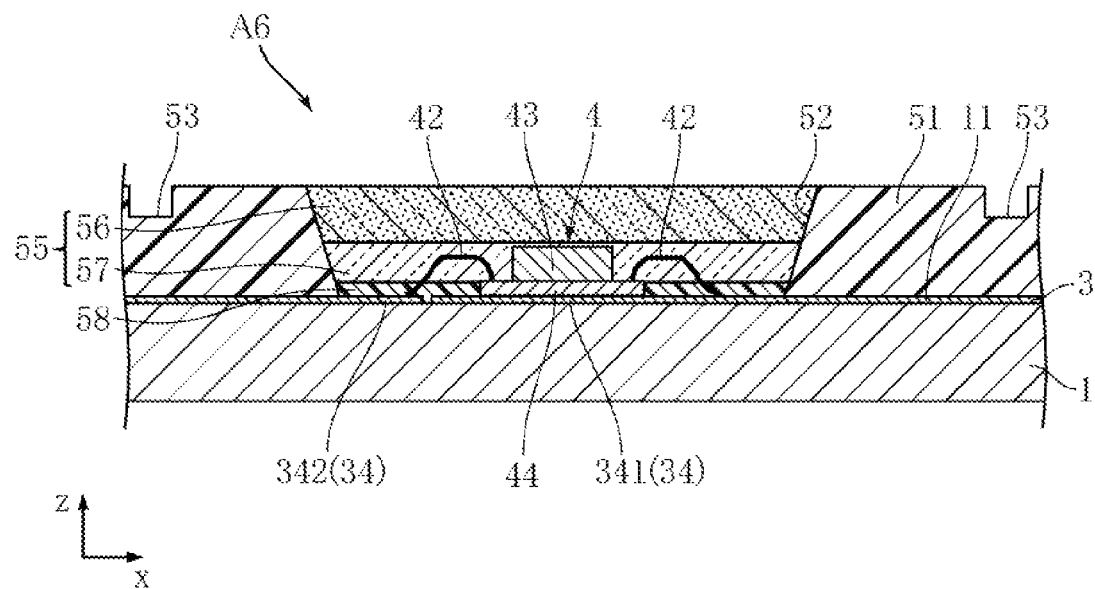
FIG. 36 is a schematic sectional view showing a variation of the LED light source unit according to the sixth embodiment of the present invention.
Figure 37:
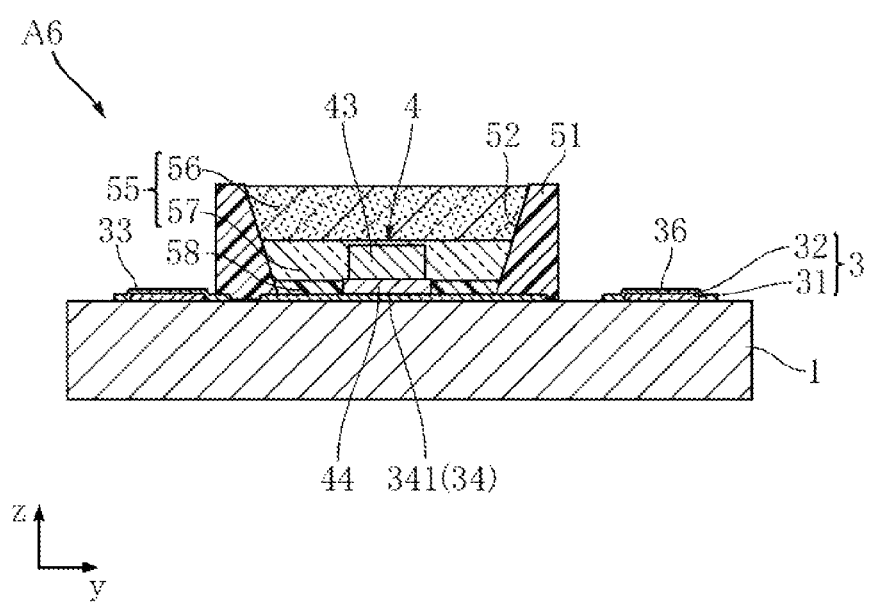
FIG. 37 is a sectional view within a y-z plane of a variation of FIG. 36.

FIGS. 36 and 37 show another variation of the LED light source unit A6. This variation differs from the above-described LED light source unit A6 in that the glass layer 2 is not provided. According to this variation, the step of forming the glass layer 2 is omitted, which helps cost reduction of the LED light source unit A6. Further, heat dissipation from the LED chips 4 is promoted.

Figure 38:
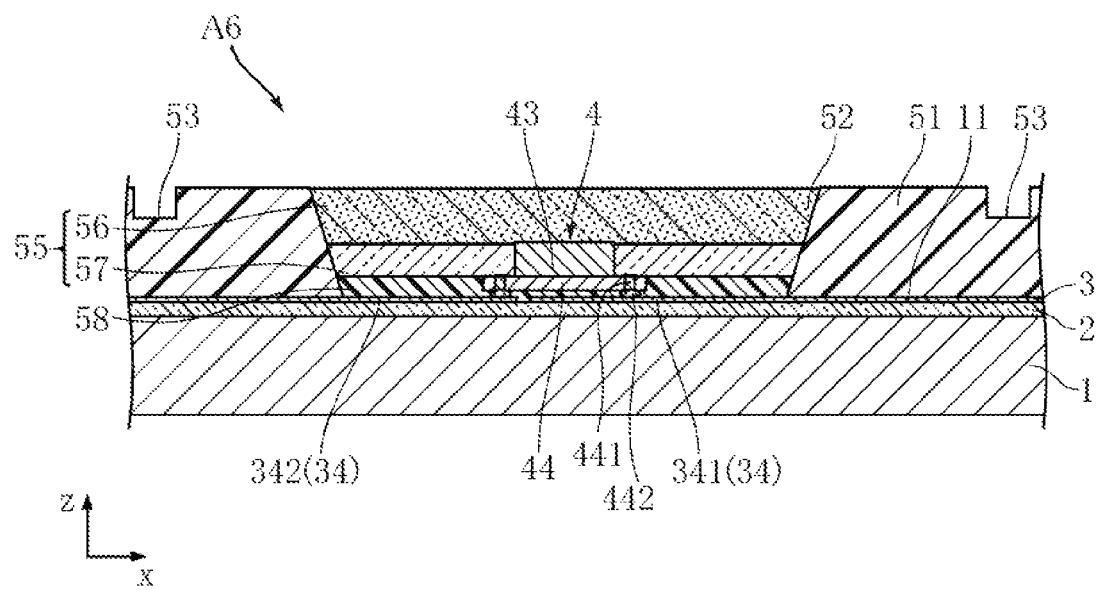
FIG. 38 is a schematic sectional view showing a variation of the LED light source unit according to the sixth embodiment of the present invention.

FIG. 38 shows a variation of the LED chips 4 of the LED light source unit A6. The LED chips 4 of this variation are of the type that can be mounted without using a wire 42. Specifically, the submount substrate 44 is provided with two through-hole electrodes 441. These through-holes electrodes 441 are electrically connected to the n-type semiconductor layer and the p-type semiconductor layer of the semiconductor layer 43, respectively, via the wiring pattern formed on the submount substrate 44. Mounting bumps 442 are formed on the lower surface of the through-hole electrodes 441. The LED chip 4 is bonded to the metal film 3 with the bumps 442.

Figure 39:
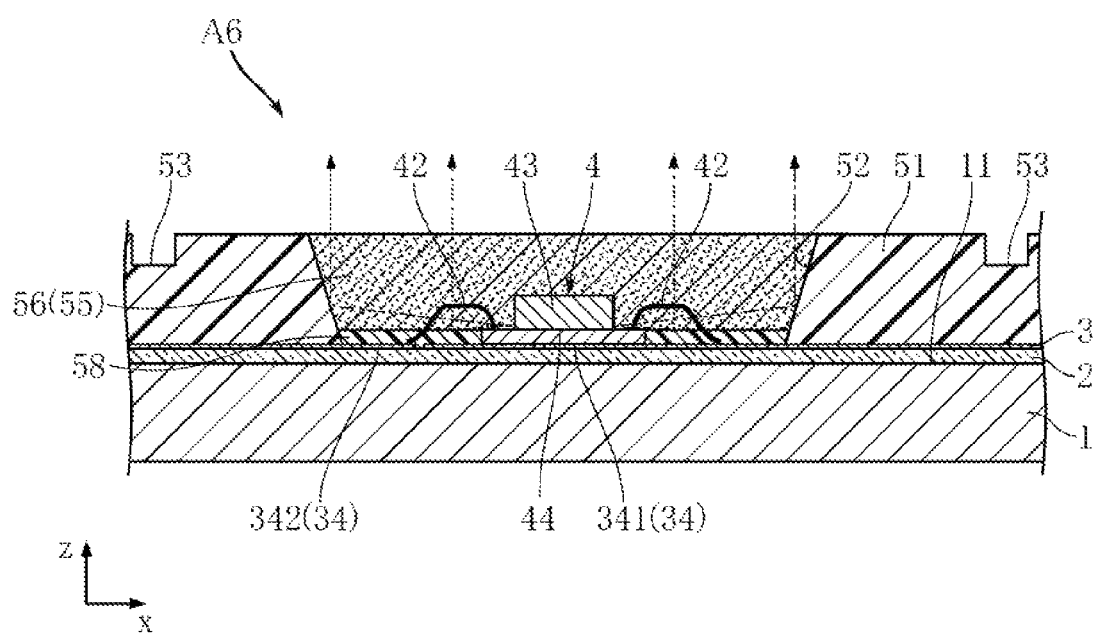
FIG. 39 is a schematic sectional view showing a variation of the LED light source unit according to the sixth embodiment of the present invention.

FIG. 39 shows a variation of the light-transmitting resin 55 of the LED light source unit A6. In this variation, the light-transmitting resin 55 consists of a fluorescent portion 56 only. With this variation again, brightness of the LED light source unit A6 is enhanced.

Figure 40:
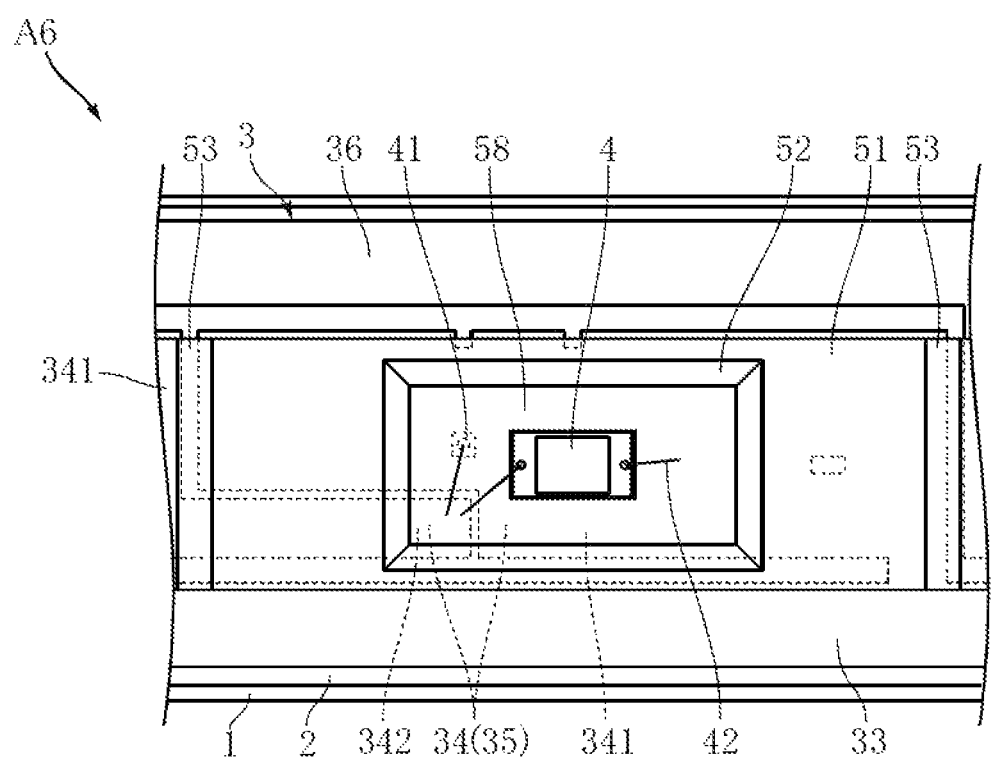
FIG. 40 is an enlarged schematic plan view showing a variation of the LED light source unit according to the sixth embodiment of the present invention.

FIG. 40 shows another variation of the LED light source unit A6. In this variation, a Zener diode 41 separate from the LED chip 4 is provided. The Zener diode 41 is mounted on the main portion 341 of the island portion 34, together with the LED chip 4. The Zener diode 41 prevents excessive reverse voltage from being applied to the semiconductor layer 43 of the LED chip 4. The Zener diode 41 is covered with the white resin 58. Thus, light from the LED chip 4 is prevented from being absorbed by the Zener diode 41.

Figure 41:
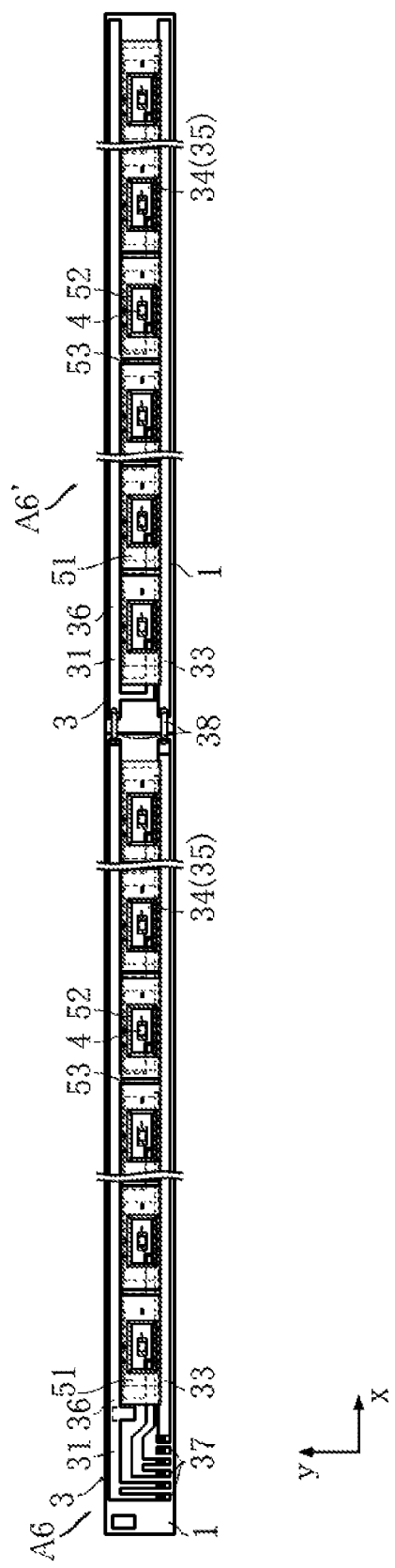
FIG. 41 is a schematic plan view showing an example of usage of the LED light source unit according to the sixth embodiment of the present invention.

FIG. 41 illustrates the structure obtained by combining the LED light source unit according to the sixth embodiment of the present invention and a variation of the LED light source unit. The LED light source unit A6' illustrated in the figure is different from the LED light source unit A6 in that it does not include connection terminal portions 37. The common strip portion 33 of the LED light source unit A6 and that of the LED light source unit A6' are connected to each other with a wire 38, so are the connecting strip portion 36 of the LED light source unit A6 and that of the LED light source unit A6'. With this arrangement, an LED light source unit for a backlight of a larger liquid crystal display can be obtained.

Figure 42:
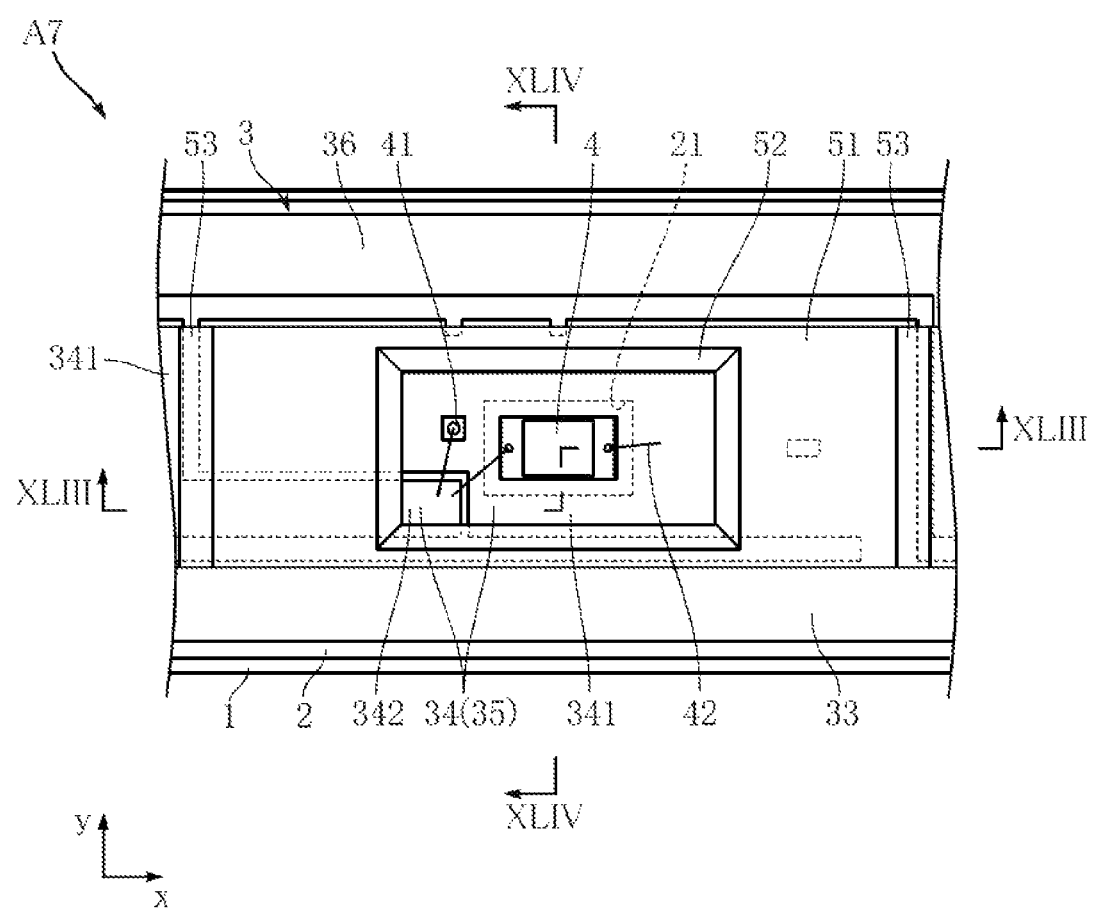
FIG. 42 is an enlarged schematic plan view showing an LED light source unit according to a seventh embodiment of the present invention.
Figure 43:
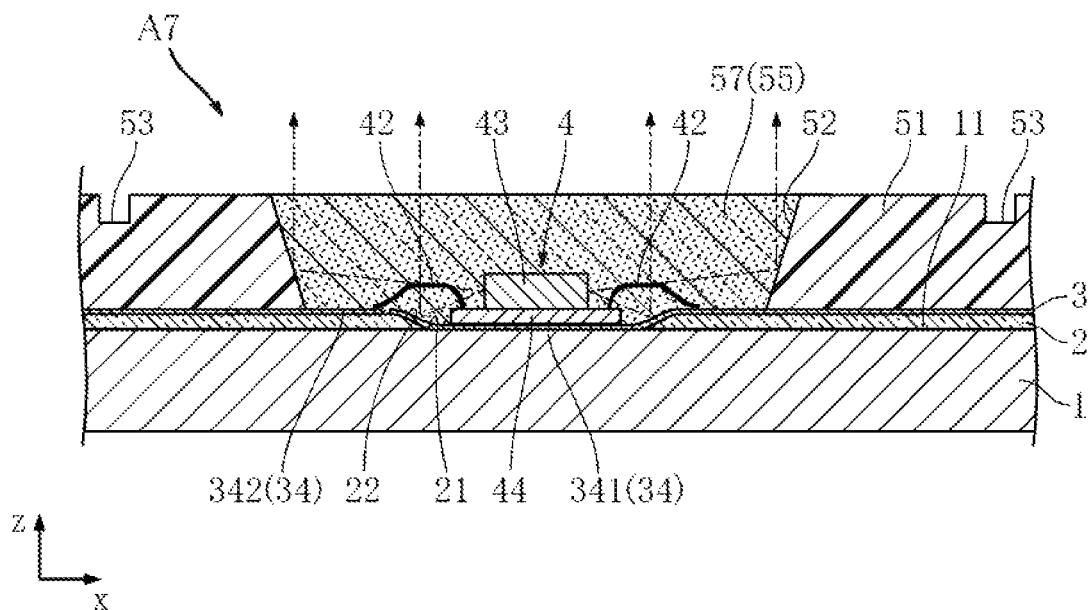
FIG. 43 is a schematic sectional view taken along lines XLIII-XLIII in FIG. 42.
Figure 44:
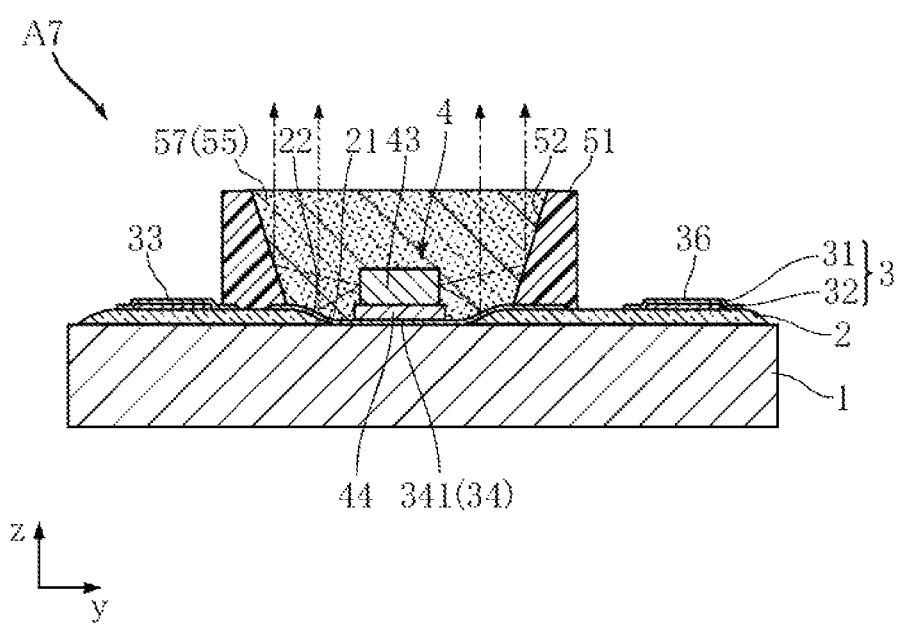
FIG. 44 is a sectional view taken along lines XLIV-XLIV in FIG. 42.

FIGS. 42-44 show an LED light source unit A7 according to a seventh embodiment of the present invention. The LED light source unit A7 of this embodiment differs from the LED light source unit A6 in that it does not include a white resin 58 and in structures of the glass layer 2 and the metal film 3.

The glass layer 2 includes a plurality of window portions 21. The window portions 21 are rectangular and arranged at generally equal intervals in direction x. Each of the window portions 21 has dimensions of about 1.8 mm in direction x and about 1.2 mm in direction y. As shown in FIGS. 43 and 44, the glass layer 2 includes inclined surfaces 22. Each of the inclined surfaces 22 is connected to the outer edge of a respective one of the window portions 21 and inclined to be higher in direction z in the figures as proceeding away from the window portion 21 in direction x or direction y. In this embodiment, the inclined surface 22 is in the form of a rectangular frame as viewed in direction z.

The main portion 341 covers the window portion 21 and the inclined surface 22 of the glass layer 2. An LED chip 4 is mounted on the main portion 341 at a portion that covers the window portion 21, whereas a Zener diode 41 is mounted on the main portion 341 at a portion that covers a portion of the glass layer 2 that adjoins the window portion 21. The island portion 34 has a single layer structure consisting of an Al layer 31 only.

The LED chip 4 is mounted on the main portion 341 of the island portion 34 at a portion that covers the window portion 21. Thus, as viewed in direction z, the LED chip 4 is within the window portion 21 and surrounded by the frame-shaped inclined surface 22.

Figure 45:
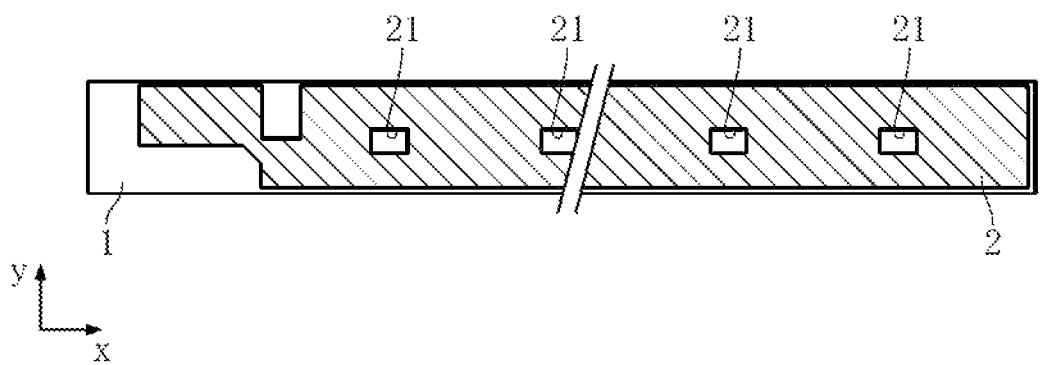
FIG. 45 is a schematic plan view showing the state after a glass layer is formed in the process of manufacturing the LED light source unit of FIG. 42.
Figure 46:
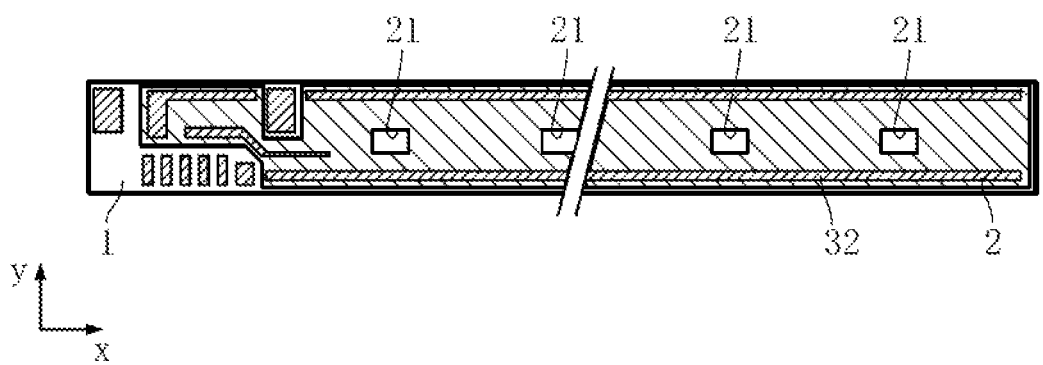
FIG. 46 is a schematic plan view showing the state after an AgPt layer is formed in the process of manufacturing the LED light source unit of FIG. 42.
Figure 47:
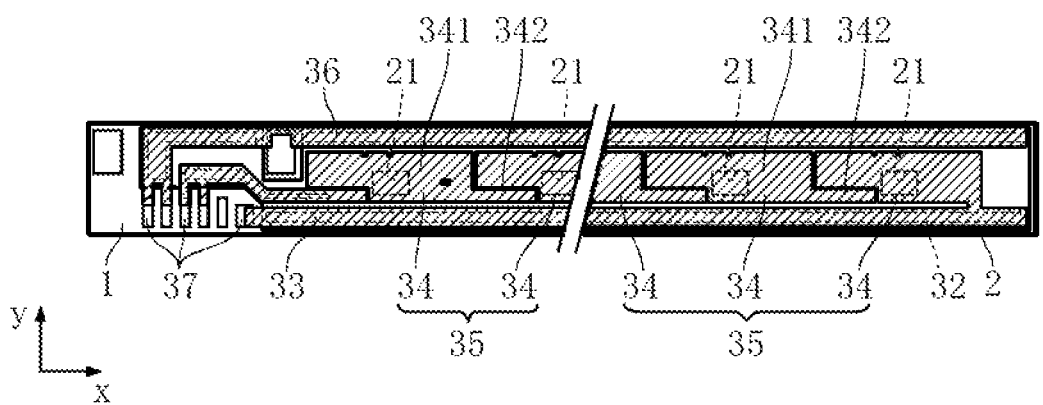
FIG. 47 is a schematic plan view showing the state after an Al layer is formed in the process of manufacturing the LED light source unit of FIG. 42.

To manufacture the LED light source unit A7, a glass layer 2 including a plurality of window portions 21 is formed on the substrate 1, as shown in FIG. 45. Then, an AgPt layer 32 is formed as shown in FIG. 46. Then, an Al layer 31 is formed to cover the window portions 21 as shown in FIG. 47.

According to this embodiment, the light emitted from the LED chip 4 and traveling toward the metal film 3 is reflected at the metal film 3. Thus, a large amount of light is emitted from the LED light source unit A7, so that the brightness is enhanced. In particular, since the outermost layer of the metal film 3 is the Al layer 31, only a small proportion of light is absorbed, which contributes to enhancement of brightness of the LED light source unit A7. In this embodiment, most part of the principal surface 11 of the substrate 1 is covered with the metal film 3, except the portion formed with a slit for separating the common strip portion 33, the island portions 34, and the connecting strip portion 36. This suppresses unfavorable absorption of light emitted from the LED chip 4.

Since the metal film 3 is formed on the glass layer 2, the surface of the metal film 3 is smooth as a mirror surface. This allows a large proportion of light from the LED chip 4 to be reflected. The Al layer 31 formed by sputtering has a high density, which is suitable for realizing the mirror surface condition.

Of the metal film 3 (the main portion 341), the portion covering the inclined surface 22 constitutes a reflective region in the form of a frame surrounding the LED chip 4. This arrangement also allows a large proportion of light from the LED chip 4 to be emitted to the outside. The inclined surface 22 of the glass layer 2 can be formed properly by a technique using printing and baking. The provision of the reflector 51 also prevents the light from the LED chip 4 from being absorbed.

When viewed in direction z, the LED chip 4 is within the window portion 21. Thus, only the metal film 3 intervenes between the LED chip 4 and the substrate 1, and the glass layer does not intervene. This arrangement promotes heat dissipation from the LED chip 4.

The structure of the metal film 3 including the common strip portion 33, the island portions 34 and the connecting strip portion 36 achieves proper connection of the LED chips 4.

Since each of the common strip portion 33 and the connecting strip portion 36 has a lamination structure made up of the Al layer 31 and the AgPt layer 32, resistance is reduced. Since the common strip portion 33 and the connecting strip portion 36 are relatively narrow and long, voltage tends to drop at these portions. The above-described lamination structure suppresses the voltage drop at the common strip portion 33 and the connecting strip portion 36.

The structure of the metal film 3 is not limited to the structure of this embodiment. For instance, the structures shown in FIGS. 34-37 may be employed.

Figure 48:
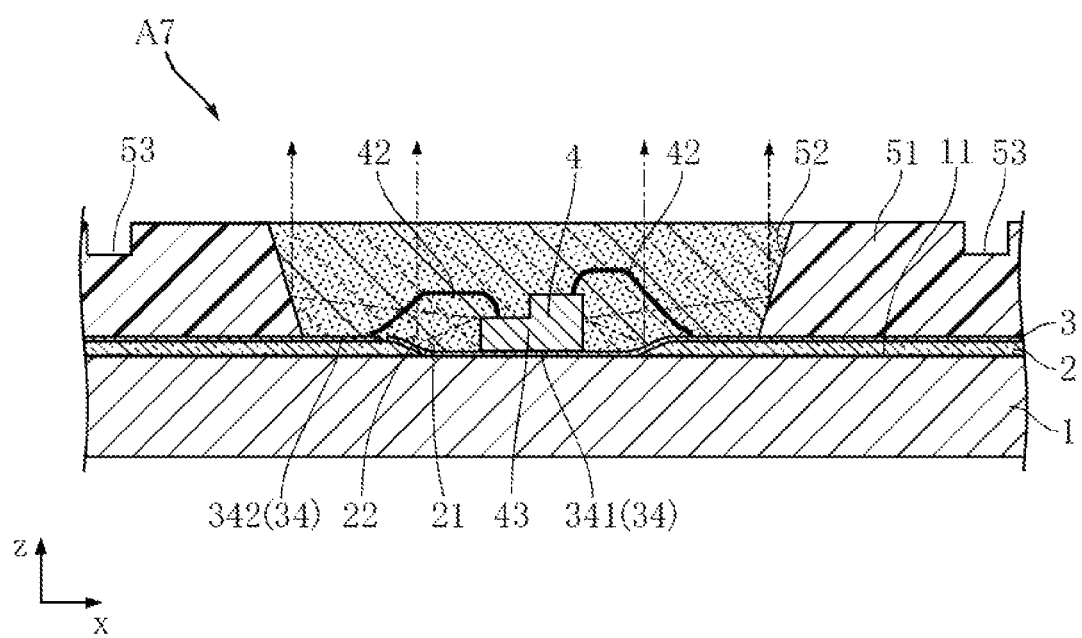
FIG. 48 is a schematic sectional view showing a variation of the LED light source unit according to the seventh embodiment of the present invention.

FIG. 48 shows a variation of the LED chip 4 of the LED light source unit A7. The LED chip 4 of this variation has a so-called two-wire structure. Specifically, the LED chip comprises a semiconductor layer 43 comprising an n-type semiconductor layer, an active layer and a p-type semiconductor layer laminated in the mentioned order from the bottom. Two electrode pads (not shown) electrically connected to the n-type semiconductor layer and the p-type semiconductor layer are provided on the upper surface in the figure. Wires 42 are bonded to the electrode pads.

Figure 49:
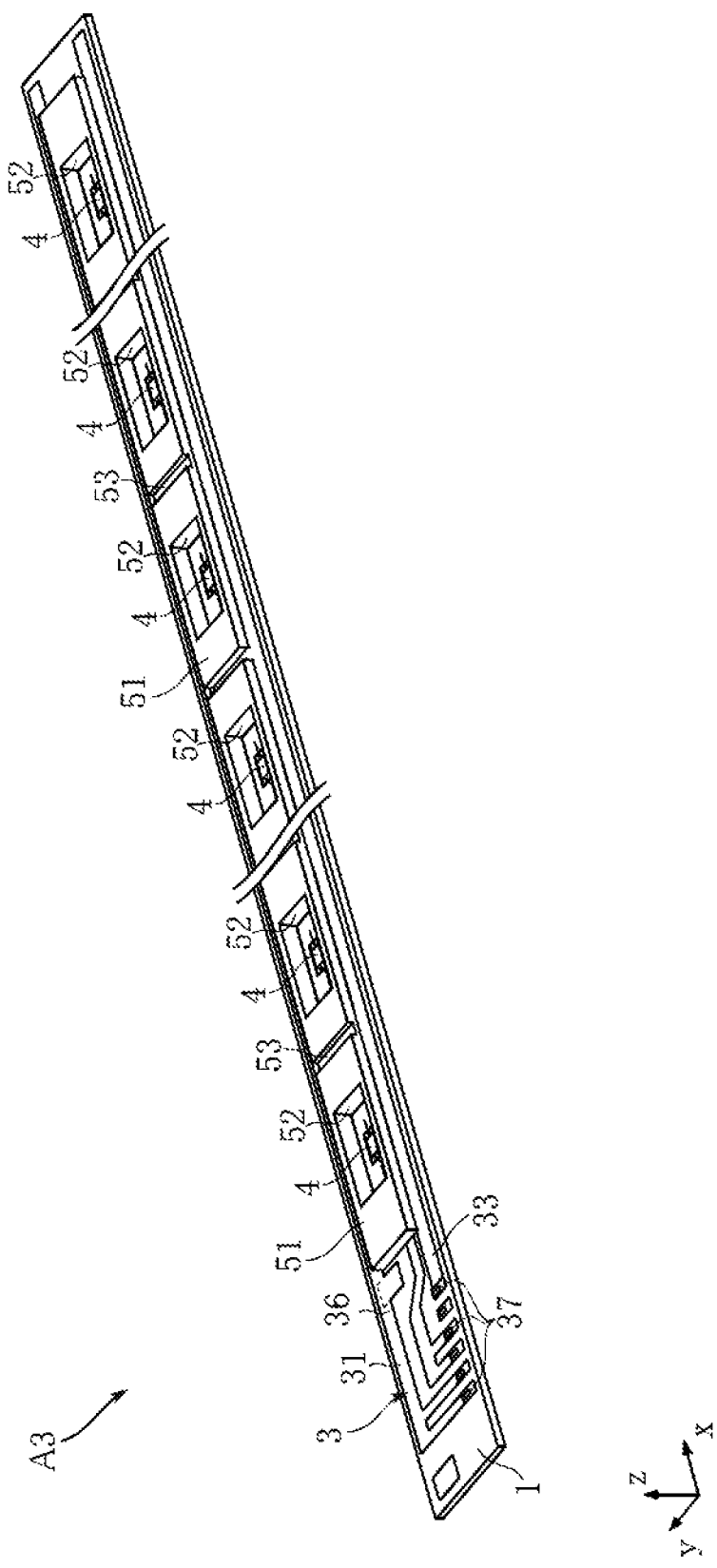
FIG. 49 is a schematic perspective view showing an LED light source unit according to an eighth embodiment of the present invention.
Figure 50:
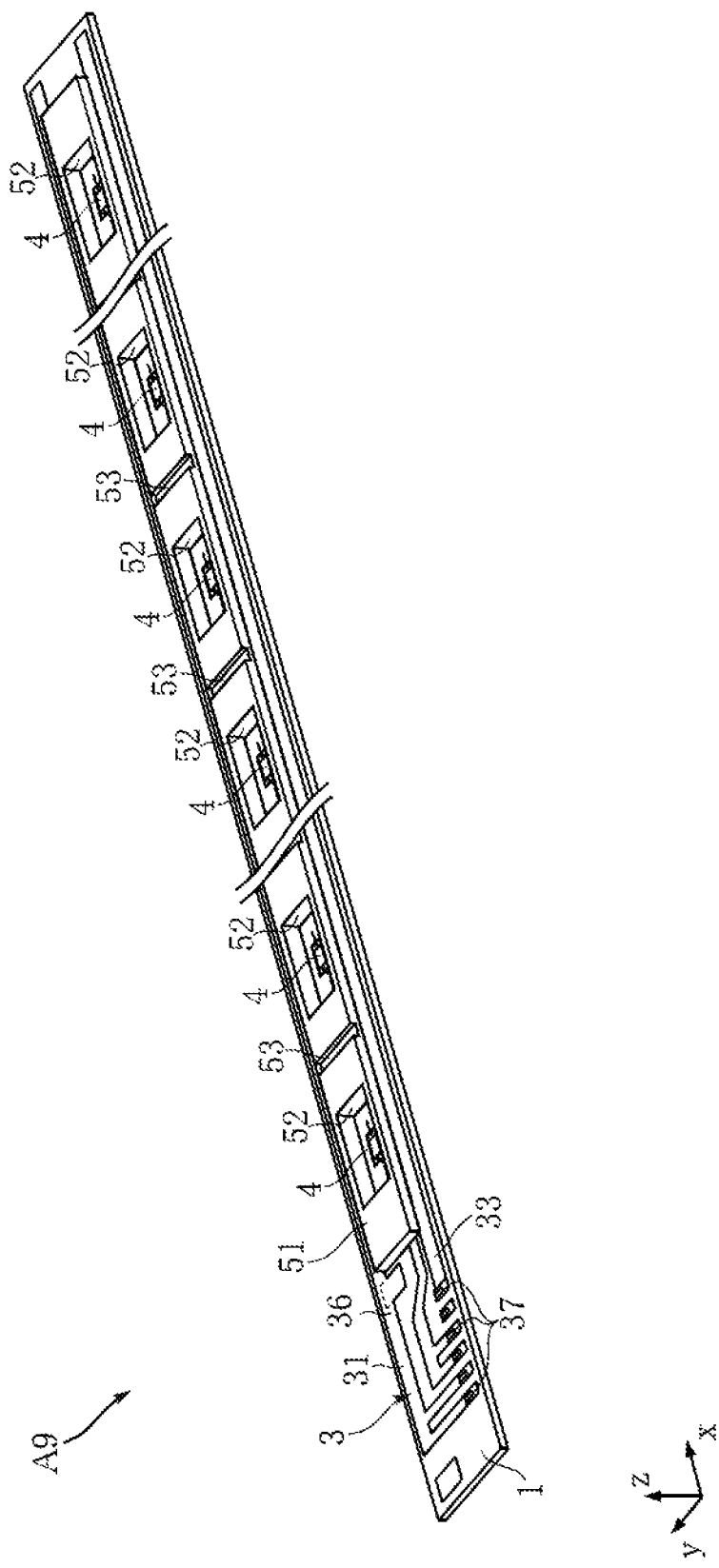
FIG. 50 is a schematic perspective view showing an LED light source unit according to a ninth embodiment of the present invention.

FIG. 49 shows an LED light source unit according to an eighth embodiment of the present invention. The LED light source unit A8 of this embodiment differs from the LED light source unit A6 in that two reflectors 51 are attached to a single substrate 1. In this embodiment, the length in direction x of each reflector 51 is slightly smaller than one half the length of the substrate 1. The two reflectors 51 are arranged in series in direction x. Similarly to the LED light source unit A6, openings 52 formed in each reflector surround the LED chips 4, respectively.

According to this embodiment again, brightness of the LED light source unit A6 is enhanced. By preparing reflectors 51 that are shorter than the substrate 1 in direction x, the number of the reflectors 51 to be attached to a single substrate 1 can be adjusted depending on the length of the substrate 1. Thus, reflectors 51 can be used commonly for substrates 1 of different lengths, so that LED light source units A7 of different lengths can be manufactured efficiently.

The LED light source unit for a backlight of a liquid crystal display and the liquid crystal display according to the present invention are not limited to the foregoing embodiments. The specific structure of each part of the LED light source unit for a backlight of a liquid crystal display and the liquid crystal display can be varied in design in many ways.

Figure 59:
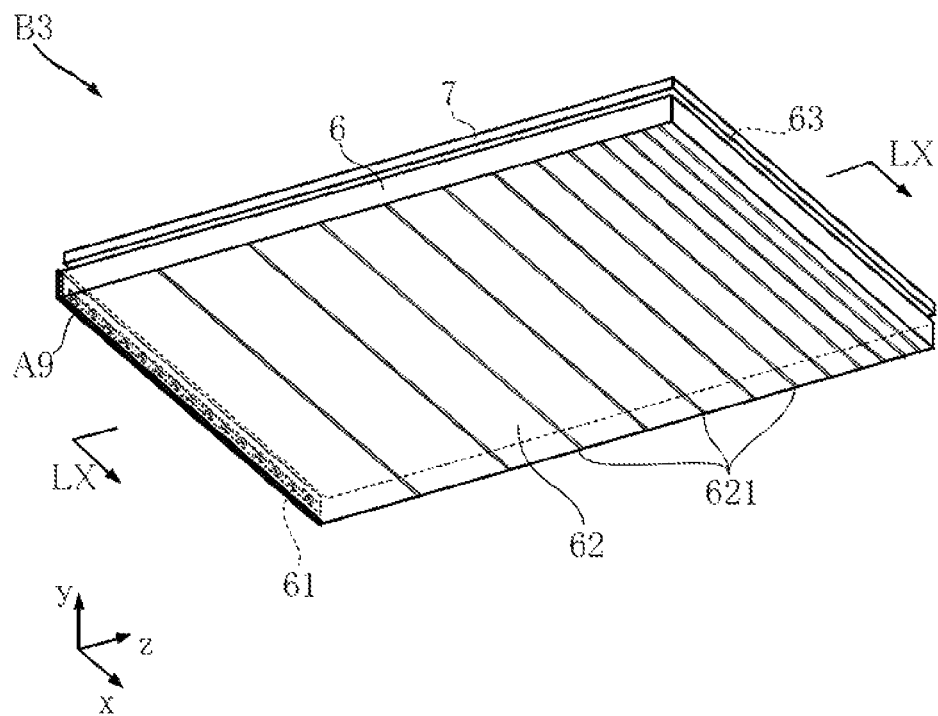
FIG. 59 is a perspective view showing an example of liquid crystal display that uses the LED light source unit of FIG. 50.
Figure 60:
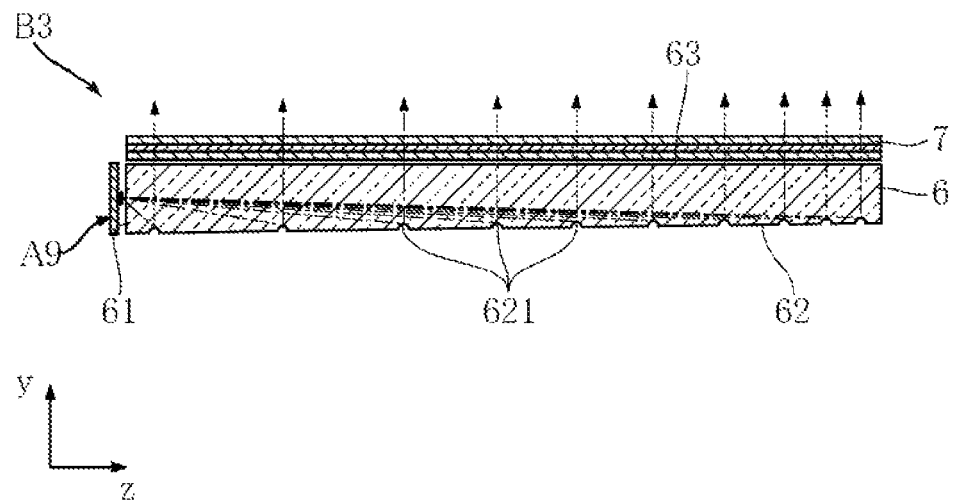
FIG. 60 is a sectional view taken along lines XI-XI in FIG. 59.

FIGS. 50-54 show an LED light source unit for a backlight of a liquid crystal display according to a ninth embodiment of the present invention. The LED light source unit A9 of this embodiment includes a substrate 1, a glass layer 2, a metal film 3, a plurality of LED chips 4, a reflector 51, a light-transmitting resin 55 and a white resin 58. As shown in FIGS. 59 and 60, the LED light source unit A9 is used as a light source constituting the backlight of e.g. a liquid crystal display B3. For easier understanding, the glass layer 2 and the light-transmitting resin 55 are omitted in FIGS. 50 and 51, and the light-transmitting resin 55 is omitted in FIG. 52.

The substrate 1 is made of a ceramic material such as alumina and in the form of an elongated rectangle having a length in direction x and a width in direction y. The substrate 1 of this embodiment is about 222 mm in length, about 6.0 mm in width and about 1.0 mm in thickness. The substrate 1 has a principal surface 11. The normal direction of the principal surface 11 corresponds to direction z. Hereinafter, the direction z is appropriately referred to as "normal direction Z".

Figure 55:
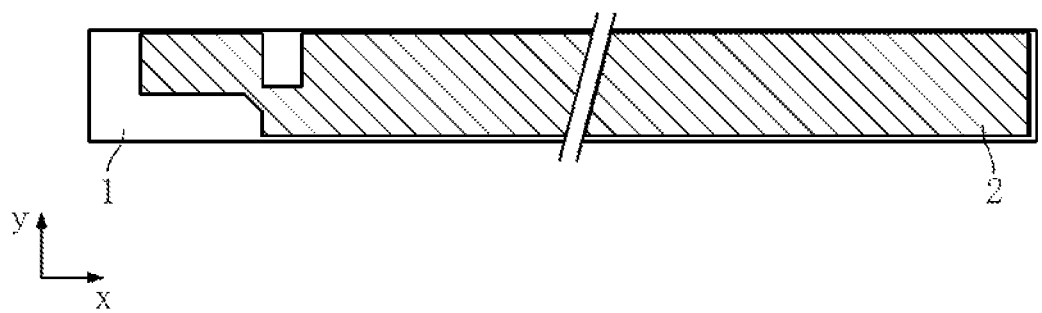
FIG. 55 is a schematic plan view showing the state after a glass layer is formed in the process of manufacturing the LED light source unit of FIG. 50.

The glass layer 2 provides a smooth surface suitable for forming the metal film 3 on the surface, and is formed on the principal surface 11 of the substrate 1. The glass layer 2 has a thickness of e.g. about 100 μm. FIG. 55 shows the substrate 1 on which the glass layer 2 is formed in the process of manufacturing an LED light source unit A9. The glass layer 2 is formed by e.g. printing glass paste and then baking the glass paste.

Figure 56:
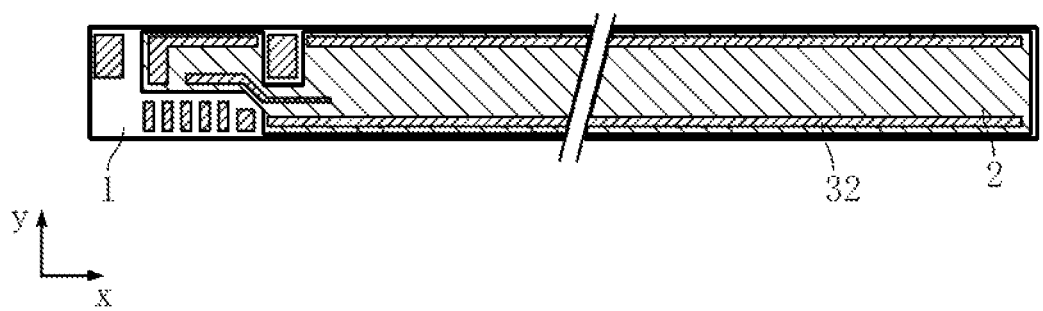
FIG. 56 is a schematic plan view showing the state after an AgPt layer is formed in the process of manufacturing the LED light source unit of FIG. 50.

The metal film 3 functions to supply electric power to the LED chips 4 and is formed on the glass layer 2. In this embodiment, the metal film 3 is made up of an Al layer 31 and an AgPt layer 32. FIG. 56 shows the state after the AgPt layer 32 is formed in the process of manufacturing the LED light source unit A9. The AgPt layer 32 is formed by e.g. printing paste containing Ag and Pt and then baking the paste. The AgPt layer has a thickness of e.g. about 10 μm.

Figure 57:
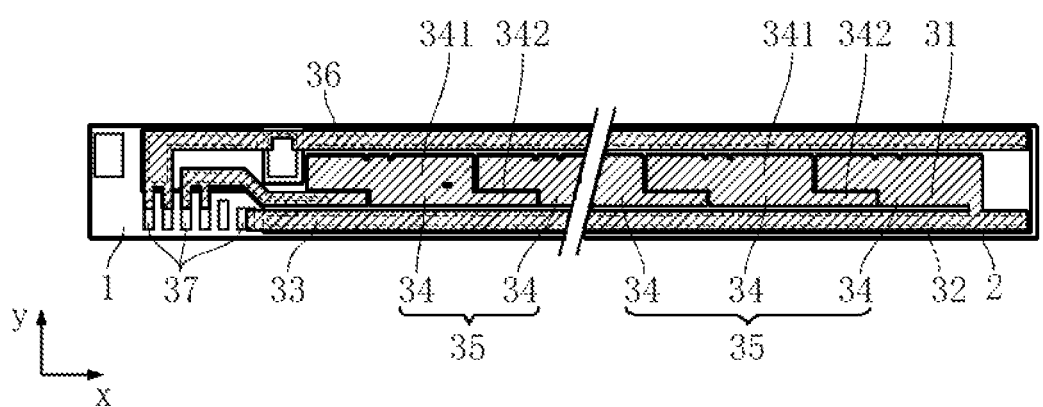
FIG. 57 is a schematic plan view showing the state after an Al layer is formed in the process of manufacturing the LED light source unit of FIG. 50.

The Al layer 31 constitutes the outermost layer of the metal film 3. FIG. 57 shows the state after the Al layer 31 is formed in the process of manufacturing the LED light source unit A9. The Al layer 31 is formed by e.g. sputtering. The Al layer 31 has a thickness of e.g. about 1.2 μm. The AgPt layer 32 partially intervenes between the Al layer 31 and the glass layer 2.

Figure 51:
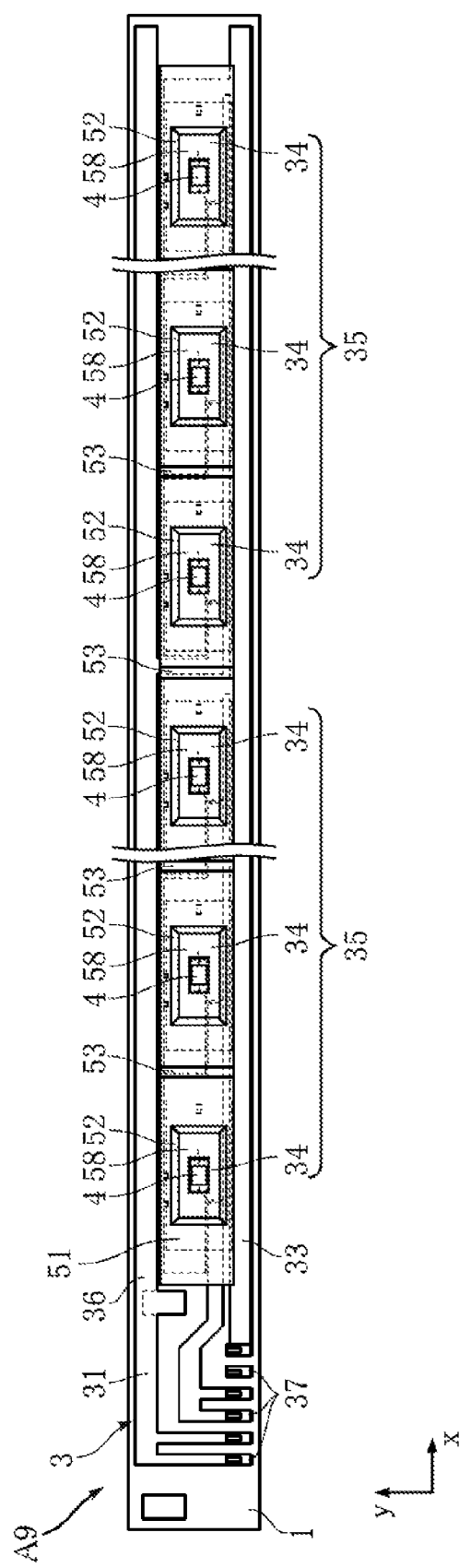
FIG. 51 is a schematic plan view showing the LED light source unit of FIG. 50.

As shown in FIGS. 51-54, the metal film 3 includes a common strip portion 33, a plurality of island groups 35, a connecting strip portion 36 and a plurality of connection terminal portions 37. As shown in FIG. 51, the common strip portion 33 is in the form of a strip elongated in direction x and extends substantially along the entire length of the substrate 1. The width of the common strip portion 33 is e.g. about 1 mm. The common strip portion 33 is positioned close to one of the edges of the substrate 1 that are spaced in direction y. As will be understood from FIGS. 54, 56 and 57, the common strip portion 33 of this embodiment comprises lamination of the Al layer 31 and the AgPt layer 32.

As shown in FIG. 51, the plurality of island groups 35 are aligned in direction x. In this embodiment, two island groups 35 are provided. Each island group 35 is made up of a plurality of island portions 34. The island portions 34 are aligned in direction x in parallel to the common strip portion 33. In this embodiment, each island group 35 includes twelve island portions 34. As will be understood from FIGS. 53, 54, 56 and 57, the island portions 34 of this embodiment have a single layer structure consisting of the Al layer 31 only.

Figure 52:
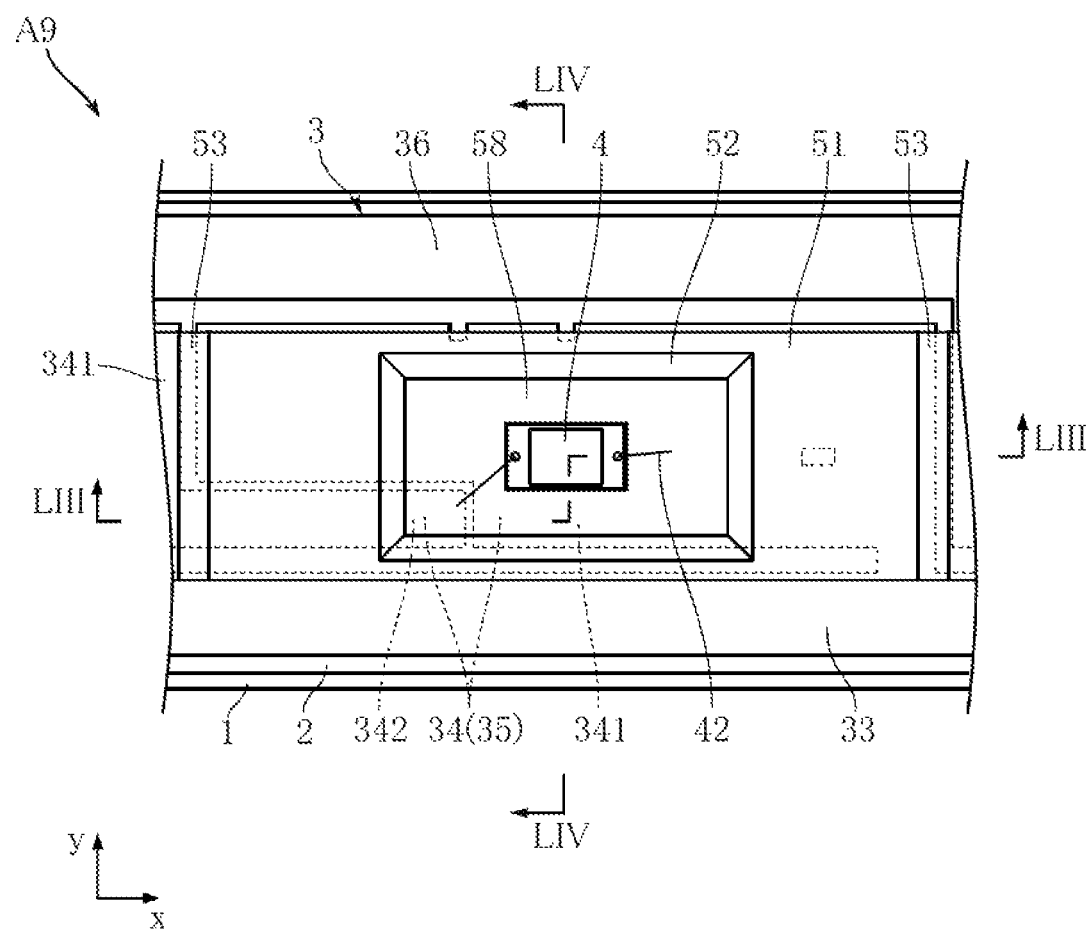
FIG. 52 is an enlarged schematic plan view showing the LED light source unit of FIG. 50.
Figure 53:
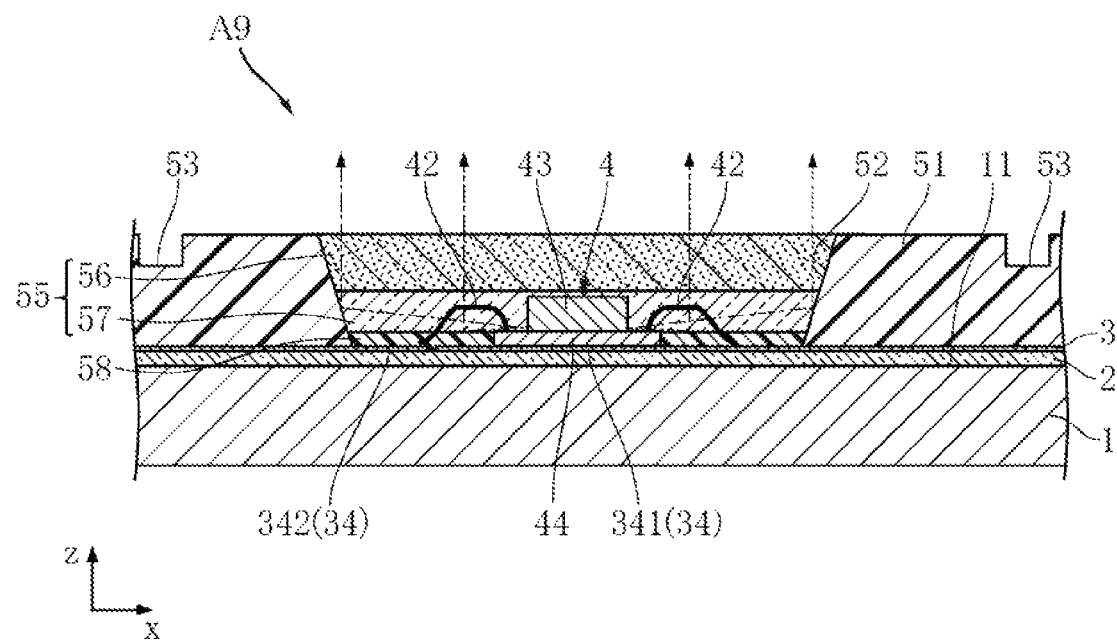
FIG. 53 is a schematic sectional view taken along lines IV-IV in FIG. 52.

As shown in FIGS. 52 and 53, each island portion 34 includes a main portion 341 and an extension 342. The main portion 341 is elongated in direction x and in the form of a rectangle partially cut away. In this embodiment, the main portion 341 has dimensions of about 9.0 mm in direction x and about 2.5 mm in direction y. An LED chip 4 is mounted on the main portion 341. The extension 342 is a portion elongated in direction x from the main portion 341 and is about 0.5 mm in width and about 3.0 mm in length in this embodiment. As shown in FIG. 52, the extension 342 of an island portion 34 is arranged to fit into the cut-away portion of the main portion 341 of the island portion 34 located directly on the right in direction x.

The connecting strip portion 36 is in the form of a strip elongated in direction x and extends substantially along the entire length of the substrate 1. The width of the connecting strip portion 36 is e.g. about 1 mm. The connecting strip portion 36 is positioned close to an edge of the substrate 1 that is opposite from the common strip portion 33 in direction y across the island groups 35. As will be understood from FIGS. 54, 56 and 57, the common strip portion 33 of this embodiment comprises lamination of the Al layer 31 and the AgPt layer 32.

As shown in FIG. 51, the connection terminal portions 37 are positioned close to one of the ends of the substrate 1 that are spaced in direction x and used for connection to the power supply or control unit (neither is shown) of the liquid crystal display B3. As will be understood from FIGS. 56 and 57, the connection terminal portions 37 comprise the AgPt layer 32.

In FIG. 51, the connection terminal portion 37 positioned on the right side in direction x is connected to the common strip portion 33, whereas the connection terminal portion 37 positioned on the left side in direction x is connected to the connecting strip portion 36. The connection terminal portion 37 positioned at the center in direction x is connected to the leftmost one in direction x (closest to the connection terminal portions 37) of the island portions 34. The rightmost one, in direction x, of the island portions 34 included in each island group 35 (farthest from the connection terminal portions 37) is connected to the common strip portion 33. Further, of the island portions 34 included in the island group 35 on the right side in direction x (farther side from the connection terminal portions 37), the leftmost one in direction x (closest from the connection terminal portions 37) is connected to the connecting strip portion 36.

Each LED chip 4 includes a submount substrate 44 made of Si, and a semiconductor layer 43 comprising the lamination of an n-type semiconductor layer made of e.g. GaN, an active layer and a p-type semiconductor layer, and emits e.g. blue light. The semiconductor layer 43 has electrode pads (not shown) on the submount substrate 44 side. These electrode pads are bonded to the wiring pattern (not shown) formed on the submount substrate 44. A Zener diode 4 is incorporated in the submount substrate 44. The Zener diode 4 serves to prevent excessive reverse voltage from being applied to the semiconductor layer 43.

As shown in FIG. 52, the LED chip 4 is mounted on the island portion 34. The LED chip 4 is provided with two electrodes, one of which is connected with a wire 42 to the main portion 341 of the island portion 34 to which the LED chip is mounted. The other one of the electrodes is connected with a wire 42 to the extension 342 of the adjacent island portion 34. The LED chip 4 in this embodiment has dimensions of about 1.9 mm in direction x and about 1.3 mm in direction y. Bonding the submount substrate 44 to the island portion 34 is expected to provide enhanced heat dissipation effect from the LED chip 4 to the metal film 3. For the promotion of the heat dissipation effect, it is preferable to perform bonding between the LED chip 4 and the island portion 34 by using e.g. Ag paste, an epoxy resin or an epoxy resin mixed with a filler made of a highly conductive material.

Because of the structure of the metal film 3 and the mounting arrangement of the LED chips 4, the LED light source unit A9 of this embodiment includes a circuit in which two groups of LED chips 4, each consisting of twelve LED chips 4 connected in series with each other, are connected in parallel to each other.

Figure 54:
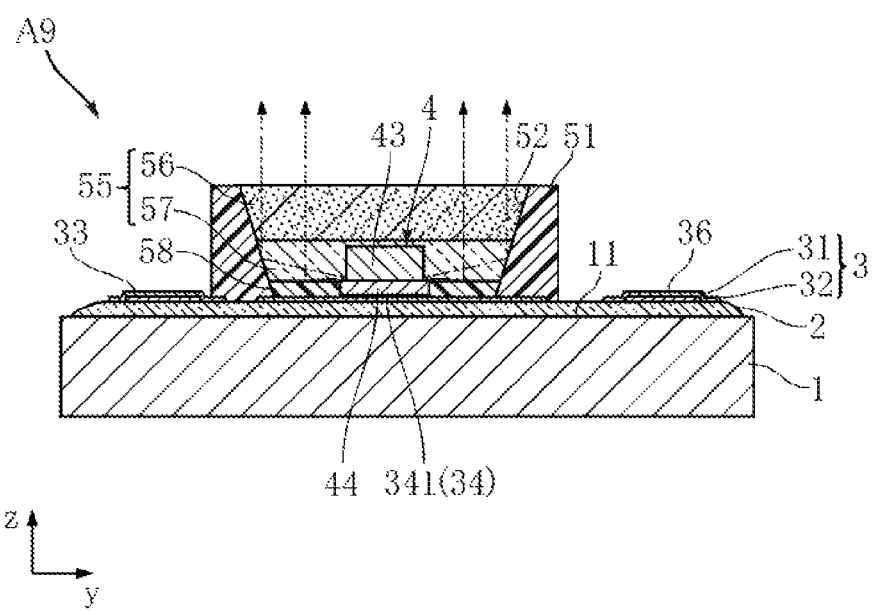
FIG. 54 is a sectional view taken along lines V-V in FIG. 52.

The reflector 51 is provided for causing a larger amount of light from the LED chip 4 to travel in direction z and made of a white resin such as liquid crystal polymer or polybutylene terephthalate. The reflector 51 is elongated in direction x and includes a plurality of openings 52 and a plurality of recesses 53. Each of the openings 52 is rectangular as viewed indirection z. As shown in FIGS. 53 and 54, the inner surface of each opening 52 surrounds a respective one of the LED chips 4 and is inclined to become farther from the LED chip 4 as proceeding away from the substrate 1 in the normal direction z of the principal surface 11. As shown in FIGS. 51-53, each of the recesses 53 is provided between adjacent openings 52. Each recess 53 is a groove recessed from the upper surface of the reflector 51 and rectangular in cross section. Of the reflector 51, the portion where the recess 53 is formed is smaller than other portions in cross section within a y-z plane and corresponds to the smaller-cross-sectional portion of the present invention. In this embodiment, the dimension of the reflector 51 in direction y is about 2.0 to 4.0 mm.

Figure 58:
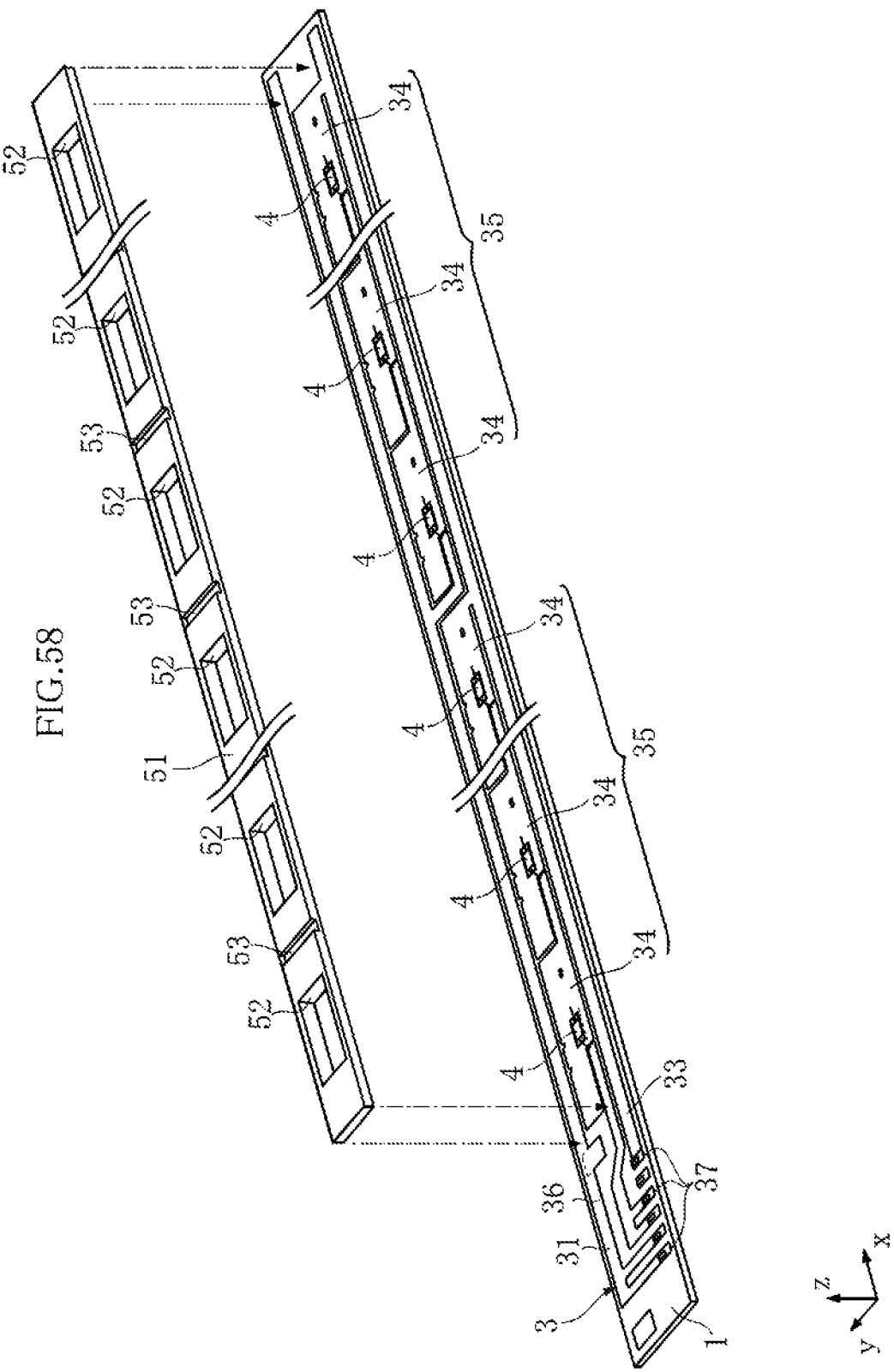
FIG. 58 is a schematic perspective view showing the step of attaching a reflector to a substrate in the process of manufacturing the LED light source unit of FIG. 50.

In the process of manufacturing the LED light source unit A9, as shown in FIG. 58, the reflector 51 is bonded to the substrate 1 after the mounting of the LED chips 4 is completed. In this embodiment, the reflector 51 has dimensions of about 3.0 mm in direction y and about 1 mm in direction z. The openings 52 have dimensions of about 3.9 mm in direction x and about 1.9 mm in direction y. The recesses 53 have dimensions of about 0.5 to 4.0 mm in direction x and about 0.2 to 0.8 mm in depth in direction z.

The white resin 58 is an example of opaque resin of the present invention and made of e.g. a material, such as white epoxy resin, that does not allow the light from the LED chips 4 to pass through and has a reflectivity higher than that of the submount substrate 44. As shown in FIGS. 52-54, the white resin 58 covers the area surrounded by the opening 52 of the reflector 51, except the LED chip 4. The white resin 58 also covers the entire side surface of the submount substrate 44. However, unlike this embodiment, only part of the side surface of the submount substrate 44 may be covered with the white resin 58. The white resin 58 is spaced from the semiconductor layer 43. That is, the white resin 58 does not cover any part of the semiconductor layer 43.

As shown in FIGS. 53 and 54, the light-transmitting resin 55 fills the opening 52 and covers the LED chip 4. The light-transmitting resin 55 includes a transparent portion 57 and a fluorescent portion 56. The transparent portion 57 is laminated on the white resin 58, and covers the semiconductor layer 43 in this embodiment. The transparent portion 57 is made of a transparent epoxy resin or silicone resin. The fluorescent portion 56 is laminated on the transparent portion 57 and made of a material obtained by mixing a fluorescent material into a transparent epoxy resin. The transparent portion 57 does not contain such a fluorescent material. The fluorescent material contained in the fluorescent portion 56 may emit yellow light upon excitation by blue light from the LED chip 4. The blue light from the LED chip 4 and the yellow light from the fluorescent material mix together, causing white light to be emitted from the LED light source unit A9. Instead of the above-described fluorescent material, use may be made of a mixture of a fluorescent material that emits red light upon excitation by blue light and a fluorescent material that emits green light upon excitation by blue light.

FIGS. 59 and 60 show an example of liquid crystal display using the LED light source unit A9. The liquid crystal display B3 illustrated in the figures includes the LED light source unit A9, the light guide plate 6 and a liquid crystal panel 7.

The light guide plate 6 provides the backlight, together with the LED light source unit A9, and is made of e.g. transparent polycarbonate resin or acrylic resin. The light guide plate 6 is a plate spreading in a z-x plane. The light guide plate 6 includes a light incident surface 61, a reflective surface 62 and a light emission surface 63. The light incident surface 61 is a smooth surface perpendicular to direction z and faces the LED light source unit A9. The reflective surface 62 is perpendicular to direction y and is formed with a plurality of grooves 621. The light emission surface 63 is a smooth surface perpendicular to direction y and positioned on the opposite side from the reflective surface 62.

As shown in FIG. 60, light emitted from the LED light source unit A9 enters through the light incident surface 61 and travels within the light guide plate 6. The traveling light is reflected or diffused at the grooves 621 of the reflective surface 62 to travel in direction y. The light traveling from the reflective surface 62 is emitted to the outside through the light emission surface 63. In this way, when the LED light source unit A9 emits light, white light is emitted from the entire light emission surface 63 of the light guide plate 6.

The liquid crystal panel 7 selectively allows the light emitted from the light guide plate 6 to pass through, thereby forming an image for display on the liquid crystal display B3. The liquid crystal panel 7 comprises e.g. two transparent substrates facing each other and a liquid crystal layer sandwiched between the transparent substrates, and is designed to change the light transmission state for each pixel by e.g. the active matrix method.

The advantages of the LED light source unit A9 and the liquid crystal display B3 are described below.

According to this embodiment, the white resin 58 covers the side surface of the submount substrate 44 of the LED chip 4. Si, which is the material of the submount substrate 44, absorbs light well. The white resin 58 prevents light from the semiconductor layer 43 from being absorbed by the side surface of the submount substrate 44. This promotes enhancement of the brightness of the LED light source unit A9.

The white resin 58 covers the entire area surrounded by the opening 52, except the LED chip 4. This prevents the light from the semiconductor layer 43 from being absorbed by the substrate 1 or the like. This helps enhancement of the brightness of the LED light source unit A9.

The LED chip 4 includes the Zener diode incorporated in the submount substrate 44. Application of excessive reverse voltage to the semiconductor layer 43 is prevented by the Zener diode. The provision of the Zener diode does not hinder enhancement of the brightness of the LED light source unit A9.

By the provision of the transparent portion 57 in the light-transmitting resin 55, the amount of the fluorescent material to be contained in the light-transmitting resin 55 is reduced. This helps reduction in cost for the LED light source unit A9.

Since each LED chip 4 is surrounded by the opening 52 of the reflector 51, the light traveling from the LED chip 4 toward the sides is reflected by the opening 52. Since the inner surface of the opening 52 is inclined such that the opening becomes wider at an upper portion as shown in FIGS. 53 and 54, the light reflected is easily emitted to the outside of the LED light source unit A9. Thus, the LED light source unit A9 has enhanced brightness.

As shown in FIG. 58, the reflector 51 is formed after the mounting of the LED chips 4 are completed. Thus, the reflector 51 is not exposed to high temperature in a reflow furnace used for mounting the LED chips 4. Thus, liquid crystal polymer or polybutylene terephthalate can be used as the white resin. Liquid crystal polymer or polybutylene terephthalate is suitable for enhancing the reflectivity at the surface of the reflector 51. This helps enhancement of the brightness of the LED light source unit A9.

As shown in FIG. 58, the reflector 51 is usually handled by itself before it is attached to the substrate 1. Depending on the way of holding the reflector 51, an excessive moment may act on the reflector 51. The smaller-cross-sectional portions where the recesses 53 are formed elastically deform more easily than other portions. Thus, when a moment acts on the reflector 51, the smaller-cross-sectional portions readily deform, preventing formation of cracks in the reflector 51.

The recesses 53 are provided at a surface of the reflector 51 that is opposite from the substrate 1. Thus, the provision of the smaller-cross-sectional portions does not reduce the area of the reflector 51 to be bonded to the substrate 1. Thus, while the reflector 51 is protected from damage, reduction in the bonding strength between the reflector 51 and the substrate 1 is avoided.

Enhancing the brightness of the LED light source unit A9 allows the liquid crystal display B3 to display brighter and clearer images.

FIGS. 61-83 illustrate other embodiments of the present invention. In these figures, the elements that are identical or similar to those of the foregoing embodiments are designated by the same reference signs as those used for the foregoing embodiment.

Figure 61:
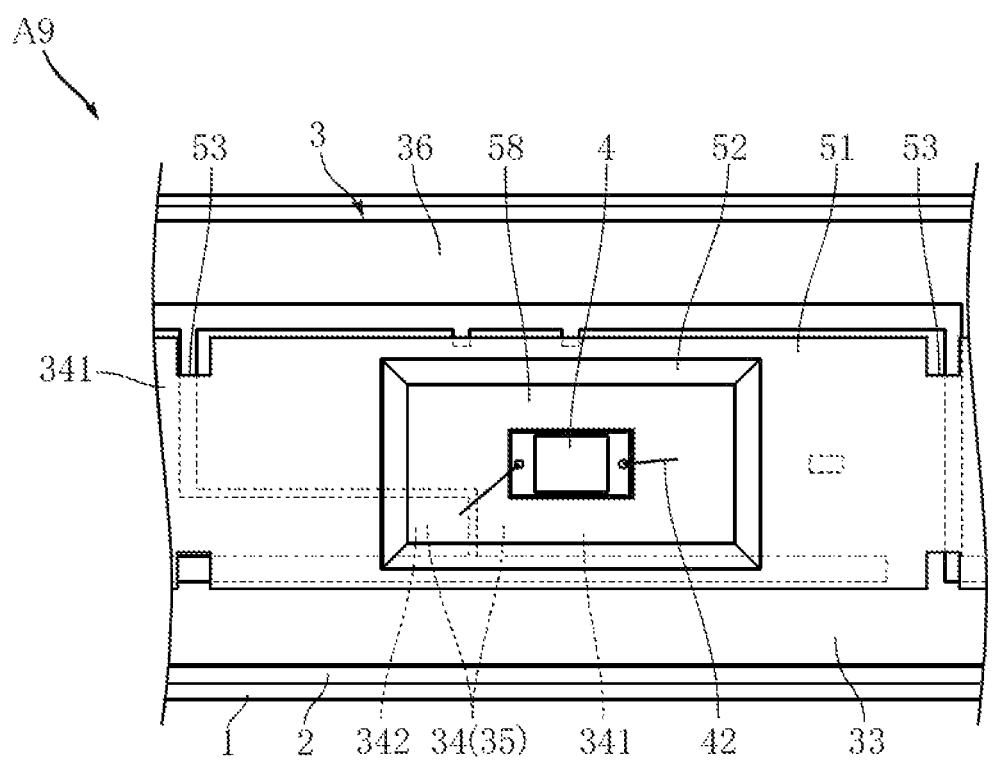
FIG. 61 is an enlarged schematic sectional view showing a variation of the LED light source unit according to the ninth embodiment of the present invention.

FIG. 61 shows a variation of the recesses 53 of the LED light source unit A9. That is, the LED light source unit A9 of this variation differs from the above-described LED light source unit A9 in structure of the recesses 53. In this variation, the recesses 53 are recessed from the side surfaces of the reflectors 51 oriented in direction y. Specifically, a pair of recesses 53 are provided between two adjacent openings 52. Each of the paired recesses 53 is provided on a respective one of the sides of the reflector 51 that are spaced in direction y. With this variation again, formation of cracks or the like in the reflector 51 is prevented, while brightness of the LED light source unit A9 is enhanced.

Figure 62:
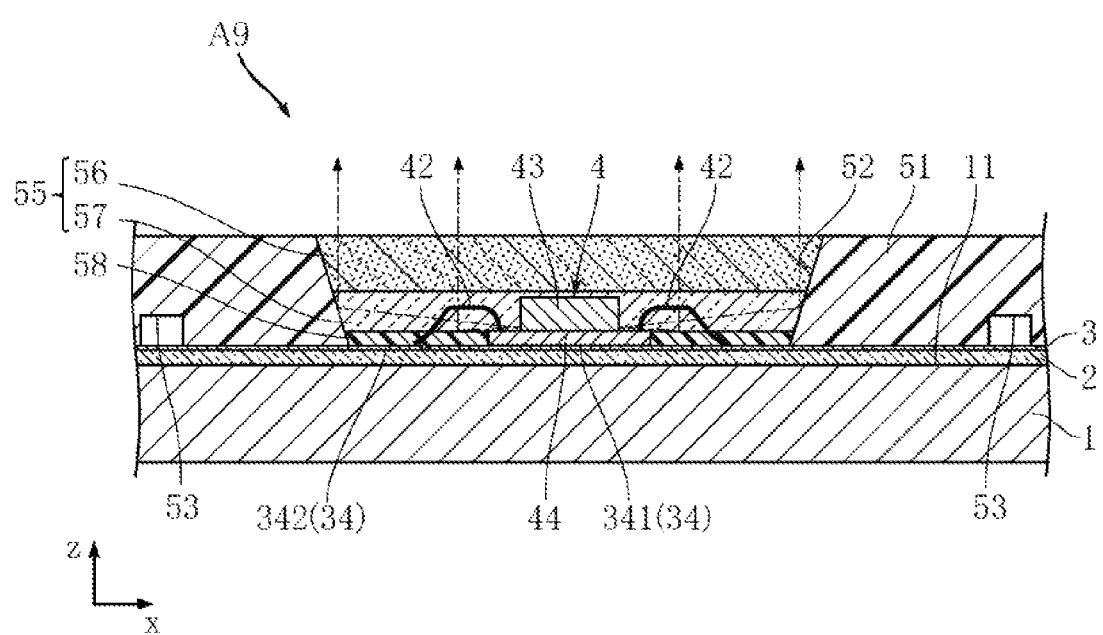
FIG. 62 is a schematic sectional view showing a variation of the LED light source unit according to the ninth embodiment of the present invention.

FIG. 62 shows another variation of the recesses 53 of the LED light source unit A9. That is, the LED light source unit A9 of this variation differs from the above-described LED light source unit A9 in structure of the recesses 53. In this variation, the recesses 53 are recessed from the surface of the reflector 51 that is bonded to the substrate 1. Each of the recesses is provided between two adjacent openings 52. With this variation again, formation of cracks or the like in the reflector 51 is prevented, while brightness of the LED light source unit A9 is enhanced.

Figure 63:
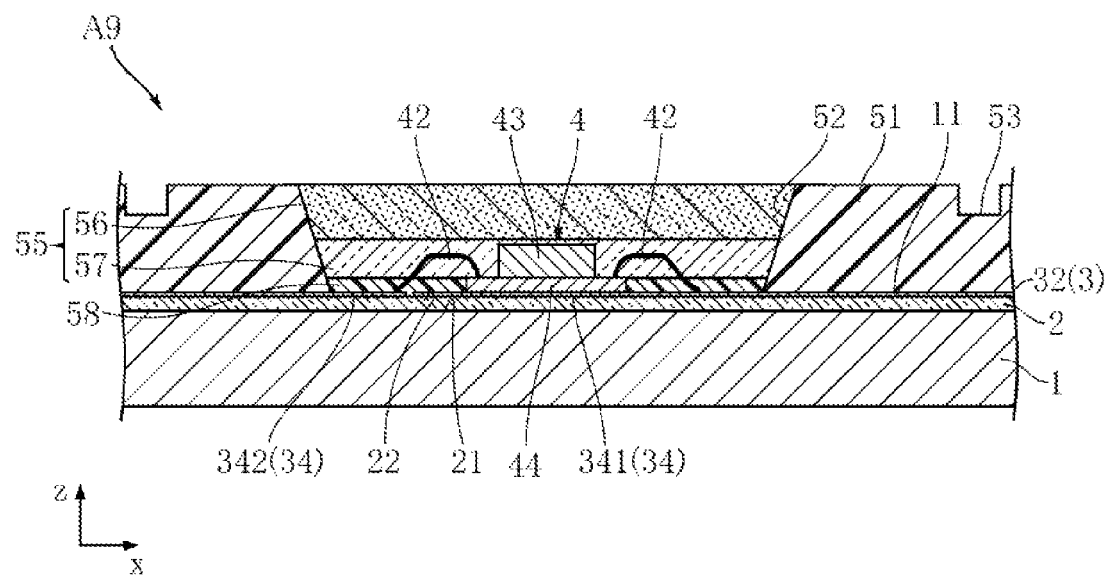
FIG. 63 is a schematic sectional view showing a variation of the LED light source unit according to the ninth embodiment of the present invention.
Figure 64:
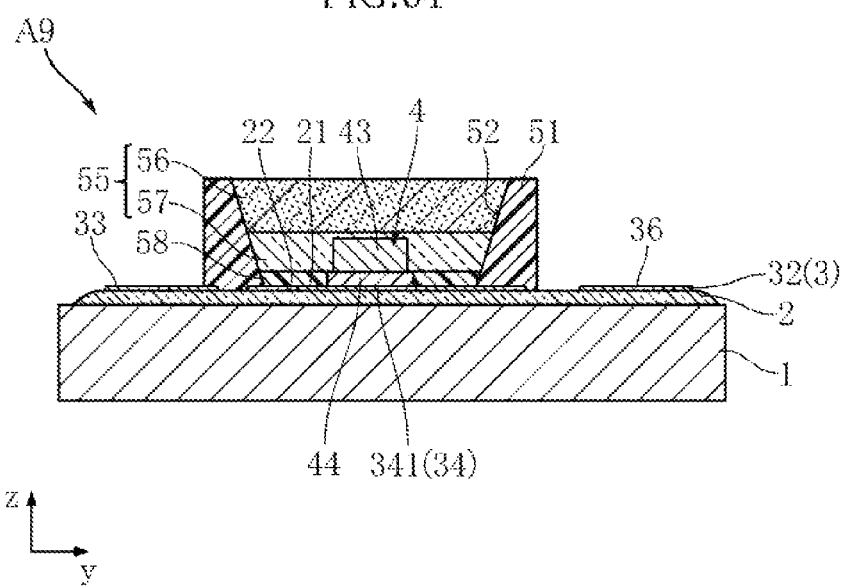
FIG. 64 is a sectional view within a y-z plane of a variation of FIG. 63.

FIGS. 63 and 64 show a variation of the metal film 3 of the LED light source unit A9. In this variation, the metal film 3 consists of an AgPt layer 32 only. According to this embodiment, in manufacturing the LED light source unit A9, the step of forming the Al layer 31 is omitted. This leads to cost reduction of the LED light source unit A9.

Figure 65:
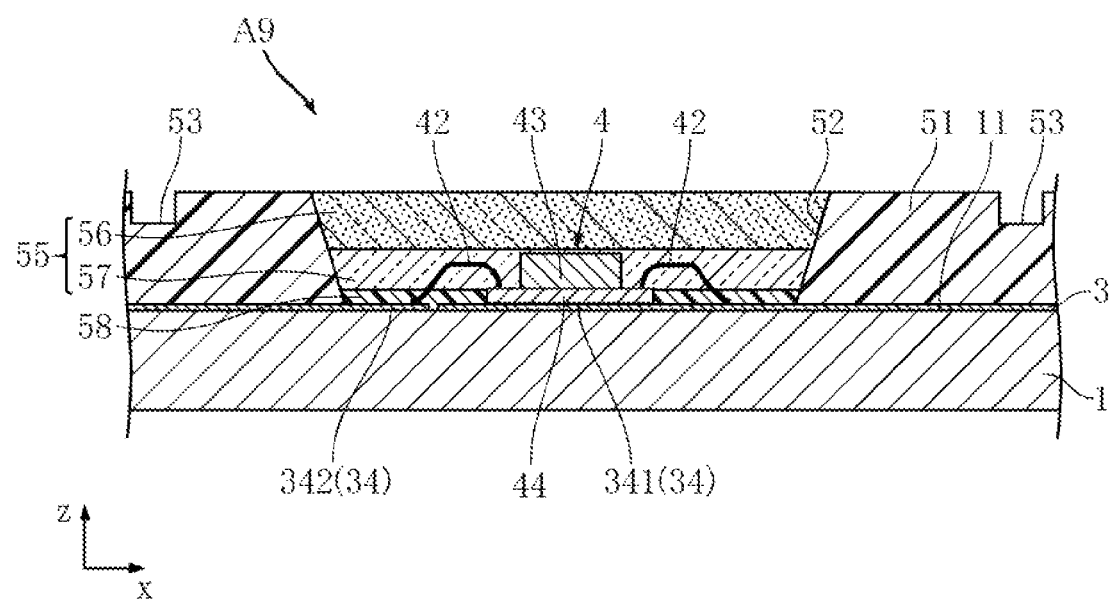
FIG. 65 is a schematic sectional view showing a variation of the LED light source unit according to the ninth embodiment of the present invention.
Figure 66:
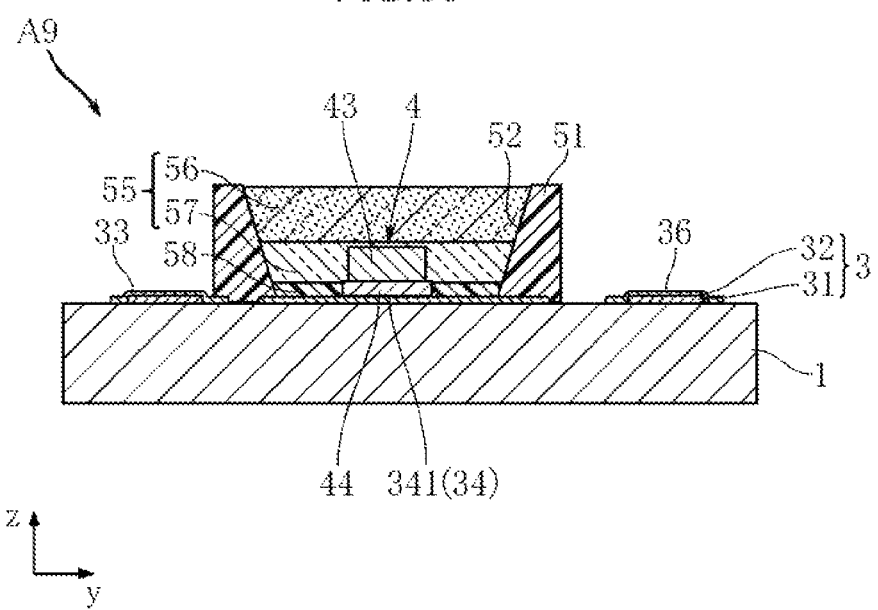
FIG. 66 is a sectional view within a y-z plane of a variation of FIG. 65.

FIGS. 65 and 66 show another variation of the LED light source unit A9. This variation differs from the above-described LED light source unit A9 in that the glass layer 2 is not provided. According to this embodiment, the step of forming the glass layer 2 is omitted, which helps cost reduction of the LED light source unit A9. Further, heat dissipation from the LED chips 4 is promoted.

Figure 67:
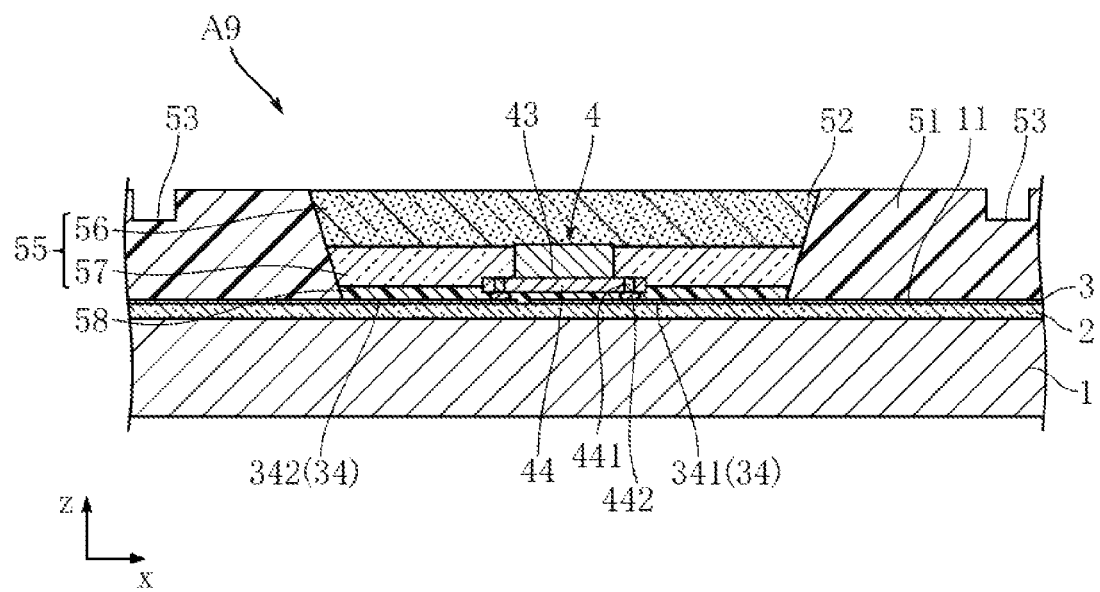
FIG. 67 is a schematic sectional view showing a variation of the LED light source unit according to the ninth embodiment of the present invention.

FIG. 67 shows a variation of the LED chips 4 of the LED light source unit A9. The LED chips 4 of this variation are of the type that can be mounted without using a wire 42. Specifically, the submount substrate 44 is provided with two through-hole electrodes 441. These through-holes electrodes 441 are electrically connected to the n-type semiconductor layer and the p-type semiconductor layer of the semiconductor layer 43, respectively, via the wiring pattern formed on the submount substrate 44. Mounting bumps 442 are formed on the lower surface of the through-hole electrodes 441. The LED chip 4 is bonded to the metal film 3 with the bumps 442.

Figure 68:
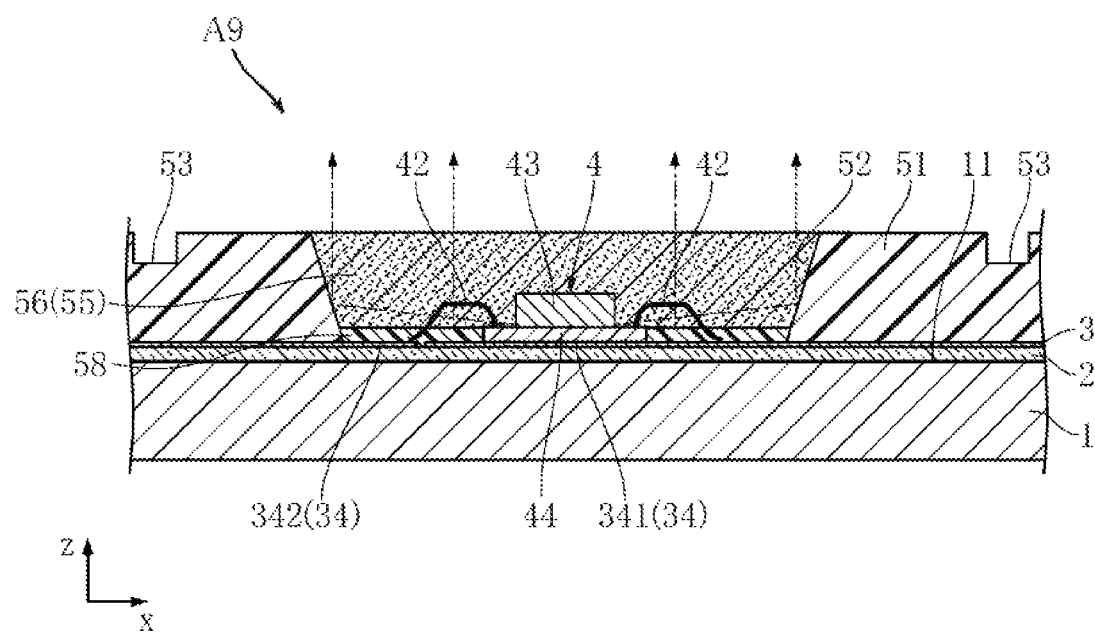
FIG. 68 is a schematic sectional view showing a variation of the LED light source unit according to the ninth embodiment of the present invention.

FIG. 68 shows a variation of the light-transmitting resin 55 of the LED light source unit A9. In this variation, the light-transmitting resin 55 consists of a fluorescent portion 56 only. With this variation again, brightness of the LED light source unit A9 is enhanced.

Figure 69:
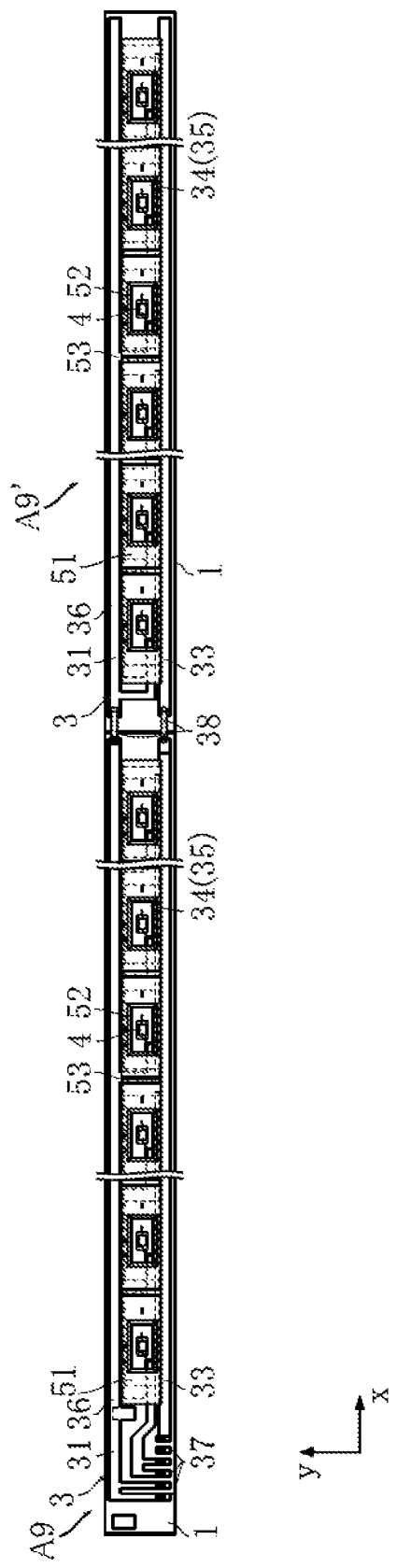
FIG. 69 is a schematic plan view showing an example of usage of the LED light source unit according to the ninth embodiment of the present invention.
Figure 70:
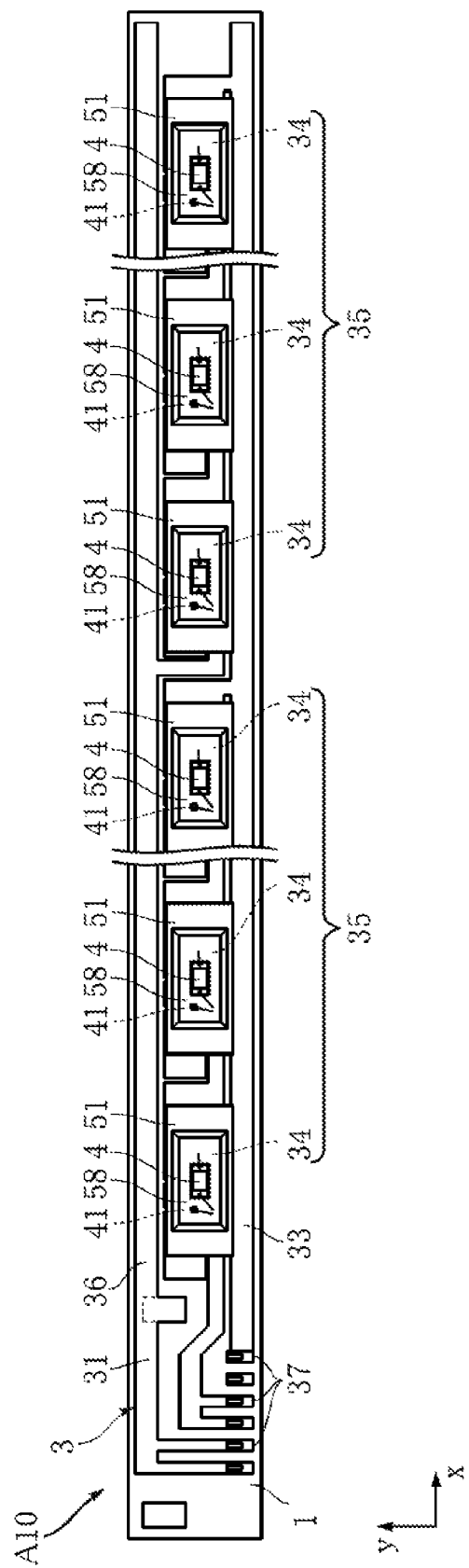
FIG. 70 is a schematic plan view showing an LED light source unit according to a tenth embodiment of the present invention.
Figure 71:
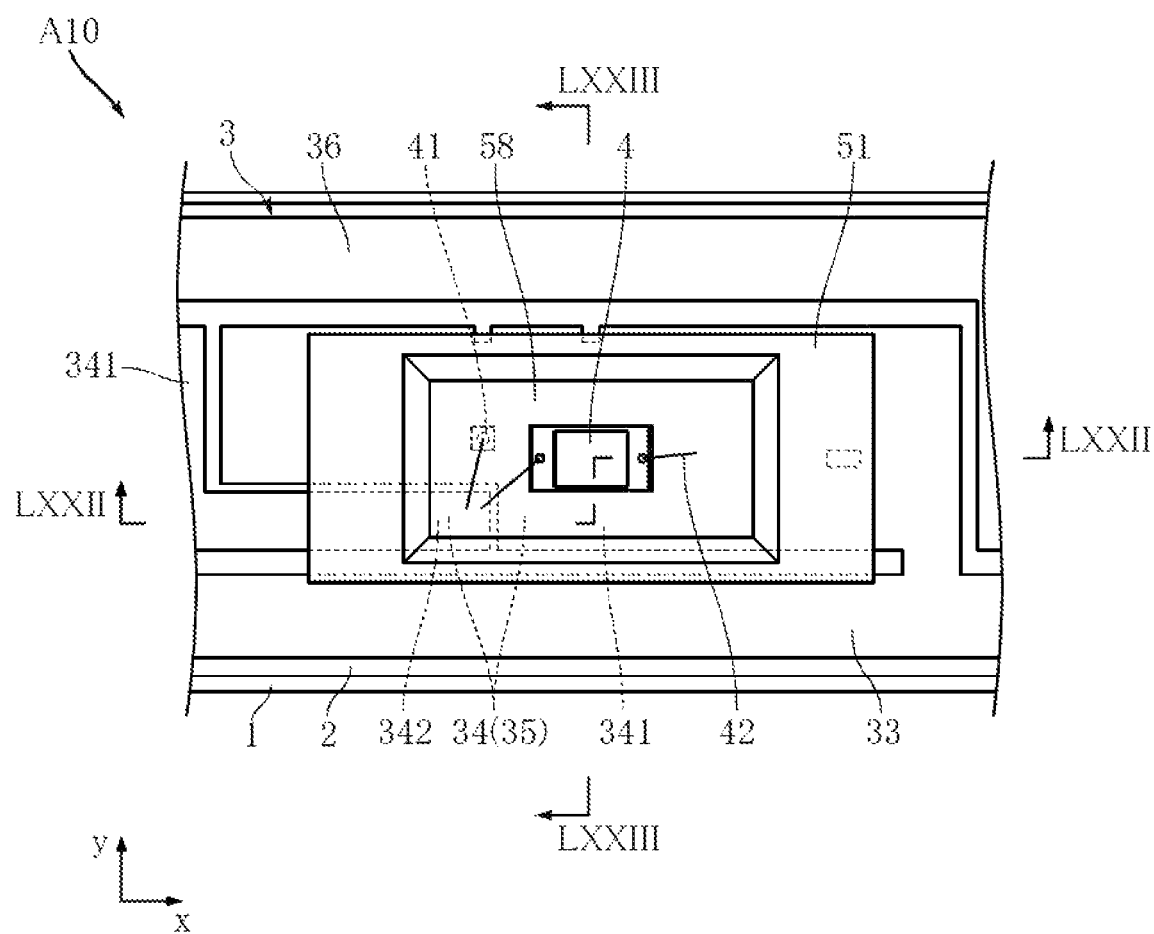
FIG. 71 is an enlarged schematic plan view showing the LED light source unit of FIG. 70.
Figure 72:
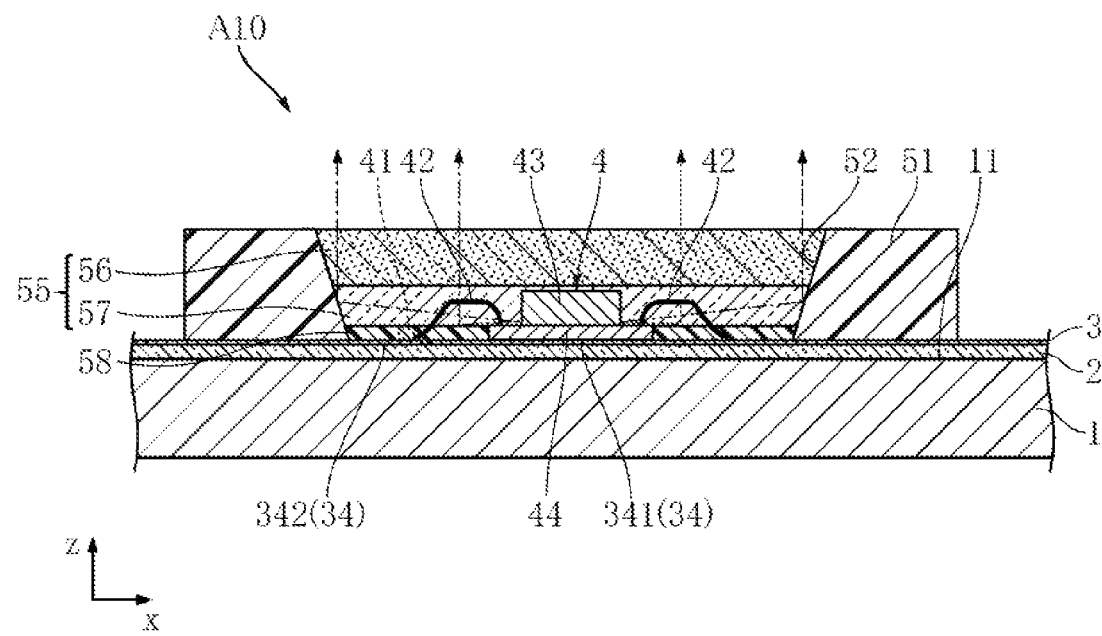
FIG. 72 is a schematic sectional view taken along lines XXIII-XXIII in FIG. 71.
Figure 73:
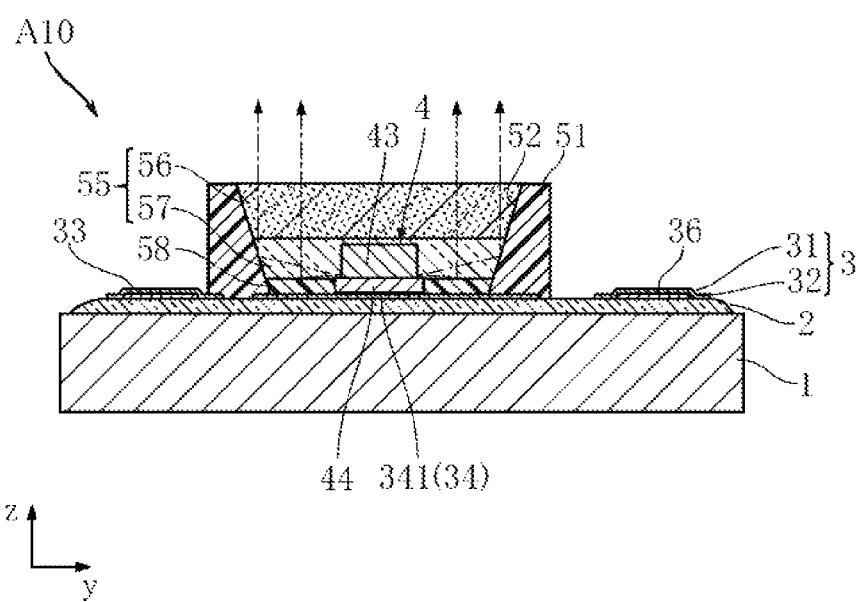
FIG. 73 is a sectional view taken along lines XXIV-XXIV in FIG. 71.

FIG. 69 illustrates the structure obtained by combining the LED light source unit according to the ninth embodiment of the present invention and a variation of the LED light source unit. The LED light source unit A9' illustrated in the figure is different from the LED light source unit A9 in that it does not include connection terminal portions 37. The common strip portion 33 of the LED light source unit A9 and that of the LED light source unit A9' are connected to each other with a wire 38, so are the connecting strip portion 36 of the LED light source unit A9 and that of the LED light source unit A9'. With this arrangement, an LED light source unit for a backlight of a larger liquid crystal display can be obtained.

FIGS. 70-73 show an LED light source unit A10 according to a tenth embodiment of the present invention. The LED light source unit A10 of this embodiment differs from the foregoing embodiment in that it includes a plurality of reflectors 51, and Zener diodes 41 provided separately from the LED chips 4. The reflectors 51 are separate from each other.

In this embodiment, a plurality of reflectors 51 are attached to the substrate 1. Each of the reflectors 51 includes an opening 52 accommodating an LED chip 4. The Zener diode 41 is mounted on the main portion 341 of the island portion 34, together with the LED chip 4. The Zener diode 41 prevents excessive reverse voltage from being applied to the semiconductor layer 43 of the LED chip 4. The Zener diode 41 is covered with the white resin 58. Thus, light from the LED chip 4 is prevented from being absorbed by the Zener diode 41.

Instead of providing a Zener diode 41 separately from an LED chip 4, the Zener diode may be formed in the submount substrate 44, while a plurality of separate reflectors 51 may be provided.

Figure 74:
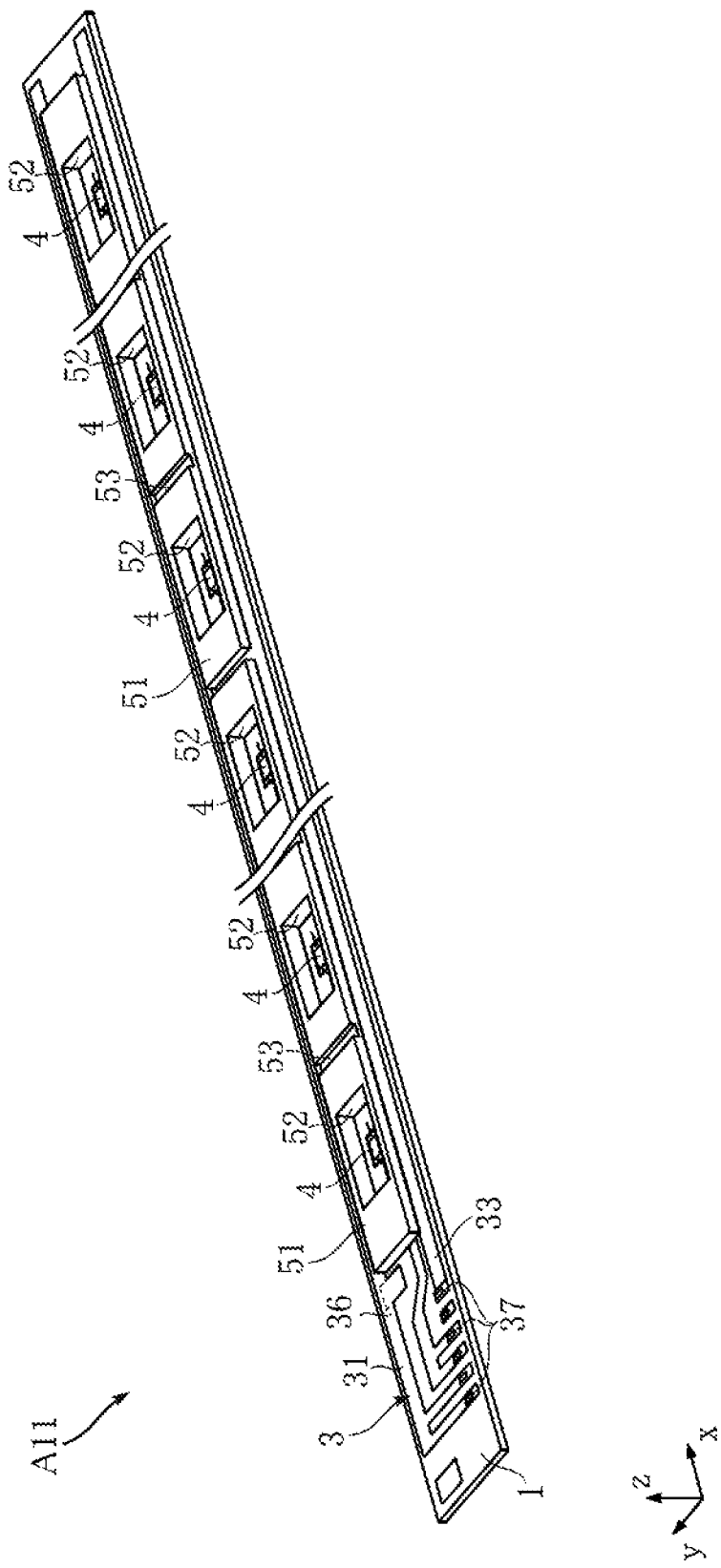
FIG. 74 is a schematic perspective view showing an LED light source unit according to an eleventh embodiment of the present invention.

FIG. 74 shows an LED light source unit according to an eleventh embodiment of the present invention. The LED light source unit A11 of this embodiment differs from the LED light source unit A9 in that two reflectors 51 are attached to a single substrate 1. In this embodiment, the length in direction x of each reflector 51 is slightly smaller than one half the length of the substrate 1. The two reflectors 51 are arranged in series in direction x. Similarly to the LED light source unit A9, openings 52 formed in each reflector surround the LED chips 4, respectively.

According to this embodiment again, brightness of the LED light source unit A11 is enhanced. By preparing reflectors 51 that are shorter than the substrate 1 in direction x, the number of the reflectors 51 to be attached to a single substrate 1 can be adjusted depending on the length of the substrate 1. Thus, reflectors 51 can be used commonly for substrates 1 of different lengths, so that LED light source units All of different lengths can be manufactured efficiently.

Figure 75:
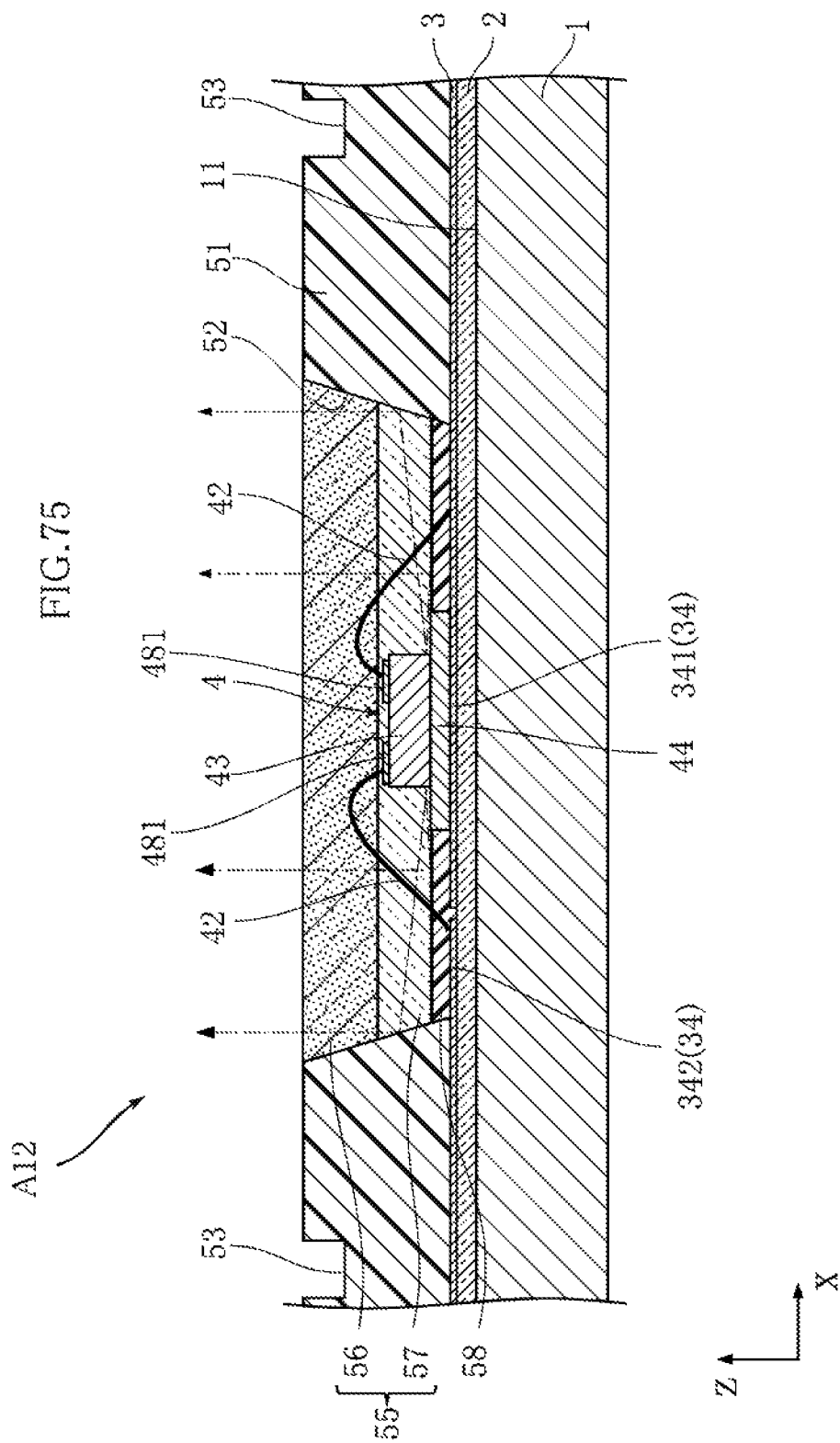
FIG. 75 is an enlarged schematic sectional view showing a variation of the LED light source unit according to an embodiment of the present invention.

FIG. 75 shows a variation of the LED chip 4. The LED chip 4 of the LED light source unit A12 of this variation is different from the LED chip 4 shown in e.g. FIG. 53 in that the wires 42 are not bonded to the submount substrate 44 but bonded to the electrodes 481 formed on the semiconductor layer 43.

Specifically, the LED chip 4 includes a submount substrate 44, a semiconductor layer 43 and two electrodes 481. The structures of the submount substrate 44 and the semiconductor layer 43 are the same as those described above, so that the description is omitted. The electrodes 481 are formed on the semiconductor layer 43. The electrodes 481 are oriented in the normal direction z of the principal surface 11.

Figure 76:
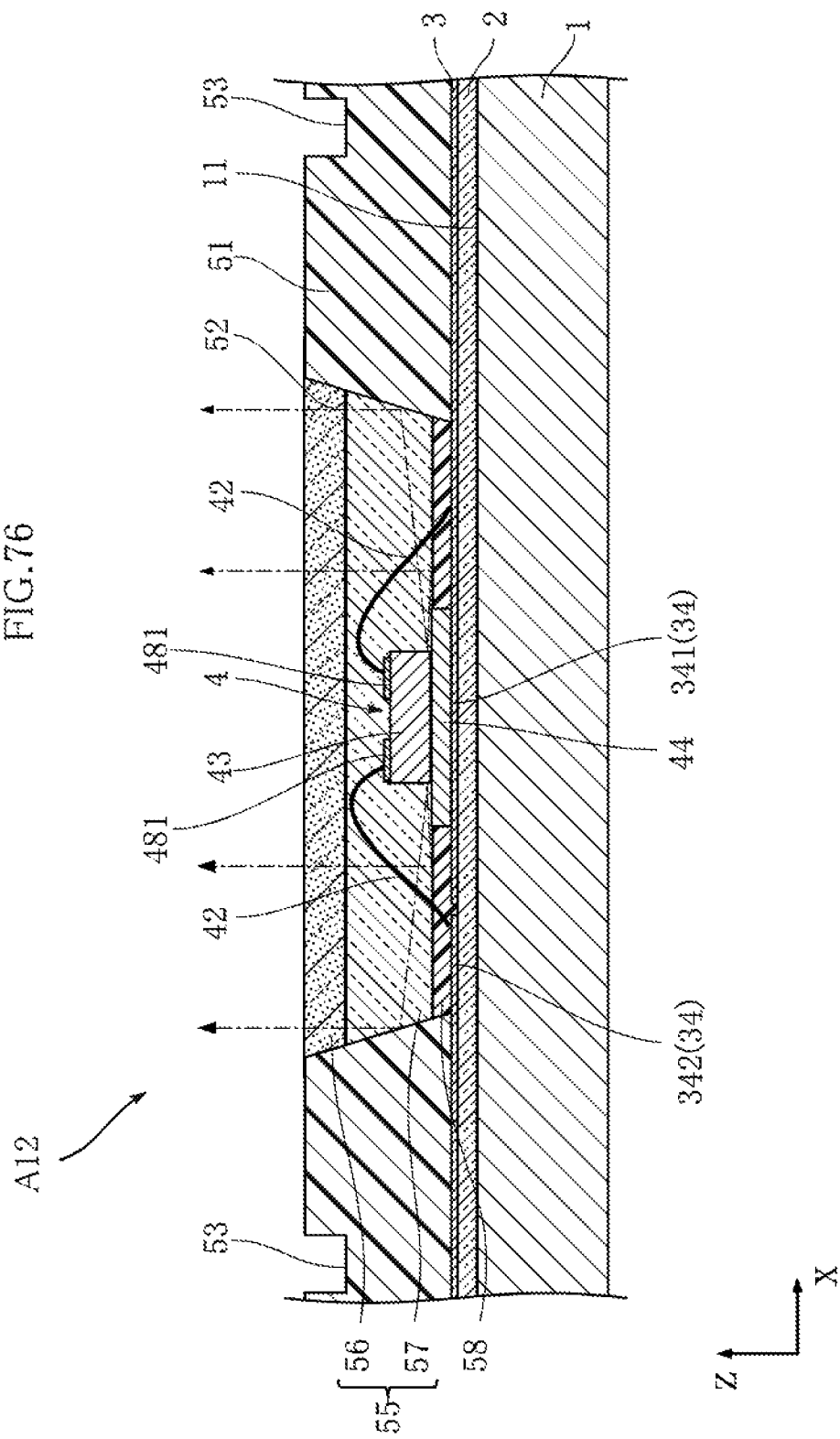
FIG. 76 is an enlarged schematic sectional view showing a variation of the LED light source unit according to an embodiment of the present invention.

The transparent portion 57 directly covers part of each wire 42 and the electrodes 481. The fluorescent portion 56 directly covers part of each wire 42. However, the fluorescent portion 56 may not directly cover the wires 42, as shown in FIG. 76.

With the structures shown in FIGS. 75 and 76 again, the same advantages as described with respect to the LED light source units A9 and A10 can be obtained. The structure of the LED chip 4 of this variation can be employed also in the LED light source units A9 and A10.

Figure 77:
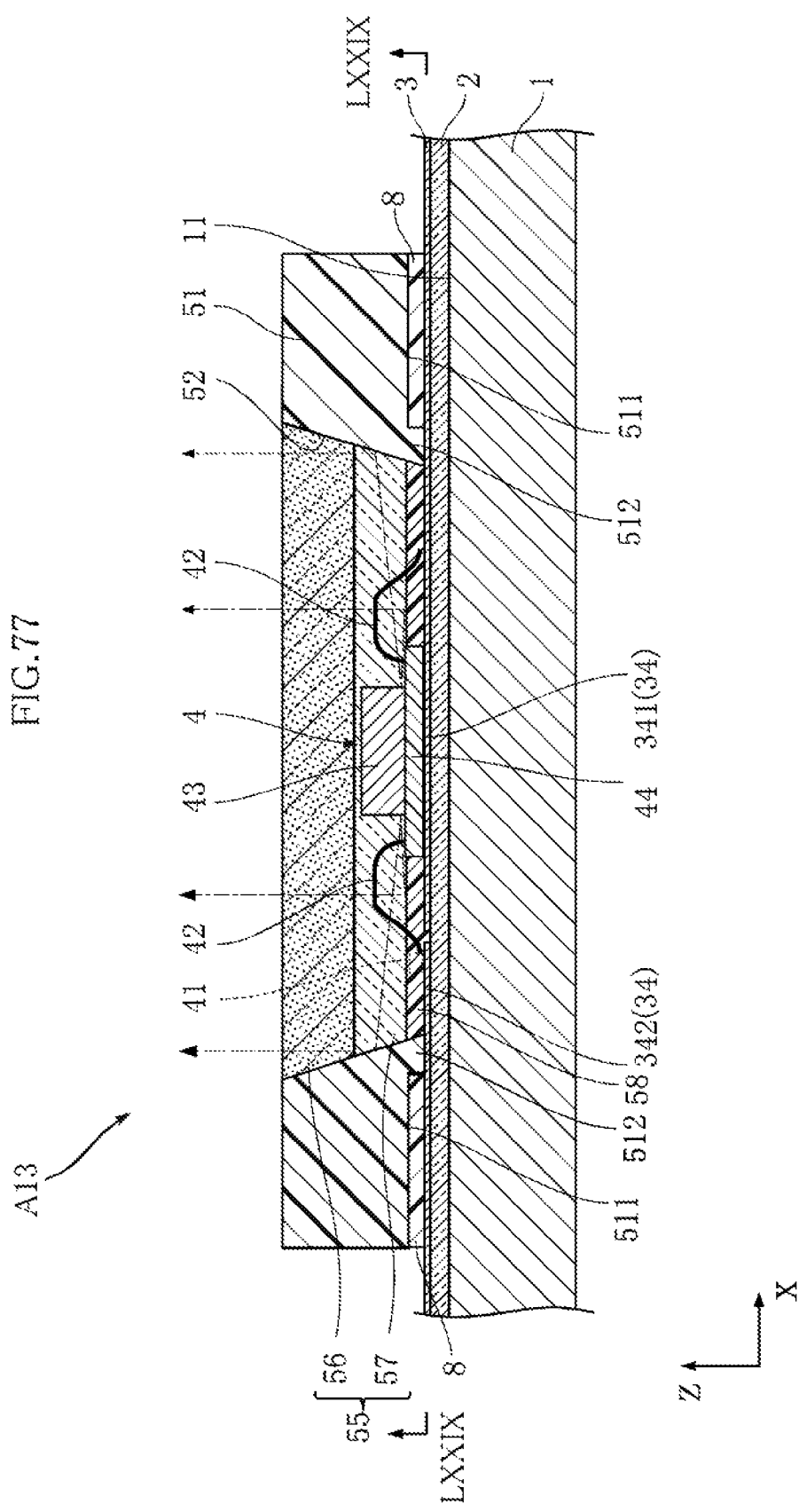
FIG. 77 is an enlarged schematic sectional view showing a variation of the LED light source unit according to an embodiment of the present invention.
Figure 78:
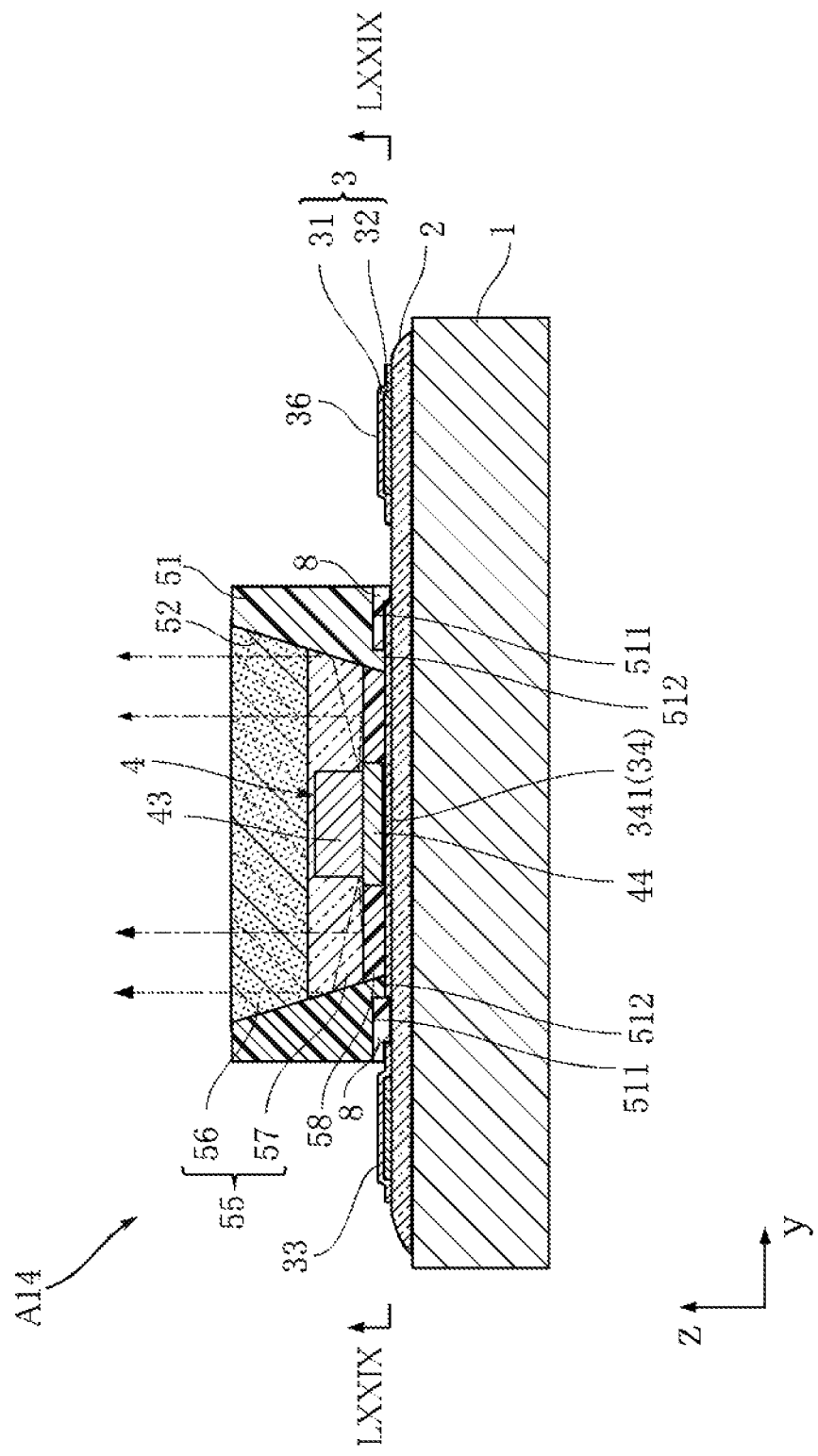
FIG. 78 is an enlarged schematic sectional view showing a variation of the LED light source unit according to an embodiment of the present invention.

FIGS. 77 and 78 show variations of the reflector 51. The reflector 51 of the LED light source unit A13 of this variation is different from the reflector 51 shown in e.g. FIG. 53 in that it includes projections 512. This variation is described on the assumption that the LED light source unit A13 includes a plurality of reflectors 51 as described with respect to the LED light source unit A10. The LED light source unit A13 includes an adhesive layer 8. Though not described above, the LED light source units A9 and A10 or the like may also include an adhesive layer. The adhesive layer 8 intervenes between the reflector 51 and the substrate 1.

The adhesive layer 8 bonds the reflector 51 to the substrate 1. For instance, the adhesive layer 8 is made of an epoxy-based adhesive. Specifically, in this embodiment, the adhesive layer 8 is in contact with the glass layer 2 and the metal film 3.

Figure 79:
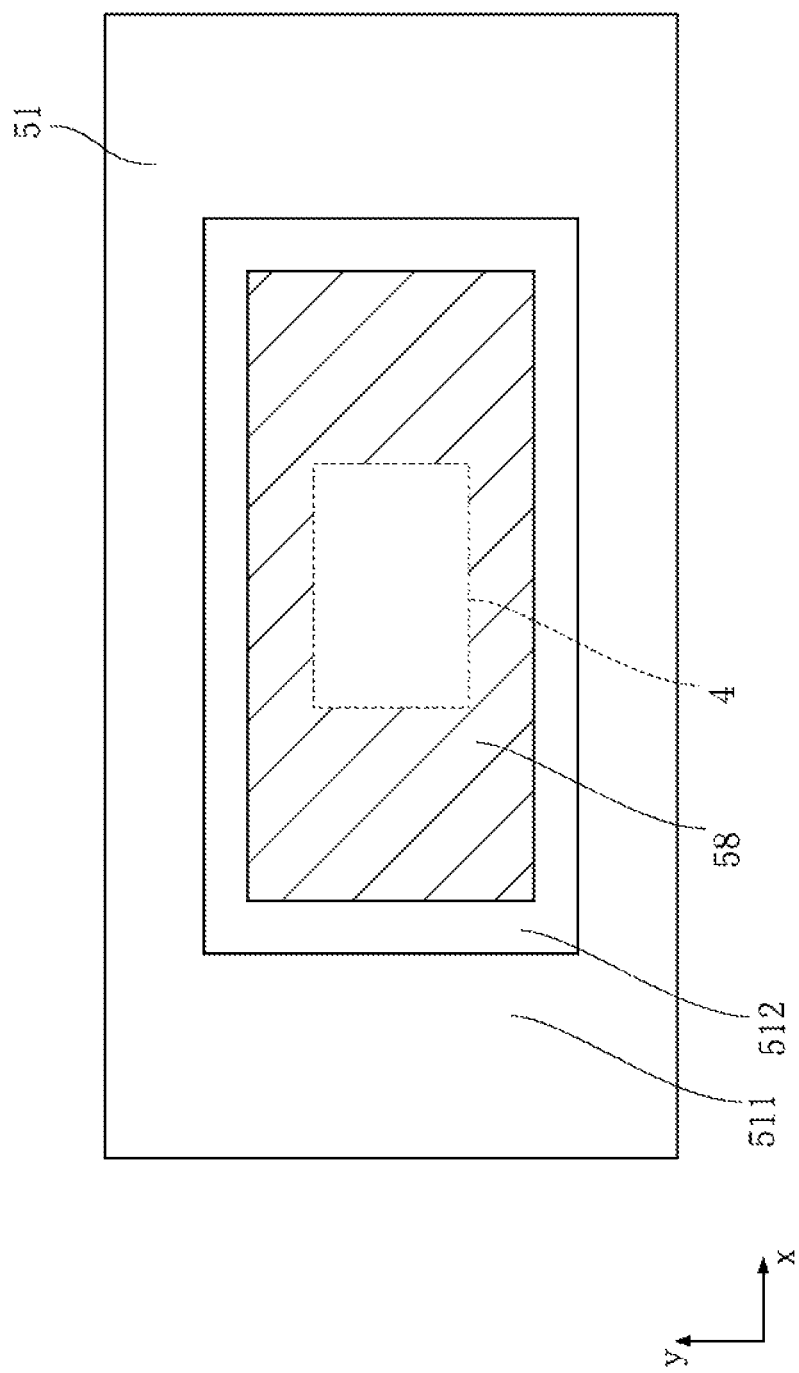
FIG. 79 is a bottom view taken along lines LXXIX-LXXIX in FIGS. 77 and 78, showing a reflector only.

Each reflector 51 includes a bottom surface 511 and a projection 512. Since the structures of all the reflectors 51 are the same in this variation, description is given below as to a single reflector 51. The bottom surface 511 is oriented toward the substrate 1 (i.e., downward in FIGS. 77 and 78). The projection 512 projects from the bottom surface 511 toward the substrate 1. As viewed in the normal direction z of the principal surface 11, the projection 512 is positioned between the adhesive layer 8 and the white resin 58. FIG. 79 is a bottom view of the reflector taken along lines LXXIX-LXXIX in FIGS. 77 and 78. In FIG. 79, the location where the LED chip 4 is to be arranged is indicated by the dotted line. The region where the white resin 58 is to be arranged is indicated by hatching. As shown in FIG. 79, the projection 512 of this embodiment surrounds the white resin 58 as viewed in the normal direction z (a view within an x-y plane, which holds true hereinafter). The adhesive layer 8 may intervene between the projection 512 and the substrate 1.

In the process of manufacturing the LED light source unit A13 of this variation, the reflector 51 is bonded to the substrate 1, with an adhesive in a liquid state, which is to become the adhesive layer 8, applied to the bottom surface 511. In this process, the adhesive on the bottom surface 511 is stopped by the projection 512 and does not enter the inner side of the projection 512 where the white resin 58 is to be provided. In this way, the adhesive layer 8 is prevented from projecting from the reflector 51 into the side where the white resin 58 is to be provided. This allows a large amount of adhesive in a liquid state, which is to become the adhesive layer 8, to be applied to the bottom surface 511. Thus, the adhesive layer 8 provides strong bonding between the reflector 51 and the substrate 1.

In this variation, the projection 512 surrounds the white resin 58 as viewed in the normal direction z. This structure is suitable for preventing the adhesive layer 8 from projecting from the reflector 51 into the side where the white resin 58 is to be provided.

Figure 80:
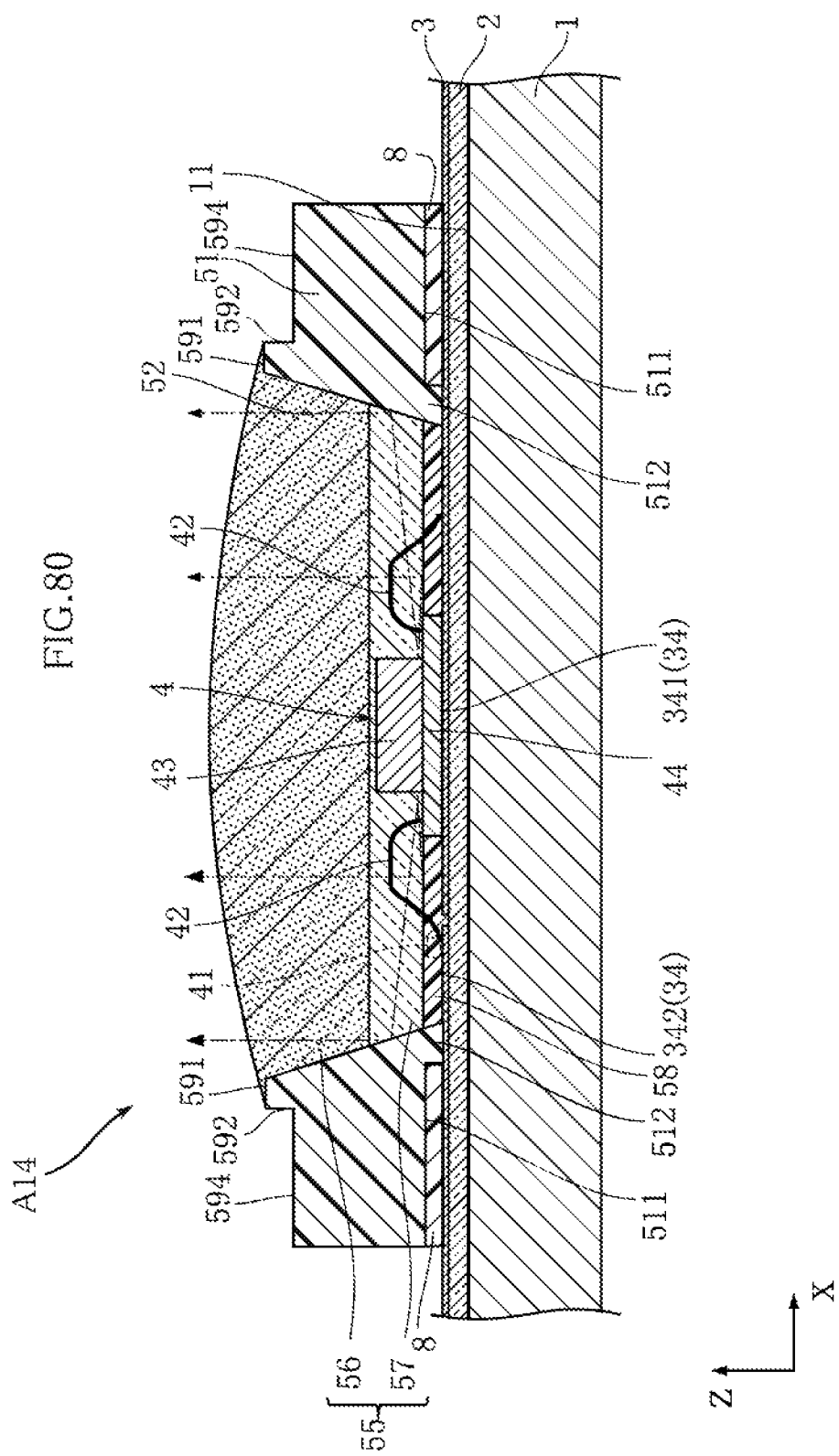
FIG. 80 is an enlarged schematic sectional view showing a variation of the LED light source unit according to an embodiment of the present invention.
Figure 81:
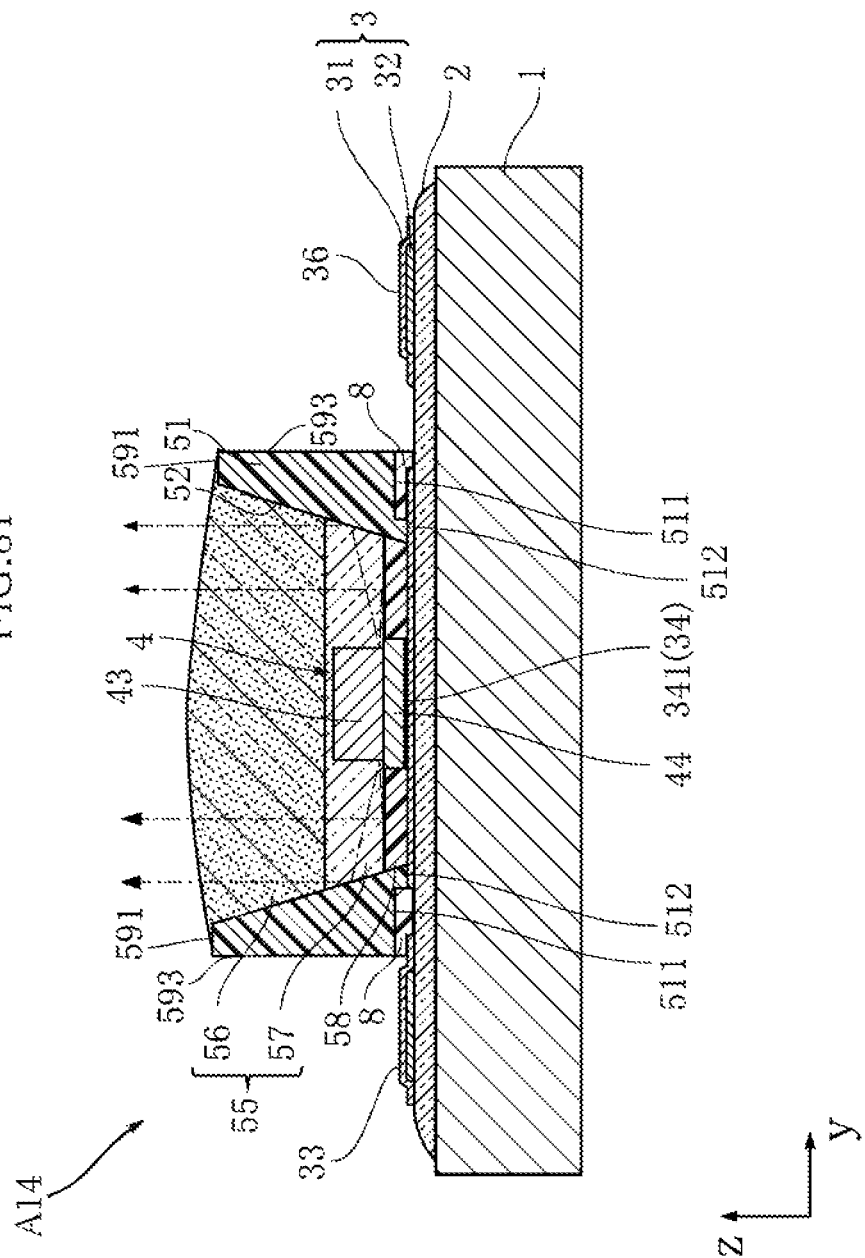
FIG. 81 is an enlarged schematic sectional view showing a variation of the LED light source unit according to an embodiment of the present invention.
Figure 82:
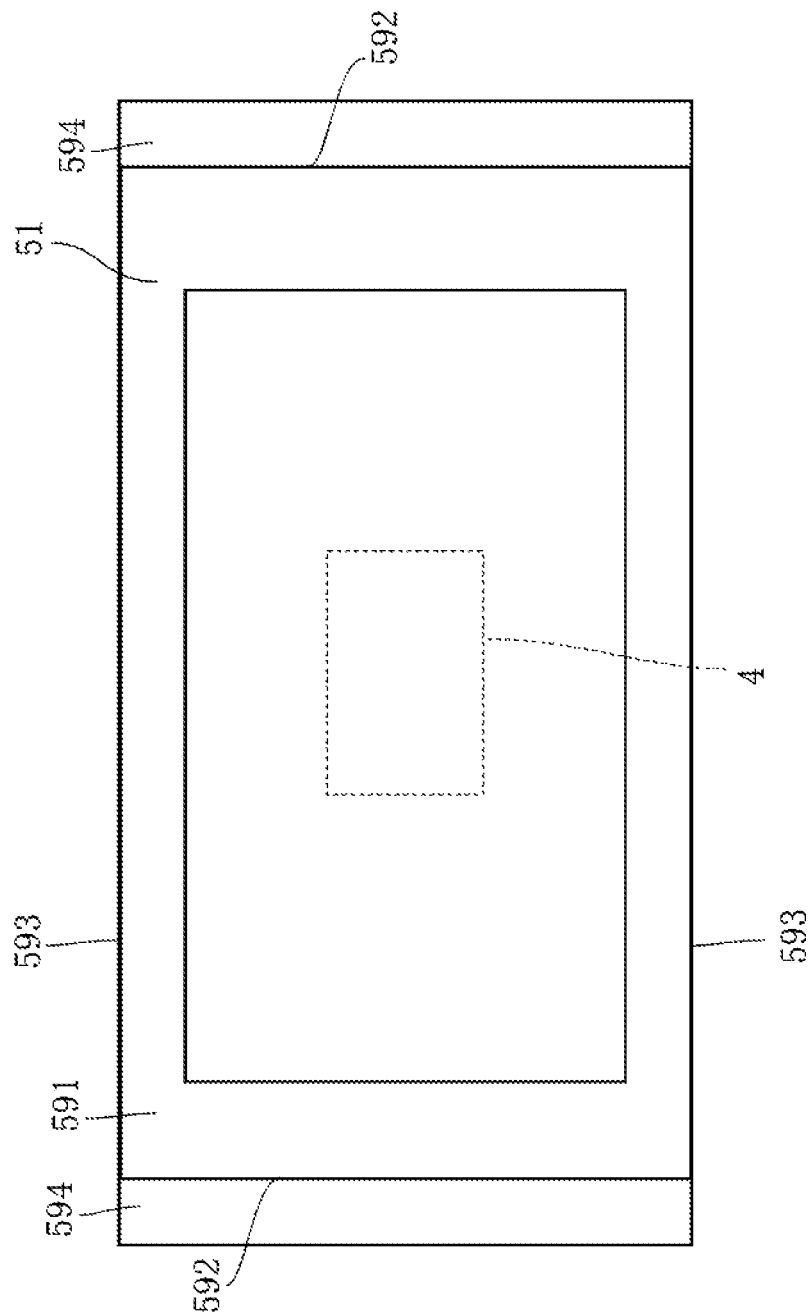
FIG. 82 is a plan view showing only the reflector of FIGS. 80 and 81.

FIGS. 80 and 81 show another variation of the reflector 51. FIG. 82 is a plan view showing the reflector 51 only. In FIG. 82, the location where the LED chip 4 is to be arranged is indicated by the dotted line. The reflector 51 of the LED light source unit A14 of this variation mainly differs from that of the LED light source unit A13 in that this reflector includes surfaces 591, 592, 593 and 594. In this variation, the light-transmitting resin 55 bulges in the normal direction z.

The surface 591 is oriented in the normal direction z of the principal surface 11. As shown in FIG. 82, as viewed in the normal direction z, the surface 591 surrounds an LED chip 4. The surface 591 is flat and covered with the light-transmitting resin 55. The surfaces 592 are connected to the surface 591 and inclined with respect to the surface 591. In this variation, the boundary between each of the surfaces 592 and the surface 591 is non-rounded. The surface 592 is oriented toward the side opposite from the region surrounded by the surface 591 as viewed in direction z. That is, in FIG. 80, the surface 592 is oriented toward the right side or the left side. The surfaces 592 are not covered with the light-transmitting resin 55 but exposed. The surfaces 593 are connected to the surface 591 and inclined with respect to the surface 591. In this variation, the boundary between each of the surfaces 593 and the surface 591 is non-rounded. The surface 593 is oriented toward the side opposite from the region surrounded by the surface 591 as viewed in direction z. That is, in FIG. 81, the surface 593 is oriented toward the right side or the left side. As shown in FIG. 82, the surfaces 593 are connected to the surfaces 592. The surfaces 593 are not covered with the light-transmitting resin 55 but exposed. The surfaces 594 are oriented in the normal direction z of the principal surface 11. The surfaces 592 stand on the surfaces 594 to extend toward the surface 591. The surfaces 594 are not covered with the light-transmitting resin 55 but exposed. Unlike this embodiment, however, the reflector 51 may not include a surface corresponding to the surfaces 594. That is, the reflector 51 may be tubular. Further, the reflector 51 may not include the projection 512.

Figure 83:
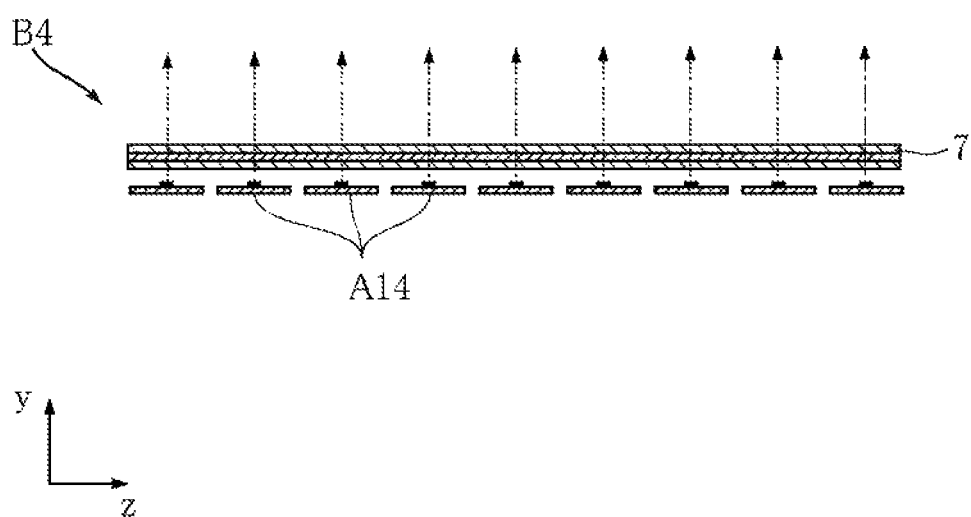
FIG. 83 is a sectional view showing an example of liquid crystal display that uses the LED light source unit of FIGS. 80 and 81.

As shown in FIG. 83, the LED light source unit A14 of this variation, used with a liquid crystal panel 7, provides a liquid crystal display B4. However, unlike the above-described LED light source units A9, A10, A12 and A13, the LED light source unit A14 is not used with a light guide plate 6. Instead of using a light guide plate, a plurality of LED light source units A14 are arranged to face the liquid crystal panel 7 to function as a planar light source.

In loading a resin material in a liquid state, which is to become the light-transmitting resin 55, into the opening 52, the resin material may cover the surface 591. In the process of loading the resin material into the opening 52, the surfaces 592 are positioned lower than the surface 591 in the direction of gravity. Thus, even when the resin material covers the surface 591, the resin material does not easily flow onto the surfaces 592, because of the influence by surface tension of the resin material. Thus, the resin material remains on the surface 591. This assures that the light-transmitting resin 55, which is the resin material in the hardened state, is provided precisely on the surface 591 and in the region surrounded by the surface 591 as viewed in the normal direction z. Thus, the light-transmitting resin 55 is prevented from being formed into an improper shape. Thus, a light-transmitting resin 55 having a desired shape is obtained.

Although it is preferable that the LED light source unit A14 is not used together with the light guide plate 6, it can be used with the light guide plate 6, similarly to the LED light source unit A9.

The LED light source unit for a backlight of a liquid crystal display and the liquid crystal display according to the present invention are not limited to the foregoing embodiments. The specific structure of each part of the LED light source unit for a backlight of a liquid crystal display and the liquid crystal display can be varied in design in many ways.

The invention claimed is:

1. An LED light source unit for a backlight of a liquid crystal display, the unit comprising:
   a plurality of LED chips;
   a substrate;
   a metal film covering a principal surface of the substrate; and
   a glass layer intervening between the metal film and the substrate;
   wherein the metal film comprises a plurality of layers that include an Al layer as an outermost layer, and the LED chips are mounted directly on the Al layer, and
   wherein the glass layer is thinner in a thickness direction than the LED chips.

2. The LED light source unit according to claim 1, wherein the substrate is made of a ceramic material.

3. The LED light source unit according to claim 1, wherein the metal film includes an AgPt layer intervening between at least part of the Al layer and the substrate.

4. The LED light source unit according to claim 3, wherein the AgPt layer is formed by printing paste containing Ag and Pt and then baking the paste.

5. The LED light source unit according to claim 1, wherein the Al layer is formed by sputtering.

6. The LED light source unit according to claim 1, wherein the glass layer includes a window portion in which at least one of the plurality of LED chips is positioned as viewed in a thickness direction of the substrate.

7. The LED light source unit according to claim 6, wherein the glass layer includes an inclined surface connected to an edge of the window portion, the inclined surface being inclined to be away from the principal surface of the substrate in a normal direction of the principal surface as proceeding away from said at least one of the plurality of LED chips.

8. The LED light source unit according to claim 7, wherein the inclined surface is in a form of a frame surrounding said at least one of the plurality of LED chips.

9. The LED light source unit according to claim 1, wherein the glass layer is formed by printing paste containing glass and then baking the paste.

10. The LED light source unit according to claim 1, further comprising a reflector in a form of a frame surrounding said at least one of the plurality of LED chips.

11. The LED light source unit according to claim 10, wherein the reflector is made of white resin.

12. The LED light source unit according to claim 10, wherein a space enclosed by the reflector is filled with a light-transmitting resin covering said at least one of the plurality of LED chips.

13. The LED light source unit according to claim 12, wherein the light-transmitting resin contains a fluorescent material.

14. The LED light source unit according to claim 1, wherein the substrate is in a form of an elongated rectangle, and the LED chips are arranged along a longitudinal direction of the substrate.

15. The LED light source unit according to claim 14, wherein the metal film includes a common strip portion elongated in the longitudinal direction of the substrate, and a plurality of island portions arranged in parallel to the common strip portion, one or more of the island portions being electrically connected to the common strip portion; and the LED chips are mounted to the island portions.

16. The LED light source unit according to claim 15, wherein the metal film includes: a connection terminal portion and a connection strip portion opposite from the common strip portion across the island portions, the connecting strip portion being electrically connected to the connection terminal portion and to at least one of the island portions.

17. A liquid crystal display comprising:
the LED light source unit as set forth in claim 1;
a light guide member substantially in a form of a plate as a whole, the light guide member including a light incident surface facing the LED light source unit, a reflective surface, and a light emission surface spaced from the reflective surface in a thickness direction of the light guide member; and
a liquid crystal panel for selectively allowing light emitted from the light emission surface to pass through to form an image.

18. The LED light source unit according to claim 1, further comprising
a reflector attached to the substrate and formed with a plurality of openings each including an inner surface surrounding a respective one of the LED chips.

19. The LED light source unit according to claim 18, wherein the inner surface is inclined away from the LED chip at an angle not perpendicular to a normal direction of the principal surface.

20. The LED light source unit according to claim 18, wherein the opening is rectangular as viewed in plan.

21. The LED light source unit according to claim 18, wherein: the substrate is in a form of an elongated rectangle; and
the LED chips are arranged in a row along the longitudinal direction of the substrate.

22. The LED light source unit according to claim 21, wherein the reflector includes a smaller-cross-sectional portion positioned between adjacent ones of the openings and smaller in cross section than other portions of the reflector flanking the smaller-cross-sectional portion.

23. The LED light source unit according to claim 22, wherein the smaller-cross-sectional portion is provided by forming a recess on a surface of the reflector, the surface being positioned on a side opposite from the substrate.

24. The LED light source unit according to claim 22, wherein the smaller-cross-sectional portion is provided by forming a recess on a surface of the reflector, the surface being positioned on a side of the substrate.

25. The LED light source unit according to claim 22, wherein the smaller-cross-sectional portion is provided by forming a recess on a side surface of the reflector, the side surface being oriented in a width direction.

26. The LED light source unit according to claim 18, wherein the reflector is made of white resin.

27. The LED light source unit according to claim 26, wherein the white resin is liquid crystal polymer or polybutylene terephthalate.

28. The LED light source unit according to claim 18, wherein:
at least one of the LED chips comprises a submount substrate made of Si and a semiconductor layer disposed on the submount substrate, the submount substrate being positioned on the substrate side; and
the LED light source unit further comprises an opaque resin that covers at least part of a side surface of the submount substrate, the side surface being oriented in a direction perpendicular to a normal direction of the principal surface, the opaque resin being made of a material having a reflectivity higher than that of the submount substrate.

29. The LED light source unit according to claim 28, wherein the opaque resin entirely covers the side surface of the submount substrate.

30. The LED light source unit according to claim 28, wherein the semiconductor layer is entirely outside the opaque resin.

31. The LED light source unit according to claim 28, wherein, as viewed in plan, the opaque resin covers a region within the opening of the reflector except the submount substrate.

32. The LED light source unit according to claim 28, wherein the opaque resin is white.

33. The LED light source unit according to claim 28, further comprising a light-transmitting resin laminated on the opaque resin to cover the semiconductor layer and including a fluorescent portion containing a fluorescent material excited by light from said at least one of the LED chips.

34. The LED light source unit according to claim 33, wherein the light-transmitting resin includes a transparent portion that intervenes between the fluorescent portion and the opaque resin and that does not contain the fluorescent material.

35. The LED light source unit according to claim 28, wherein a Zener diode for preventing excessive reverse voltage from being applied to the semiconductor layer is incorporated in the submount substrate.

36. The LED light source unit according to claim 28, further comprising a Zener diode mounted next to the LED chip for preventing excessive reverse voltage from being applied to the semiconductor layer,
wherein the Zener diode is covered with the opaque resin.

37. An LED light source unit for a backlight of a liquid crystal display, the LED light source unit comprising:
a plurality of LED chips;
a substrate including a principal surface on which the LED chips are mounted, the principal surface having a first normal direction that is perpendicular to the principal surface; and
an opaque resin,
wherein one of the LED chips comprises a submount substrate made of Si and a semiconductor layer disposed on the submount substrate, the semiconductor layer emits light, the opaque resin is made of a material having a reflectivity higher than that of the submount substrate, the submount substrate includes a side surface having a second normal direction that is perpendicular to the side surface, the first normal direction and the second normal direction are not parallel to each other, and at least part of the side surface is covered with the opaque resin, the LED light source unit further comprising a light-transmitting resin laminated on the opaque resin to cover the semiconductor layer, and wherein the light-transmitting resin includes a fluorescent portion, the fluorescent portion containing a fluorescent material that emits light different from light from said one of LED chips when excited by the light from said one of the LED chips.

38. The LED light source unit according to claim 37, wherein the opaque resin entirely covers the side surface of the submount substrate.

39. The LED light source unit according to claim 37, wherein the semiconductor layer is entirely outside the opaque resin.

40. The LED light source unit according to claim 37, wherein the opaque resin is white.

41. The LED light source unit according to claim 37, wherein the light-transmitting resin includes a transparent portion that intervenes between the fluorescent portion and the opaque resin and that does not contain the fluorescent material.

42. The LED light source unit according to claim 37, wherein a Zener diode for preventing excessive reverse voltage from being applied to the semiconductor layer is incorporated in the submount substrate.

43. The LED light source unit according to claim 37, further comprising a Zener diode mounted next to the LED chip for preventing excessive reverse voltage from being applied to the semiconductor layer, wherein the Zener diode is covered with the opaque resin.

44. The LED light source unit according to claim 37, further comprising: a reflector formed with an opening including an inner surface surrounding one of the LED chips; and an adhesive layer intervening between the reflector and the substrate.

45. The LED light source unit according to claim 44, wherein:

the reflector includes a bottom surface that is in contact with the adhesive layer, and a projection projecting from the bottom surface toward the substrate; and the projection is positioned between the adhesive layer and the opaque resin as viewed in the normal direction.

46. The LED light source unit according to claim 45, wherein the projection is in contact with the opaque resin.

47. The LED light source unit according to claim 46, wherein the projection surrounds the opaque resin as viewed in the normal direction.

48. The LED light source unit according to claim 46, wherein, as viewed in the normal direction, the reflector includes a first surface surrounding one of the LED chips and a second surface connected to the first surface and inclined with respect to the first surface, and the second surface is oriented toward a side opposite from a region surrounded by the first surface as viewed in the normal direction.

49. The LED light source unit according to claim 48, wherein:

the reflector includes a third surface oriented in the normal direction; and the second surface stands on the third surface to extend toward the first surface.

50. The LED light source unit according to claim 49, wherein the light-transmitting resin has a shape bulging in the normal direction.

51. The LED light source unit according to claim 37, further comprising a plurality of reflectors attached to the substrate and spaced from each other, wherein each of the reflectors is formed with an opening including an inner surface surrounding one of the LED chips.

52. The LED light source unit according to claim 37, further comprising a reflector attached to the substrate and formed with a plurality of openings, wherein each of the openings includes an inner surface surrounding one of the LED chips.

53. The LED light source unit according to claim 52, wherein the inner surface is inclined away from said one of the LED chips at an angle not perpendicular to the normal direction of the principal surface.

54. The LED light source unit according to claim 52, wherein the opening is rectangular as viewed in plan.

55. The LED light source unit according to claim 54, wherein the reflector includes a smaller-cross-sectional portion positioned between adjacent two of the openings and smaller in cross section than other portions of the reflector flanking the smaller-cross-sectional portion.

56. The LED light source unit according to claim 55, wherein the smaller-cross-sectional portion is provided by forming a recess on a surface of the reflector, the surface being positioned on a side opposite from the substrate.

57. The LED light source unit according to claim 55, wherein the smaller-cross-sectional portion is provided by forming a recess on a surface of the reflector, the surface being positioned on a side of the substrate.

58. The LED light source unit according to claim 55, wherein the smaller-cross-sectional portion is provided by forming a recess on a side surface of the reflector, the side surface being oriented in a width direction.

59. The LED light source unit according to claim 52, wherein:

the substrate is in a form of an elongated rectangle; and the LED chips are arranged in a row along the longitudinal direction of the substrate.

60. The LED light source unit according to claim 52, wherein the reflector is made of white resin.

61. The LED light source unit according to claim 60, wherein the white resin is liquid crystal polymer or polybutylene terephthalate.

62. The LED light source unit according to claim 52, wherein, as viewed in plan, the opaque resin covers a region within one of the openings except the submount substrate.

63. The LED light source unit according to claim 37, further comprising a metal film covering the substrate, wherein the LED chips are mounted on the metal film.

64. The LED light source unit according to claim 63, wherein the substrate is made of a ceramic material.

65. The LED light source unit according to claim 63, wherein the metal film includes an Al layer constituting an outermost layer.

66. The LED light source unit according to claim 65, wherein the metal film includes an AgPt layer intervening between at least part of the Al layer and the substrate.

67. The LED light source unit according to claim 66, wherein the AgPt layer is formed by printing paste containing Ag and Pt and then baking the paste.

68. The LED light source unit according to claim 65, wherein the Al layer is formed by sputtering.

69. The LED light source unit according to claim 63, wherein the metal film consists of an AgPt layer only.

70. The LED light source unit according to claim 63, further comprising a wire electrically connected to the metal film,
wherein the semiconductor layer is formed with an electrode, and the wire is bonded to the electrode.

71. The LED light source unit according to claim 63, wherein:
the substrate is in a form of an elongated rectangle;
the LED chips are arranged along a longitudinal direction of the substrate; and
the metal film includes a common strip portion elongated in the longitudinal direction of the substrate, and a plurality of island portions arranged in the longitudinal direction, one or more of the island portions being electrically connected to the common strip portion, the LED chips being mounted to one of the island portions.

72. The LED light source unit according to claim 71, wherein the metal film includes a connection terminal portion and a connecting strip portion, the connecting strip portion being arranged opposite from the common strip portion across the island portions the connecting strip portion being electrically connected to the connection terminal portion and to be least one of the island portions.

73. A liquid crystal display comprising:
the LED light source unit as set forth in claim 37;
a light guide plate including a light incident surface, a reflective surface and a light emission surface; and
a liquid crystal panel for selectively allowing light emitted from the light emission surface to pass through to form an image;
wherein the light incident surface faces the LED light source unit the light emission surface being spaced from the reflective surface in a thickness direction of the light guide plate.

74. An LED light source unit comprising:
a plurality of LED chips;
a substrate;
a metal film covering a principal surface of the substrate; and
a glass layer intervening between the metal film and the substrate;
wherein the metal film comprises a plurality of layers that includes an Al layer as an outermost layer, and the LED chips are mounted directly on the Al layer, and
wherein the glass layer is thinner in a thickness direction than the LED chips.

75. The LED light source unit according to claim 74, wherein the glass layer includes a window portion in which at least one of the plurality of LED chips is positioned as viewed in a thickness direction of the substrate.

76. The LED light source unit according to claim 75, wherein the glass layer includes an inclined surface connected to an edge of the window portion, the inclined surface being inclined to be away from the principal surface of the substrate in a normal direction of the principal surface as proceeding away from said at least one of the plurality of LED chips.

77. The LED light source unit according to claim 76, wherein the inclined surface is in a form of a frame surrounding said at least one of the plurality of LED chips.

78. The LED light source unit according to claim 74, wherein the glass layer is formed by printing paste containing glass and then baking the paste.

79. The LED light source unit according to claim 74, further comprising a reflector in a form of a frame surrounding said at least one of the plurality of LED chips.

80. The LED light source unit according to claim 79, wherein the reflector is made of white resin.

81. The LED light source unit according to claim 79, wherein a space enclosed by the reflector is filled with a light-transmitting resin covering said at least one of the plurality of LED chips.

82. The LED light source unit according to claim 81, wherein the light-transmitting resin contains a fluorescent material.

83. The LED light source unit according to claim 74, wherein the substrate is in a form of an elongated rectangle, and the LED chips are arranged along a longitudinal direction of the substrate.

84. The LED light source unit according to claim 83, wherein the metal film includes a common strip portion elongated in the longitudinal direction of the substrate, and a plurality of island portions arranged in parallel to the common strip portion, one or more of the island portions being electrically connected to the common strip portion; and the LED chips are mounted to the island portions.

85. The LED light source unit according to claim 84, wherein the metal film includes: a connection terminal portion and a connection strip portion opposite from the common strip portion across the island portions, the connecting strip portion being electrically connected to the connection terminal portion and to at least one of the island portions.

86. An LED light source unit comprising:
a plurality of LED chips;
a substrate including a principal surface on which the LED chips are mounted, the principal surface having a first normal direction that is perpendicular to the principal surface; and
an opaque resin,
wherein one of the LED chips comprises a submount substrate made of Si and a semiconductor layer disposed on the submount substrate, the semiconductor layer emits light, the opaque resin is made of a material having a reflectivity higher than that of the submount substrate, the submount substrate includes a side surface having a second normal direction that is perpendicular to the side surface, the first normal direction and the second normal direction are not parallel to each other, and at least part of the side surface is covered with the opaque resin, the LED light source unit further comprising a light-transmitting resin laminated on the opaque resin to cover the semiconductor layer, and
wherein the light-transmitting resin includes a fluorescent portion, the fluorescent portion containing a fluorescent material that emits light different from light from said one of LED chips when excited by the light from said one of the LED chips.

87. The LED light source unit according to claim 86, wherein the opaque resin entirely covers the side surface of the submount substrate.

88. The LED light source unit according to claim 86, wherein the semiconductor layer is entirely outside the opaque resin.

89. The LED light source unit according to claim 86, wherein the opaque resin is white.

90. The LED light source unit according to claim 86, wherein the light-transmitting resin includes a transparent portion that intervenes between the fluorescent portion and the opaque resin and that does not contain the fluorescent material.

91. The LED light source unit according to claim 86, wherein a Zener diode for preventing excessive reverse voltage from being applied to the semiconductor layer is incorporated in the submount substrate.

92. The LED light source unit according to claim 86, further comprising a reflector attached to the substrate and formed with a plurality of openings,
   wherein each of the openings includes an inner surface surrounding one of the LED chips.

93. The LED light source unit according to claim 92, wherein the inner surface is inclined away from said one of LED chips at an angle not perpendicular to the normal direction of the principal surface.

94. The LED light source unit according to claim 92, wherein the opening is rectangular as viewed in plan.

95. The LED light source unit according to claim 94, wherein the reflector includes a smaller-cross-sectional portion positioned between adjacent two of the openings and smaller in cross section than other portions of the reflector flanking the smaller-cross-sectional portion.

96. The LED light source unit according to claim 95, wherein the smaller-cross-sectional portion is provided by forming a recess on a surface of the reflector, the surface being positioned on a side opposite from the substrate.

97. The LED light source unit according to claim 92, wherein:
   the substrate is in a form of an elongated rectangle; and
   the LED chips are arranged in a row along the longitudinal direction of the substrate.

98. The LED light source unit according to claim 92, wherein the reflector is made of white resin.

99. The LED light source unit according to claim 98, wherein the white resin is liquid crystal polymer or polybutylene terephthalate.

100. The LED light source unit according to claim 92, wherein, as viewed in plan, the opaque resin covers a region within one of the openings except the submount substrate.

101. The LED light source unit according to claim 86, further comprising a metal film covering the substrate, wherein the LED chips are mounted on the metal film.

102. The LED light source unit according to claim 101, wherein the substrate is made of a ceramic material.

103. The LED light source unit according to claim 101, wherein the metal film includes an Al layer constituting an outermost layer.

104. The LED light source unit according to claim 103, wherein the metal film includes an AgPt layer intervening between at least part of the Al layer and the substrate.

105. The LED light source unit according to claim 104, wherein the AgPt layer is formed by printing paste containing Ag and Pt and then baking the paste.

106. The LED light source unit according to claim 103, wherein the Al layer is formed by sputtering.

107. The LED light source unit according to claim 101, wherein the metal film consists of an AgPt layer only.

108. The LED light source unit according to claim 101, further comprising a wire electrically connected to the metal film,
   wherein the semiconductor layer is formed with an electrode, and the wire is bonded to the electrode.

109. The LED light source unit according to claim 101, wherein:
   the substrate is in a form of an elongated rectangle;
   the LED chips are arranged along a longitudinal direction of the substrate; and
   the metal film includes a common strip portion elongated in the longitudinal direction of the substrate, and a plurality of island portions arranged in the longitudinal direction, one or more of the island portions being electrically connected to the common strip portion, the LED chips being mounted to one of the island portions.

110. The LED light source unit according to claim 109, wherein the metal film includes a connection terminal portion and a connecting strip portion, the connection terminal portion being arranged opposite from the common strip portion across the island portions the connecting strip portion being electrically connected to the connection terminal portion and to be least one of the island portions.

* * * * *